United States Patent
Schober et al.

(10) Patent No.: US 10,720,353 B2
(45) Date of Patent: Jul. 21, 2020

(54) OPENER APPARATUS

(71) Applicant: MURATA MACHINERY, LTD., Kyoto-shi, Kyoto (JP)

(72) Inventors: Thomas Schober, Ermatingen (CH); Bernd Rahrbach, Constance (DE); Christian Wohanka, Tägerwilen (CH); Yves Fenner, Berg (CH); Gerhard Dovids, Grabs (CH); John Fiddes, Kreuzlingen (CH)

(73) Assignee: MURATA MACHINERY, LTD., Kyoto (JP)

( * ) Notice: Subject to any disclaimer, the term of this patent is extended or adjusted under 35 U.S.C. 154(b) by 152 days.

(21) Appl. No.: 16/185,556

(22) Filed: Nov. 9, 2018

(65) Prior Publication Data

US 2020/0013655 A1    Jan. 9, 2020

(30) Foreign Application Priority Data

Jul. 4, 2018   (DE) .................. 20 2018 103 824 U
Aug. 17, 2018  (DE) .................. 20 2018 104 743 U

(51) Int. Cl.
*H01L 21/673* (2006.01)
*H01L 21/677* (2006.01)

(52) U.S. Cl.
CPC .. *H01L 21/67772* (2013.01); *H01L 21/67346* (2013.01); *H01L 21/67386* (2013.01)

(58) Field of Classification Search
CPC ................................................ H01L 21/67346
USPC ....................................................... 414/736
See application file for complete search history.

(56) References Cited

U.S. PATENT DOCUMENTS

| | | |
|---|---|---|
| 2006/0151404 A1 | 7/2006 | Blattner et al. |
| 2010/0179681 A1 | 7/2010 | Jäger et al. |
| 2017/0372930 A1 | 12/2017 | Schober et al. |
| 2018/0122674 A1 | 5/2018 | Dovids et al. |
| 2018/0122677 A1 | 5/2018 | Dovids et al. |

FOREIGN PATENT DOCUMENTS

WO     2014/107818 A2     7/2014

OTHER PUBLICATIONS

Official Communication issued in International Patent Application No. PCT/US2019/039146, dated Oct. 17, 2019.
Schober et al., "Substrate Carrier and Substrate Carrier Stack", U.S. Appl. No. 16/185,541, filed Nov. 9, 2018.
Schober et al., "Substrate Carrier and Substrate Carrier Stack", U.S. Appl. No. 16/185,546, filed Nov. 9, 2018.

*Primary Examiner* — Saul Rodriguez
*Assistant Examiner* — Willie Berry, Jr.
(74) *Attorney, Agent, or Firm* — Keating & Bennett, LLP

(57) ABSTRACT

An opener apparatus that accommodates and opens a substrate carrier stack of substrate carriers stacked in a vertical direction, includes a movement mechanism that moves all of the substrate carriers or a sub-group of the substrate carriers relatively with respect to each other along a vertical axis in an opening operation to assume an unstacked state and to be positioned at defined vertical opened positions within the opener apparatus with vertical distances between vertically adjacent substrate carriers in the unstacked state. The opener apparatus also moves the substrate carriers in the unstacked state relatively with respect to each other along the vertical axis in a closing operation to reassume a stacked state.

20 Claims, 39 Drawing Sheets

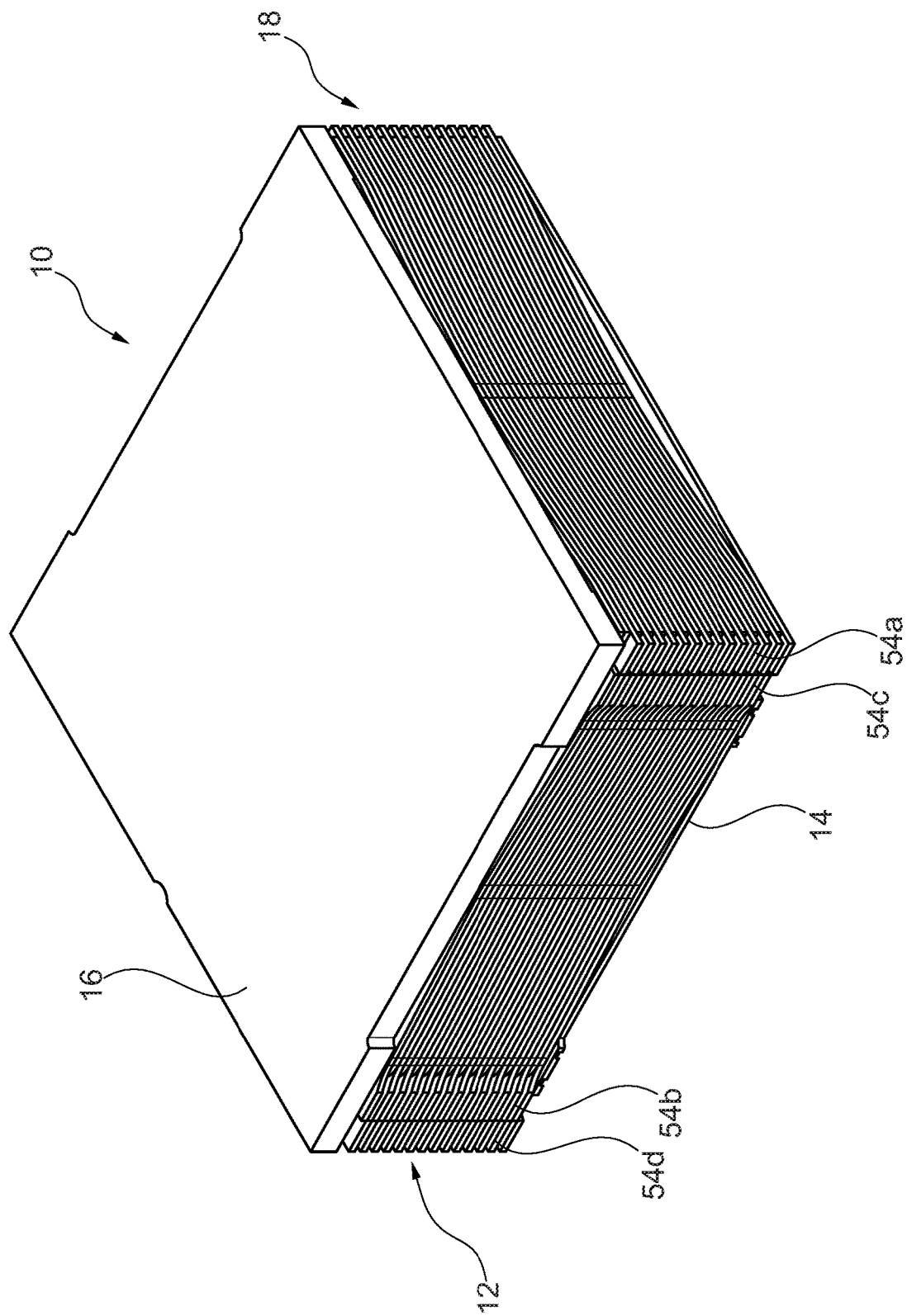

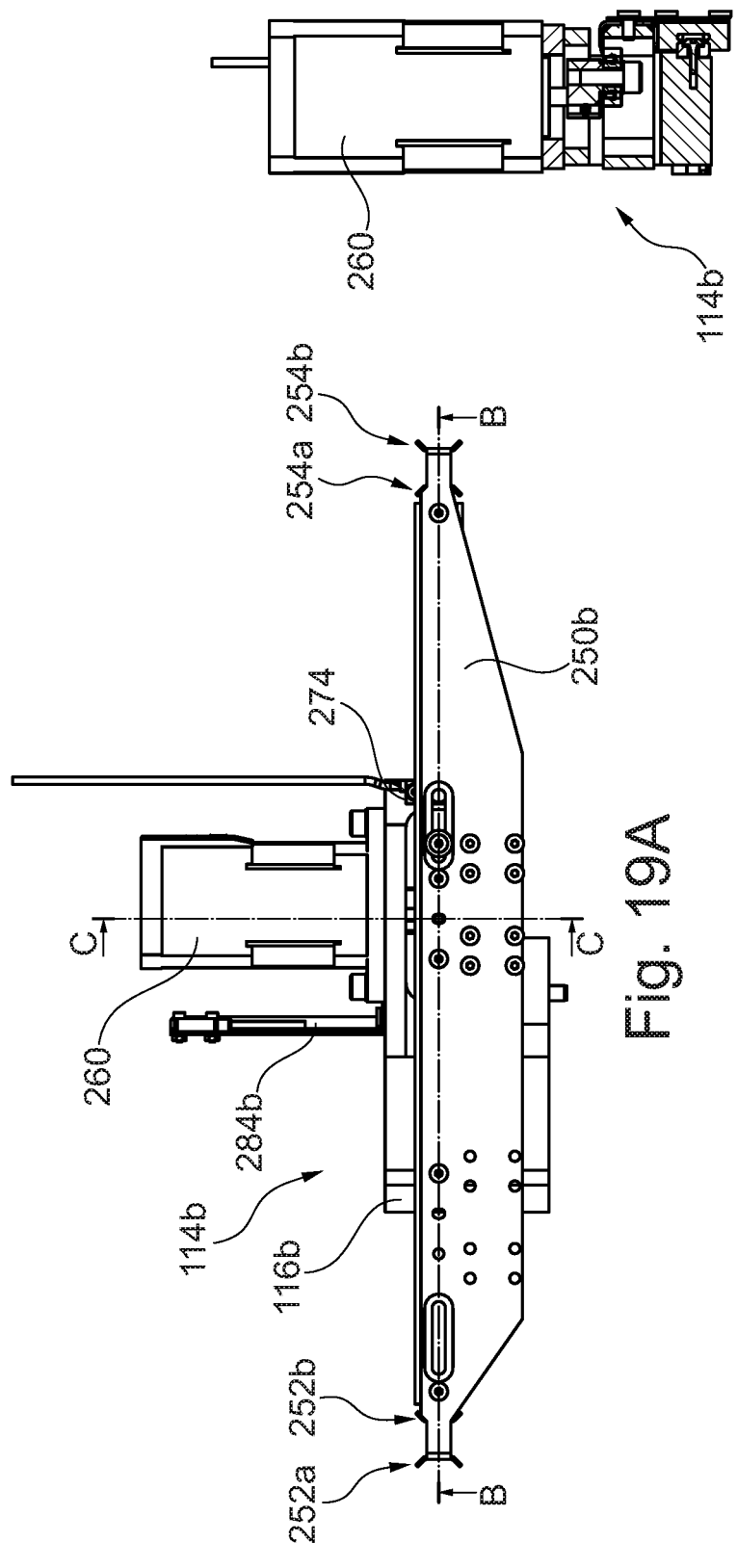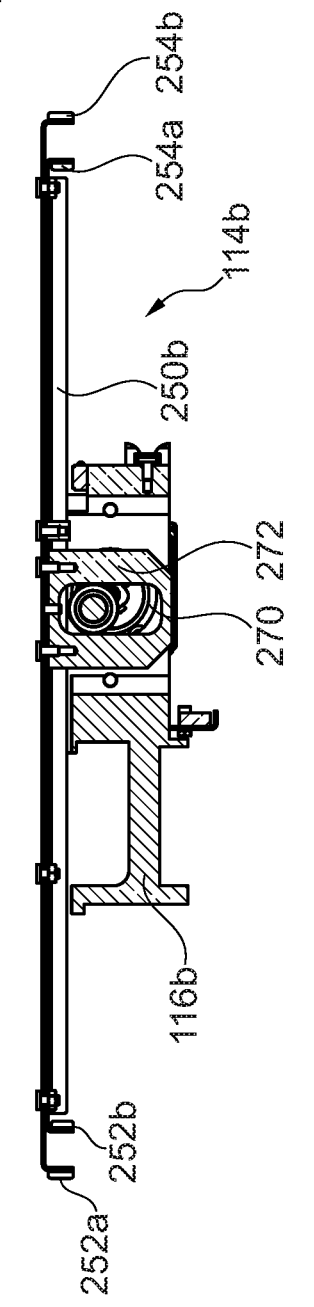

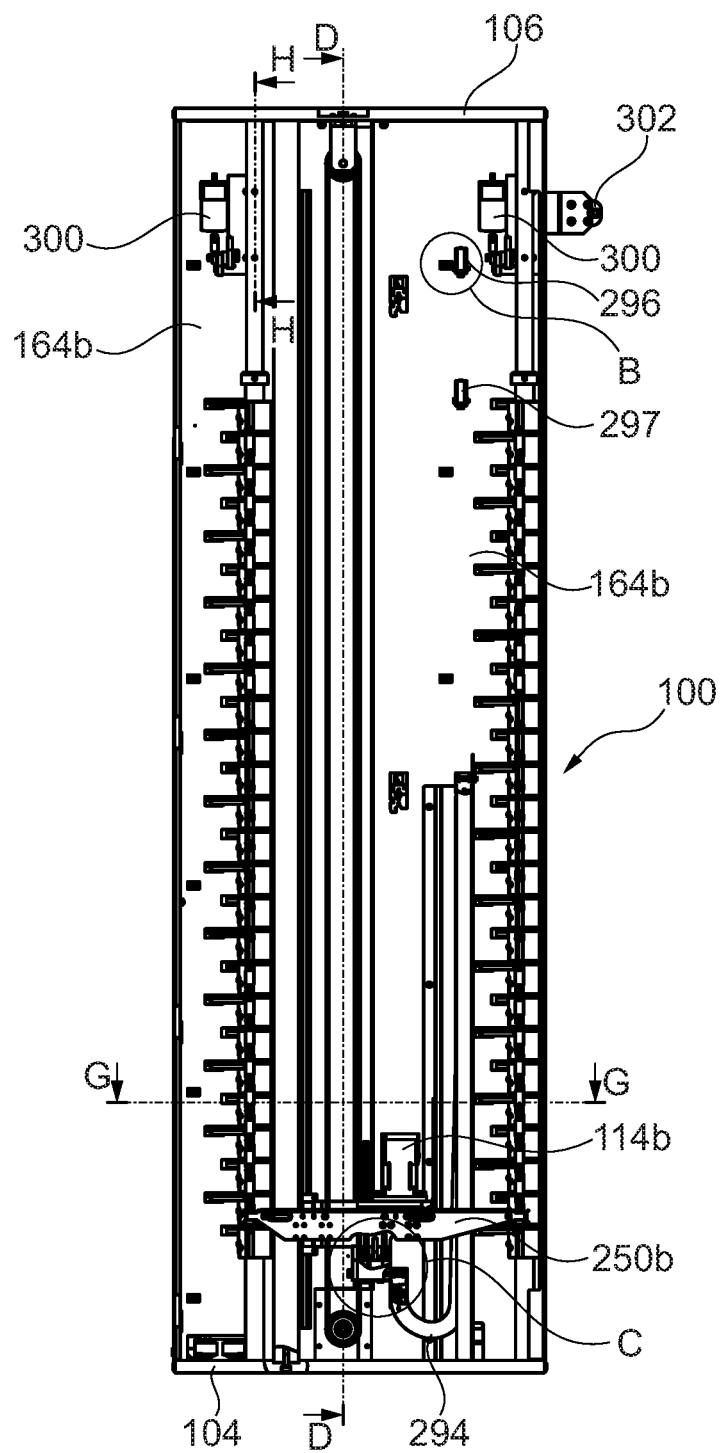
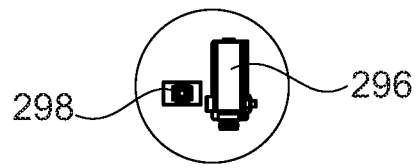
Fig. 23B
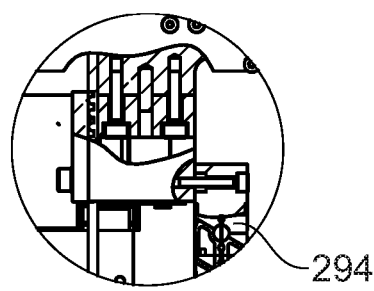
Fig. 23C
Fig. 23A

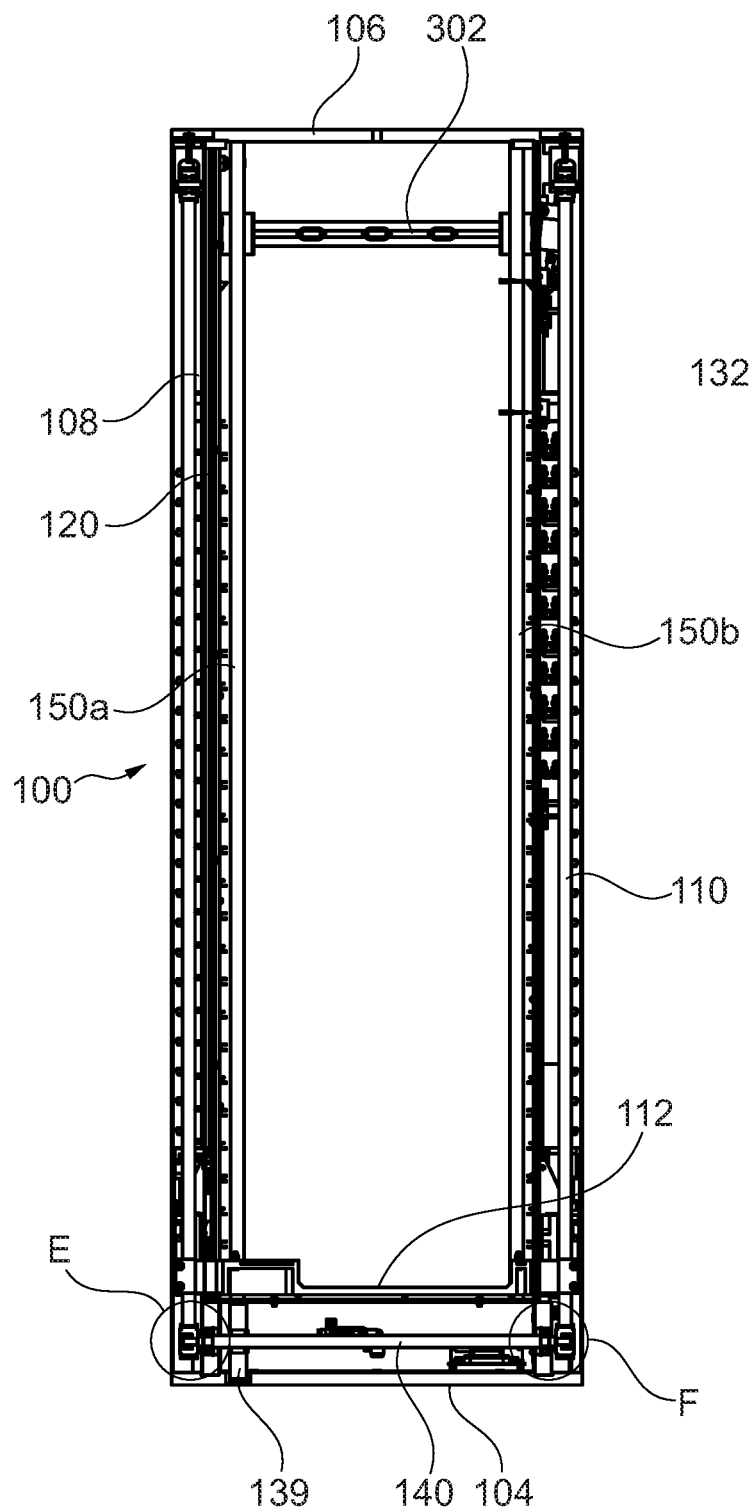
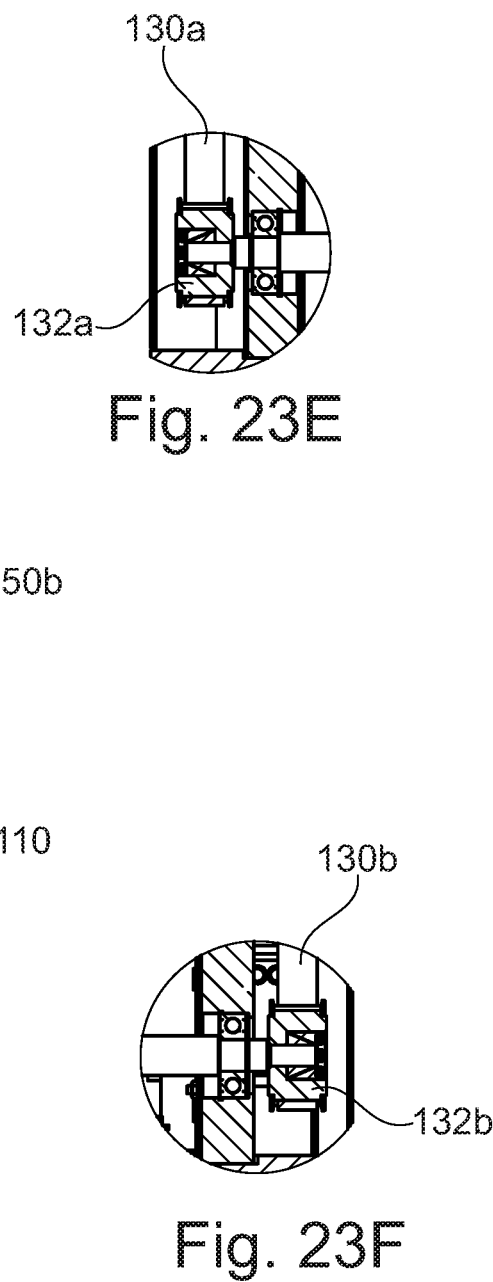
Fig. 23D
Fig. 23E
Fig. 23F

OPENER APPARATUS

BACKGROUND OF THE INVENTION

1. Field of the Invention

This disclosure relates generally to the handling, storage, treatment, and processing of substrates in semiconductor production. In particular, this disclosure relates to the handling, storage, treatment, and processing of substrates in the form of unprocessed or preprocessed or processed semiconductor wafers. However, a substrate to be handled or stored may also be a mask or reticle or the like which contains pattern information needed for forming patterns on semiconductor wafers in the manufacturing of semiconductors or semiconductor circuits, for example.

This disclosure relates further to substrate carriers that hold a substrate in a substrate seat and substrate carrier stacks including a plurality of such substrate carriers, and an opener apparatus and a method for accessing a respective substrate seat of a respective substrate carrier of a substrate carrier stack, in particular, for at least one of unloading a substrate from such a seat and loading a substrate into such a seat.

2. Description of the Related Art

Since the introduction of the 300-mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they are clamped in place by fins and held for later use. Yet conventional FOUPs are hampered by methods and system designs which may contaminate their contents, chafe wafers, and delay loading and unloading of substrate wafer contents as a result of multifarious construction. Thus, there is a need to more efficiently and accurately accomplish the desired tasks of FOUPs.

New kinds of devices for storing, handling, treating, and transporting of substrates in the form of semiconductor wafers were proposed by TEC-SEM AG, Tägerwilen (CH).

The laid-open publication WO 2014/107818 A2, originating from TEC-SEM AG and published on Jul. 17, 2014, proposed a substrate carrier and a substrate carrier stack made up from a plurality of substrate carriers. The proposed substrate carrier stack includes a plurality of substrate carriers arranged stacked in a vertical direction such that, for each pair of vertically adjacent substrate carriers of the substrate carrier stack, a respective lower substrate carrier supports a respective upper substrate carrier, wherein each substrate carrier includes an outer carrier frame which extends in a horizontal frame plane around an inner zone including an inner opening and is provided with a substrate seat that accommodates and carries a plate-shaped substrate within an inner accommodation space of the substrate carrier stack, wherein the inner accommodation space or portions thereof are defined by the inner openings of the substrate carriers of the substrate carrier stack. These substrate carriers have a generally or roughly quadratic or rectangular shape. The disclosure of WO 2014/107818 A2 is incorporated herein by reference in its entirety.

The laid-open publication US 2017/0372930 A1, originating from TEC-SEM AG as well and published on Dec. 28, 2017, discloses substrate carriers of this kind and substrate carrier stacks of this kind which have additional characteristic features which lead to advantages, in particular, to enable effective purging treatments of substrates held within the substrate carrier stack by a respective seat of a respective substrate carrier. The disclosure of US 2017/0372930 A1 is incorporated herein by reference in its entirety.

Older types of substrate carriers having a generally or roughly circular shape and substrate carrier stacks including such substrate carriers and associated storage and opener devices are known from WO 2005/006407 A1 and WO 2007/006166 A2 which originate from TEC-SEM AG as well. The disclosure of WO 2005/006407 A1 or corresponding publication US 2006/0151404 A1 and of WO 2007/006166 A2 or corresponding publication US 2010/0179681 A1 are incorporated herein by reference in their entirety.

According to these patent publications originating from TEC-SEM AG, the seat of a respective substrate carrier of the substrate carrier stack is accessed for at least one of loading a substrate on the seat and unloading a substrate from the seat using an opener apparatus which includes a movement mechanism which acts on selected substrate carriers of the substrate carrier stack. The movement mechanism is adapted to open a loading and unloading gap between two adjacent substrate carriers, such that a respective substrate is able to be loaded on the substrate seat of the lower of the two adjacent substrate carriers or such that a respective substrate is able to be unloaded from this substrate seat. Only one such loading and unloading gap between two adjacent substrate carriers is able to be opened at the same time within the substrate carrier stack. By opening such a loading and unloading gap in the substrate carrier stack, typically a lower partial substrate carrier stack and an upper partial substrate carrier stack will result. In order to access the seat of the uppermost substrate carrier of the substrate carrier stack, typically such a loading and unloading gap will be opened between the uppermost substrate carrier and a cover of the substrate carrier stack, if such a cover is provided. In order to access the seat of the lowermost substrate carrier of the substrate carrier stack, such a loading and unloading gap will be opened between the lowermost substrate carrier and the vertically next adjacent substrate carrier of the substrate carrier stack. The lowermost substrate carrier typically will rest on a base of the substrate carrier stack, if such a base is provided.

Since only one such loading and unloading gap can be opened in the substrate carrier stack at the same time, the process of unloading and loading substrates on and from substrate carriers is rather slow. This is detrimental for the use of such substrate carriers and substrate carrier stacks in the semiconductor production, for the handling, storage, in particular, intermediate storage, treatment, and processing of unprocessed, preprocessed, or processed semiconductor wafers, since generally a high throughput of such substrates is required for efficiency reasons. Such an opener could be a bottle neck that limits the throughput of such substrates in the semiconductor production.

However, a new and substantially improved opener apparatus was developed by TEC-SEM AG, which overcomes this limitation and disadvantage of the earlier kind of opener apparatus. The new opener apparatus operates according to a different concept. The new opener apparatus includes a movement mechanism which is adapted to bring the substrate carriers of the substrate carrier stack having a defined number of substrate carriers from a stacked state, in which there is no loading and unloading gap between the upper substrate carrier and the lower substrate carrier of each pair of vertically adjacent substrate carriers of the substrate carriers stack, to an unstacked state, in which a respective loading and unloading gap is opened between the upper substrate carrier and the lower substrate carrier of each pair of vertically adjacent substrate carriers of the substrate carrier stack. In the unstacked state, all seats of the substrate carriers are able to be accessed for loading and unloading, which allows a high throughput of substrates. The movement mechanisms further is adapted to bring the substrate carriers from the unstacked state back to the stacked state.

Herein the inventive concepts and the constructional details of preferred embodiments of new opener apparatuses and related methods of operating are disclosed.

SUMMARY OF THE INVENTION

Preferred embodiments of the present invention provide improved opener apparatuses and improved methods for accessing one or a plurality of substrate seats of a respective substrate carrier of a substrate carrier stack which enables more efficient access to the substrate seats and a higher throughput than was possible according to prior art approaches.

According to a preferred embodiment of the present invention, an opener apparatus accommodates and opens a substrate carrier stack that includes a plurality of substrate carriers arranged stacked in a vertical direction such that, for each pair of vertically adjacent substrate carriers of the substrate carrier stack, a respective lower substrate carrier supports a respective upper substrate carrier, wherein each substrate carrier includes an outer carrier frame which extends in a horizontal frame plane around an inner zone including an inner opening and defines or is provided with a substrate seat that accommodates and carries a plate-shaped substrate within an inner accommodation space of the substrate carrier stack. The opener apparatus includes a movement mechanism which is adapted and operable to move the substrate carriers of such a substrate carrier stack including a number of substrate carriers not exceeding a predefined first maximum number of substrate carriers relatively with respect to each other along a vertical axis in an opening operation such that the substrate carriers are brought from a stacked state, in which the substrate carriers are stacked on each other and define the substrate carrier stack which is supported within the opener apparatus, to an unstacked state, in which the substrate carriers are unstacked and positioned staggered with respect to each other along the vertical axis at defined vertical opened positions within the opener apparatus, with vertical distances between vertically adjacent substrate carriers in the unstacked state such that the substrate seats of all substrate carriers are accessible from a horizontal direction for at least one of unloading at least one plate-shaped substrate from a respective substrate seat of a respectively selected substrate carrier and loading at least one plate-shaped substrate on a respective substrate seat of a respectively selected substrate carrier.

The movement mechanism also moves the substrate carriers of the substrate carrier stack in the unstacked state relatively with respect to each other along the vertical axis in a closing operation such that the substrate carriers are brought back to the stacked state in which the substrate carriers define the substrate carrier stack.

The movement mechanism also vertically distances the respective lower substrate carrier from the respective upper substrate carrier of each respective pair of vertically adjacent substrate carriers of the substrate carrier stack in the opening operation by moving the respective lower substrate carrier vertically downwardly.

The movement mechanism also vertically moves the respective lower substrate carrier towards the respective upper substrate carrier of each respective pair of vertically adjacent substrate carriers of the vertically staggered substrate carriers in the closing operation by moving the respective lower substrate carrier vertically upwardly.

Accordingly, in the opened or unstacked state a respective loading and unloading gap is open between all vertically next adjacent substrate carriers, which enables sequential or even simultaneous access to a plurality of selected substrate seats to load and unload, including to load and unload for sorting tasks. Preferably, all unloading and loading necessary at a certain processing stage with respect to the substrate carriers in the unstacked state is able to be done without further relative movements between the substrate carriers, so that a high throughput is able to be achieved.

Preferably, the vertical distances between vertically adjacent substrate carriers in the unstacked state may be equidistant. This enables the use of many common parts to construct the opener apparatus and makes the control of a robot arrangement that accesses the seats to load and unload simpler.

According to a preferred embodiment of the present invention, the opener apparatus accommodates and opens a substrate carrier stack which includes substrate carriers including an outer carrier frame of quadratic or substantially quadratic shape, or of rectangular or substantially rectangular shape. In particular, substrate carriers and substrate carrier stacks as known from US 2017/0372930 A1 are able to be accommodated and handled by the opener apparatus according to preferred embodiments of the present invention. In the disclosure below, instead of the term "opener apparatus," the term "opener" may also be used for briefness.

The opener apparatus is able to accommodate and open a substrate carrier stack of a type which includes a cover which is stacked on the plurality of substrate carriers such that the uppermost substrate carrier of the substrate carriers supports the cover, wherein the movement mechanism is able to move the uppermost substrate carrier of the substrate carrier stack relatively with respect to the cover along the vertical axis in the opening operation to achieve the unstacked state, in which the cover and the substrate carriers are unstacked and positioned staggered with respect to each other along the vertical axis at defined vertical opened positions within the opener apparatus, with such a vertical distance between the cover and the uppermost substrate carrier in the unstacked state that the substrate seat of the uppermost substrate carrier is accessible from the horizontal direction for at least one of unloading a plate-shaped substrate from a the substrate seat of the uppermost substrate carrier and loading a plate-shaped substrate on the substrate seat of the uppermost substrate carrier. Further, the movement mechanism is able to move the cover and the substrate carriers of the substrate carrier stack in the unstacked state relatively with respect to each other along the vertical axis in the closing operation such that the cover and the substrate carriers are brought back to the stacked state in which the substrate carriers define the substrate carrier stack including the cover stacked on the uppermost substrate carrier. The movement mechanism is able to vertically distance the uppermost substrate carrier of the substrate carrier stack from the cover in the opening operation by moving the uppermost substrate carrier vertically downwardly. The movement mechanism is able to vertically move the uppermost substrate carrier towards the cover being unstacked in the closing operation by moving the uppermost substrate carrier vertically upwardly.

The opener apparatus is able to accommodate and open a substrate carrier stack of a type which includes a base on which the plurality of substrate carriers is stacked such that the base supports the lowermost substrate carrier of the substrate carriers.

Preferably, a substrate carrier stack that is accommodated and handled by an opener apparatus according to a preferred embodiment of the present invention will include both a base and a cover. Such a substrate carrier stack is preferably used in the closed or stacked state to perform purging treatments of substrates defined by preprocessed semiconductor wafers held within the seats of the substrate carrier stack. In order to reduce or minimize the amount of purging gas required, the purging should preferably be done within the in-accommodation space of the substrate carrier stack, which is sealed from the environment by sealing engagements between next adjacent substrate carriers and between the uppermost substrate carrier and the cover and between the lowermost substrate carrier and the base. However, it is possible that there are applications where no base and no cover are required. For example, a purging could even be performed without a base and without a cover in a purging chamber of a suitable purging apparatus.

The opener apparatus may be adapted to accommodate and open such a substrate carrier stack which includes a number of substrate carriers that exceeds the predefined first maximum number of substrate carriers, but does not exceed a predefined second maximum number of substrate carriers. To this end, the movement mechanism is able to move the substrate carriers of a selected substrate carrier sub-group of the substrate carrier stack relatively to each other along the vertical axis in an opening operation, to bring the substrate carriers of the selected substrate carrier sub-group from the stacked state, in which all of the substrate carriers of the substrate carrier stack are stacked on each other and define the substrate carrier stack, to an unstacked state, in which the substrate carriers of the selected substrate carrier sub-group are unstacked and positioned staggered with respect to each other along the vertical axis at defined vertical opened positions, with vertical distances between vertically adjacent substrate carriers in the unstacked state such that the substrate seats of all of the substrate carriers of the selected substrate carrier sub-group are accessible from a horizontal direction for at least one of unloading at least one plate-shaped substrate from a respective substrate seat of a respectively selected substrate carrier and loading at least one plate-shaped substrate on a respective substrate seat of a respectively selected substrate carrier. The movement mechanism is able to move the substrate carriers of the selected substrate carrier sub-group in the unstacked state relatively with respect to each other along the vertical axis in a closing operation such that these substrate carriers are brought back to the stacked state in which these substrate carriers are stacked on each other, to define the substrate carrier stack together with one or a plurality of substrate carriers not belonging to the selected substrate carrier sub-group.

The opener apparatus discussed above is able to accommodate and handle substrate carrier stacks with respect to the opening and closing which include more substrate carriers stacked on each other than there are provisions to hold a respective substrate carrier at vertical distances from the next adjacent upper and next adjacent lower substrate carrier or at vertical distances from the cover and the next adjacent lower substrate carrier. The predefined first maximum number of substrate carriers may reflect these provisions, for example, a number of vertically staggered supports or sets of holding elements, which may be denoted as engagement formations engageable with a respective substrate carrier to hold the same at a respective vertical position within the opener apparatus. The predefined second maximum number of substrate carriers may reflect how many substrate carriers are able to be included in the substrate carrier stack to be suitable to be accommodated in the opener apparatus and handled in respective sub-groups with respectively opening and closing by the opener apparatus. According to this approach, loading and unloading gaps will be opened in the opened state not between all substrate carriers of the substrate carrier stack, so that the throughput of substrates will be lower, but the advantage of a higher storage capacity to store substrates in the substrate carrier stack is achieved.

Preferably, the movement mechanism of the opener apparatus vertically distances the respective lower substrate carrier from the respective upper substrate carrier of each respective pair of vertically adjacent substrate carriers of the selected substrate carrier substrate sub-group in the opening operation by moving the respective lower substrate carrier vertically downwardly, wherein the movement mechanism also vertically moves the respective lower substrate carrier towards the respective upper substrate carrier of each respective pair of vertically adjacent substrate carriers of the vertically staggered substrate carriers of the selected substrate carrier sub-group in the closing operation by moving the respective lower substrate carrier vertically upwardly.

Further, the movement mechanism of the opener apparatus is able to vertically distance the uppermost substrate carrier of the selected substrate carrier sub-group from a vertical adjacent substrate carrier not belonging to the selected sub-group and stacked on the uppermost substrate carrier of the selected substrate carrier sub-group in the stacked state or from the cover by moving the uppermost substrate carrier of the selected substrate carrier sub-group vertically downwardly, wherein the movement mechanism is also able to vertically move the uppermost substrate carrier of the selected substrate carrier sub-group towards the vertically adjacent substrate carrier not belonging to the selected sub-group or to the cover in the closing operation, by moving the uppermost substrate carrier of the selected substrate carrier sub-group vertically upwardly.

Preferably, the movement mechanism of the opener apparatus performs the opening operation and the closing operation on the substrate carriers of a selected substrate carrier sub-group which is an upper substrate carrier sub-group of the substrate carrier stack and includes the uppermost substrate carrier of the substrate carrier stack. To this end, the movement mechanism is able to move the uppermost substrate carrier of the selected substrate carrier sub-group vertically downwardly, to open the loading and unloading gap between this substrate carrier and the cover, if a cover is provided. Correspondingly, the movement mechanism is able to vertically move the uppermost substrate carrier of this selected substrate carrier sub-group towards the cover, to close this loading and unloading gap again.

Preferably, the movement mechanism of the opener apparatus performs the opening operation and the closing operation on the substrate carriers of a selected substrate carrier sub-group which is a lower substrate carrier sub-group of the substrate carrier stack and includes the lowermost substrate carrier of the substrate carrier stack.

Preferably, the movement mechanism of the opener apparatus performs the opening operation and the closing operation on the substrate carriers of a selected substrate carrier sub-group that is an intermediate substrate carrier sub-group of the substrate carrier stack and neither includes the lowermost substrate carrier nor the uppermost substrate carrier of the substrate carrier stack. The opener apparatus is able to operate on one such intermediate substrate carrier sub-group or alternatively on a plurality of separate intermediate substrate carrier sub-groups. Further, it is possible that there may be an overlap between different of such substrate carrier sub-groups. To this end, the opener apparatus is able to operate on the basis of different associations of the substrate carriers to alternate substrate carrier sub-groups of the substrate carrier stack.

Preferably, the lowermost substrate of the substrate carrier stack is able to remain seated on the base (if provided) in the unstacked state, if the substrate carrier stack is opened completely, and the lowermost substrate carrier of the selected substrate carrier sub-group is able to remain seated on the base (if provided) or a substrate carrier or a partial substrate carrier stack not belonging to the selected substrate carrier sub-group, if the substrate carrier stack is opened only partially.

According to a preferred embodiment of the present invention, the movement mechanism of the opener apparatus includes a carriage which is supported movably along the vertical axis relative to a rack or housing of the opener apparatus between an upper operational position and a lower operational position corresponding to, or near to, a lower limit position. This movement mechanism is able to move the carriage downwardly towards the lower operational position to perform the opening operation and to move the carriage upwardly towards the upper operational position to perform the closing operation. The upper operational position is able to be a loading and unloading position in which a respective substrate carrier stack is able to be loaded on, or unloaded from, the carriage or an unloading position in which a respective substrate carrier stack is able to be unloaded from the carriage.

Such a movable carriage performs the stacking and unstacking of the substrate carriers of the substrate carrier stack in the course of the opening operation and the closing operation. Many advantages are able to be achieved on the basis of the movable carriage, as will become more apparent in the following.

Preferably, at least one of the carriage and the rack or housing may include at least one of (a) positioning or guiding formations which cooperate with counter positioning or guiding formations of the substrate carriers, (b) positioning or guiding formations which cooperate with counter positioning or guiding formations of the base of the substrate carrier stack, and (c) positioning or guiding formations which cooperate with counter positioning or guiding formations of the cover of the substrate carrier stack; wherein the positioning or guiding formations and counter positioning or guiding formations obtain and maintain a defined positioning of the substrate carrier stack on the carriage and a defined positioning of the substrate carriers and—if provided—of the cover in the course of the opening operation and in the unstacked state in directions orthogonal with respect to the vertical axis. Therewith, a proper operation and function of the opener apparatus and a proper interaction between the opener apparatus and the substrate carrier stack and its components is able to be achieved and safeguarded.

Preferably, the movement mechanism of the opener apparatus may include engagement formations which are directly or indirectly supported by the rack or housing at defined fixed vertical positions in a vertically staggered manner and are associated with, and engageable with, associated counter engagement formations of a respectively associated substrate carrier and—if provided—of the cover of a substrate carrier stack loaded on the carriage, wherein the engagement formations are selectively operable to assume a respective catching and holding state in which the engagement formations engage or, are engageable with, a respective associated counter engagement formation of the respectively associated substrate carrier and—if provided—the cover of the substrate carrier stack and a respective releasing and passing state in which the engagement formations are not engaged, and are not engageable with, the associated counter engagement formation of the respectively associated substrate carrier and—if provided—the cover.

With the engagement formations, the opening and closing of the substrate carrier stacks or a sub-group of substrate carriers thereof is able to be achieved effectively, with a coordinated operation of the carriage and its movement upwards and downwards and of the engagement formations. Therefore, the configuration of the movement mechanism with the carriage and the engagement formations is an effective configuration included in preferred embodiments of the present invention. However, other configurations of the movement mechanism are also possible.

Preferably, one or a plurality of engagement formations is associated with each substrate carrier of the substrate carrier stack. However, this is not absolutely necessary. In particular, it is possible that no engagement formation is associated with the lowermost substrate carrier of the substrate carrier stack. In this case, the lowermost substrate carrier is able to remain supported on the carriage also in the unstacked state, directly or indirectly, in particular, via the base, if provided. To this end, the vertical opened position of the lowermost substrate carrier is able to be determined by, or correspond to, the lower operational position of the carriage. Further, in the case that the opener apparatus is able to operate on a selected substrate carrier sub-group, there will preferably be a number of substrate carriers, which do not belong to a currently selected sub-group in a certain operating mode of the opener and have no engagement formations associated therewith.

The association between the engagement formations, on the one hand, and the substrate carriers and—if provided—the cover and the counter engagement formations on the other hand may depend on a current operation mode of the opener apparatus. If the opener apparatus performs the opening operation and the closing operation on the substrate carriers of a selected substrate carrier sub-group of the substrate carrier stack, this association will depend on the selected substrate carrier sub-group, in particular, if the number of substrate carriers of the substrate carrier stack exceeds the predefined first maximum number of substrate carriers, which depends on the maximum number of substrate carriers of substrate carrier stack, which are able to simultaneously have their counter engagement formations engaged by associated engagement formations of the opener apparatus in their catching and holding state.

Preferably, the engagement formations in their releasing and passing state may not be engageable with any counter engagement formation of any substrate carrier of the sub-substrate carrier stack, which contributes to a safe operation of the opener apparatus.

It is further proposed that the engagement formations are consecutively operable in the opening operation to assume the catching and holding state in an order and timing which depends on their vertical positions and a momentary vertical position of the carriage which is moved intermittently or—preferably—continuously towards the lower operational position, and that the engagement formations are consecutively operable in the closing operation to assume the releasing and passing state in an order and timing which depends on their vertical positions and a momentary vertical position of the carriage which is moved intermittently or—preferably—continuously towards the upper operational position.

Preferably, the movement mechanism of the opener apparatus is able to selectively operate the engagement formations to assume the catching and holding state in the opening operation in a manner which is coordinated with the downward movement of the carriage, such that, consecutively, a respective topmost substrate carrier of the substrate carrier stack or of a partial substrate carrier stack still loaded on the carriage is caught and held by at least one associated engagement formation which engages with the respective associated counter engagement formation of this substrate carrier, so that this substrate carrier is held within the opener apparatus in a respective defined vertical opened position determined by the at least one associated engagement formation.

Further, the movement mechanism of the opener apparatus is able to selectively operate the engagement formations to assume the releasing and passing state in the closing operation in a manner which is coordinated with the upward movement of the carriage, such that, consecutively, a respective lowermost or remaining substrate carrier held within the opener apparatus by the respective at least one associated engagement formation in a respective defined vertical opened position is released by the at least one associated engagement formation which disengages from the respective associated counter engagement formation of this substrate carrier, so that this substrate carrier is placed on the carriage or is stacked on a substrate carrier or—if provided—the base or a partial substrate carrier stack loaded on the carriage.

In a case that the lowermost substrate carrier of the substrate carrier stack is held by one or a plurality of engagement formations in the unstacked state, this lowermost substrate carrier will be the first to be loaded again onto the carriage in the course of the closing operation, either by placing the lowermost substrate carrier on the carriage or—if provided—on the base.

Preferably, the cover (if provided) and the base (if provided) belong to the substrate carrier stack, so that the base, which is able to remain supported on the carriage in the unstacked state, is able to be identified to be a partial substrate carrier stack loaded on the carriage in the unstacked state. However, if a partial substrate carrier stack is required to include at least two elements stacked onto each other, the base (if provided) with the first substrate carrier stacked thereon or two substrate carriers stacked on each other define a partial substrate carrier stack which is carried in an early stage of the closing operation on the carriage. In the further course of the closing operation, the other substrate carriers are subsequently stacked onto this partial substrate carrier stack and become included in this partial substrate carrier stack. When the uppermost carrier or—if provided—the cover is stacked onto the partial substrate carrier stack at this stage, the "rebuilding" of the substrate carrier stack and the changeover from the unstacked state to the stacked state is complete.

Preferably, the movement mechanism of the opener apparatus is able to selectively operate the engagement formations to assume the catching and holding state in the opening operation in such a manner that first the cover (if provided) of the substrate carrier stack is caught and held by at least one associated engagement formation which engages with the respective associated counter engagement formation of the cover so that it is held within the opener apparatus in a defined vertical opened position determined by the at least one associated engagement formation.

Further, the movement mechanism of the opener apparatus is able to selectively operate the engagement formations to assume the releasing and passing state in the closing operation in such a manner that the cover (if provided) held within the opener apparatus by the at least one associated engagement formation in the defined vertical opened position is released by the at least one associated engagement formation which disengages from the respective associated counter engagement formation of the cover, so that the cover is stacked on the uppermost substrate carrier of the substrate carriers loaded on the carriage.

If the opener apparatus is adapted to operate on a selected sub-group of substrate carriers of the substrate carrier stack, the movement mechanism of the opener apparatus is preferably able to selectively operate the engagement formations to assume the catching and holding state in the opening operation in such a manner that first a selected substrate carrier, which is the vertically adjacent substrate carrier stacked on the uppermost substrate carrier of a selected substrate carrier sub-group of the substrate carrier stack in the stacked state, is caught and held by at least one associated engagement formation which engages with the respective associated counter engagement formation of this selected substrate carrier so that it is held within the opener apparatus in a defined vertical opened position determined by the at least one associated engagement formation and is subsequently unstacked from the uppermost substrate carrier of a selected substrate carrier sub-group in the course of the opening operation.

Further, the movement mechanism of the opener apparatus is able to selectively operate the engagement formations to assume the releasing and passing state in the closing operation in such a manner that the selected substrate carrier having been unstacked from the uppermost substrate carrier of the selected substrate carrier sub-group of the substrate carrier stack is released by the at least one associated engagement formation which disengages from the respective associated counter engagement formation of the selected substrate carrier, so that the selected substrate carrier is stacked on the uppermost substrate carrier of the substrate carriers loaded on the carriage.

Together with the selected substrate carrier, at least one other substrate carrier being stacked on the selected substrate carrier, preferably a plurality of substrate carriers and—if provided—the cover being commonly stacked on the selected substrate carrier, all not belonging to the selected substrate carrier sub-group, will be held within the opener apparatus as a consequence of the opening operation using the at least one engagement formation and will be stacked again on the uppermost substrate carrier of the selected substrate carrier sub-group as a consequence of the closing operation.

Generally, the engagement formations in their catching and holding state are able to be positioned in a catching and holding position, in which the engagement formations overlap vertically with the respective associated counter engagement formation, and the engagement formations in their releasing and passing state are able to be positioned in a releasing and passing position, in which the engagement formations do not overlap vertically with the respective associated counter engagement formation.

Preferably, the engagement formations are able to be defined by engagement elements which are supported relative to the rack or housing to be moved, preferably pivoted, between the catching and holding position and the releasing and passing position. Preferably, the engagement elements are supported to be pivotable about a vertical pivoting axis.

The engagement elements are able to include a respective sleeve section which is pivotable about a vertical pivoting axis and a respective engagement section that projects radially from the sleeve section and is engageable with the associated counter engagement formation.

It is further proposed that the engagement formations or engagement sections are able to be engaged with counter engagement formations which project horizontally outwardly from the respective outer carrier frame of the substrate carriers and if provided—the cover, respectively, or which are provided on or in an outer circumferential edge of the respective outer carrier frame of the substrate carriers and—if provided—the cover, respectively.

According to a preferred embodiment of the opener apparatus, the movement mechanism may include a plurality of sets of vertically staggered engagement formations, so that a plurality of engagement formations are associated and engageable with a plurality of counter engagement formations of a respective associated substrate carrier and—if provided—the cover of the substrate carrier stack loaded on the carriage, wherein vertically staggered engagement formations of the sets are located at different sides of the carriage and its vertical movement range. Preferably, this configuration contributes to proper and safe functionality of the opener apparatus with respect to the substrate carrier stack and its components as well.

Preferably, different types of engagement formations are provided and arranged in the vertical direction in an alternating manner within each set of vertically staggered engagement formations, wherein the different types of engagement formations have associated different types of counter engagement formations of the substrate carriers and—if provided—the cover, such that an engagement formation of a first type is engageable with a counter engagement formation of a first type, and an engagement formation of a second type is engageable with a counter engagement formation of a second type, but that an engagement formation of a first type is not engageable with a counter engagement formation of a second type, and an engagement formation of a second type is not engageable with a counter engagement formation of a first type, when the engagement formations assume their respective catching and holding state.

This configuration of the engagement formations and the complementary realization of the counter engagement formations of the substrate carriers of the substrate carrier stack is not absolutely necessary, but efficient to achieve a proper operation of the opener apparatus and its interaction with the substrate carriers. Preferably, it enables the ability to provide the engagement formations and to control their operation in a relatively simple manner since unintended interactions between the engagement formations and counter engagement formations are able to more easily be avoided. The vertical distance between vertically adjacent counter engagement formations of the same type within the substrate carrier stack is increased, if counter engagement formations of the first and second types are provided alternatingly along the vertical direction, so that the associated engagement formations of the first and the second type are able to readily interact with the correct associated counter engagement formation of a respective substrate carrier. Preferably, more types of counter engagement formations and associated engagement formations may be provided.

Preferably, the engagement sections of the engagement elements that define the engagement formations of different types, in the case of the pivotable configuration proposed above, may have varying radial distances between the vertical pivoting axis and a respective portion that engages with the associated counter engagement formation in the catching and holding position, such that, along the vertical direction, such different engagement sections that have different distances between the vertical pivoting axis and the respective portion that engages with the associated counter engagement formation in the catching and holding position are provided in an alternating manner.

The sleeve sections of the engagement elements that define the engagement formations may be defined by sleeve members, to which separate engagement members are attached which define the engagement sections of the engagement elements, wherein along the vertical direction, different types of separate engagement members are attached to the sleeve members in an alternating manner, wherein the engagement members have varying radial distances between the vertical pivoting axis and the respective portion that engages with the associated counter engagement formation in the catching and holding position.

The sleeve sections of the engagement elements that define the engagement formations of a respective set of vertically staggered engagement formations may be mounted to a common mounting pillar of the opener apparatus using inner pivot bearings. This is a simple but effective configuration to mount the engagement elements. This configuration to mount the engagement elements is also able to be used if engagement formations of only one type are provided.

According to a preferred embodiment of the present invention, the opener apparatus may include a first loading and unloading port on a first side of the opener apparatus, wherein the first loading and unloading port enables the ability to access the substrate seats of the substrate carriers in the unstacked state from a first horizontal direction for at least one of unloading at least one plate-shaped substrate from a respective substrate seat of a respectively selected substrate carrier and loading at least one plate-shaped substrate on a respective substrate seat of a respectively selected substrate carrier, and the opener apparatus may include a second loading and unloading port on the first side or another side of the opener apparatus, preferably a second side of the opener apparatus opposite to the first side, wherein the second loading and unloading port enables the ability to access the carriage in the upper operational position from the first horizontal direction or another horizontal direction, preferably a second horizontal direction opposite to the first horizontal direction, for at least one of unloading a respective substrate carrier stack from the carriage and loading a respective substrate carrier stack on the carriage.

Preferably, the second loading and unloading port may include holding formations, which are adapted to assume a holding position, in which the holding formations are able to hold a substrate carrier stack within the opener apparatus at a vertical distance above the carriage when positioned in the upper operational position, wherein the carriage is movable from the upper operational position upwardly to an upper receiving position associated with the holding formations in the course of a loading operation and is movable from the upper receiving position towards the lower operational position in the course of the opening operation. The holding formations further are able to assume in the course of the loading operation a releasing position, in which the holding formations release a substrate carrier stack previously held to be loaded on the carriage being positioned in or approaching the upper receiving position. Preferably, the second loading and unloading port is able to enable the ability to load a respective substrate carrier stack on the holding formations, wherein the vertical distance above the carriage when positioned in the upper operational position preferably is selected such that a respective substrate carrier stack not exceeding a predefined height is able to be supported on the carriage being positioned in the upper operational position below a respective substrate carrier stack held by the holding formations. Therefore, a high throughput of substrate carrier stacks is able to be achieved.

The holding formations may be associated with an actuator arrangement that moves the holding formations from the holding position to the releasing position and from the releasing position to the holding position. Each holding formation, which may be defined by a hook-shaped holding element, may be provided with a respective individual electromechanical actuator, e.g., a solenoid actuator. However, other configurations that achieve the movement between the holding position and the releasing position are also possible. For example, the holding formations may be biased by a spring arrangement towards the holding position, and the carriage may act on the holding formations to move the same towards the releasing position when the carriage approaches the upper receiving position.

Preferably, at least one of the first loading and unloading port and the second loading and unloading port, preferably at least the second loading and unloading port is provided with a shielding arrangement which is able to be opened and closed, such as a sliding door or the like, so that the (respective) port is able to be closed, e.g., to perform the opening or closing operation.

Preferably, the opener apparatus may include at least one first ionizer device which is associated with the first loading and unloading port and/or at least one second ionizer device which is associated with the second loading and unloading port, to eliminate or reduce static electricity, which could be harmful to semiconductor wafers included in a respective substrate seat or being handled or to be handled, e.g., transferred towards a respective substrate seat or from a respective substrate seat. The opener is also able to include supply and metering equipment to supply pressurized clean air to the at least one ionizer device, which preferably is located above the respective loading and unloading port.

Preferably, at least one housing wall of the opener apparatus, preferably a housing wall or housing wall section below the second loading and unloading port, may be provided with an array or matrix of venting openings which extend transversely and vertically over a substantial extent of the housing wall, preferably vertically over a vertical range of the opener apparatus which corresponds to at least a substantial portion of the vertical extent of the first loading and unloading port, which preferably is able to be located opposite to this array or matrix. The venting openings are able to include venting slits that extend in a transverse direction. The venting openings are able to include adjustable effective opening widths, so that a desired venting flow profile at least along the vertical direction is able to be adjustable. This enables a vertically uniform, preferably laminar, venting flow of clean air or gas through the opener apparatus to be adjusted.

The first side and the second side of the opener apparatus may correspond to a first side and a second side of the carriage and its vertical movement range, wherein the opener apparatus may include at least one set of vertically staggered engagement formations on a third side of the carriage and its vertical movement range and at least one set of vertically staggered engagement formations on a fourth side of the carriage and its vertical movement range opposite to the third side. Preferably, the third and fourth sides are left and right sides with respect to the first loading and unloading port in a side view on this port and/or with respect to the second loading and unloading port in a side view of this port.

Preferably, two sets of vertically staggered engagement formations are provided on the third side, which are offset from each other in the first horizontal direction, and/or two sets of vertically staggered engagement formations are provided on the fourth side, which are offset from each other in the first horizontal direction. Accordingly, each substrate carrier supported within the opener apparatus in the unstacked state by engagement formations is held by at least three engagement formations, preferably, at least four engagement formations or exactly four engagement formations. A proper operation of the opener and a proper functioning of the opener with respect to the interaction with the substrate carriers is achieved.

Preferably, the engagement formations are able to be operated using conventional operators and actuators, for example, mechanical, electromechanical, and pneumatic operators and actuators. There are many possibilities with respect to a suitable interaction arrangement which is able to apply forces onto the engagement formations to operate the same in an appropriate manner.

According to a preferred embodiment of the opener apparatus, the movement mechanism may include an interaction arrangement that applies forces onto the engagement formations, the forces include at least one or a plurality of: (a) actuating forces that move a respective engagement formation from a/the releasing and passing position corresponding to the releasing and passing state to a/the catching and holding position corresponding to the catching and holding state, (b) actuating forces that move a respective engagement formation from a/the catching and holding position corresponding to the catching and holding state to a/the releasing and passing position corresponding to the releasing and passing state, (c) holding forces that hold a respective engagement formation in a/the releasing and passing position corresponding to the releasing and passing state, and (d) holding forces that hold a respective engagement formation in a/the catching and holding position corresponding to the catching and holding state.

The interaction arrangement preferably may include a plurality of individual interaction devices which are directly or indirectly supported by the rack or housing and are provided at fixed vertically staggered positions corresponding or adjacent to the defined vertical positions of the engagement formations, wherein each of the individual interaction devices is able to apply at least one force of the actuating forces and holding forces onto at least one associated engagement formation. The individual interaction devices each may include at least one selectively operable actuator, preferably a pneumatic or electromechanical actuator, e.g., a solenoid actuator, to apply at least one force of the actuating forces and the holding forces onto the at least one associated engagement formation. Further, the individual interaction devices each may include a permanently acting interaction device, to apply at least one of the holding forces and actuating forces onto the at least one associated engagement formation. In particular the individual interaction devices each may include at least one of a biasing spring arrangement and a permanent magnet arrangement.

Preferably, only individual interaction devices defined by permanently acting interaction devices are provided, e.g., biasing spring arrangements and/or permanent magnet arrangements. For example, permanent magnet arrangements are particularly favorable. These individual interaction devices contribute to or safeguard that the engagement formations assume the respective appropriate position in the course of the operation of the opener apparatus when effecting the opening operation and the closing operation. Actuating forces preferably are exerted by at least one movable interaction device referred to the following, but are also able to be appropriately exerted by individual interaction devices including selectively operable actuators, as discussed above.

Concerning the individual interaction devices including a permanent magnet arrangement, it is further proposed that at least one of the sleeve sections of the engagement elements that define the engagement formations discussed above interacts magnetically with an associated mounting section of the mounting pillar, wherein one of the sleeve section and the mounting section is equipped with a least one permanent magnet and the other of the sleeve section and the mounting section is equipped with at least one magnetic or magnetizable element, such that a least one of a magnetic force biasing the engagement element towards the catching and holding position, when the engagement element is in, or near to, the catching and holding position, and a magnetic force biasing the engagement element towards the releasing and passing position, when the engagement element is in, or near to, the releasing and passing position, occurs.

The sleeve section may be equipped with a pair of magnetizable abutment elements, wherein the mounting section is equipped with a counter abutment element which projects between the magnetizable abutment elements of the sleeve section. The counter abutment element is magnetizable and the sleeve section is further equipped with at least one permanent magnet associated with the magnetizable abutment elements or the counter abutment element includes or is defined by a permanent magnet. One of the magnetizable abutment elements abuts against the counter abutment element, when the respective engagement element is in the catching and holding position, and the other of the magnetizable abutment elements abuts against the counter abutment element, when the respective engagement element is in the releasing and passing position. Such sleeve sections with associated permanent magnets contribute to, or safeguard, that the engagement formations respectively assume the correct position required at the respective operation state of the opener apparatus. This realization is preferable in the case that only individual interaction devices defined by permanently acting interaction devices are provided, but may be appropriate in the case that individual interaction devices including selectively operable actuators are included to provide actuating forces acting on the engagement formations. Furthermore, reduced or minimal installation space is required to provide this configuration.

As discussed above, the interaction arrangement preferably may include at least one moveable interaction device which is supported moveably in the vertical direction relative to the rack or housing to vertically staggered vertical interaction positions or vertical interaction position ranges corresponding, including, or adjacent to the defined vertical positions of the engagement formations, wherein the moveable interaction device applies at least one of the actuating forces onto at least one associated engagement formation when the moveable interaction device has been moved to a respective of the interaction positions or interaction position ranges or passes a respective of the interaction positions or interaction position ranges in the course of its vertical movement. With such at least one movable interaction device, the need to install numerous individual interaction devices including selectively operable actuators preferably is able to be avoided, which is able to provide substantial advantages with respect to the manufacturing costs of such an opener apparatus. Further, the overall installation space needed to install the actuators is reduced.

The moveable interaction device may include at least one actuating member, which is moveable between a first position and a second position, preferably longitudinally in a horizontal direction, wherein the actuating member, when the moveable interaction device has been moved to a respective of the vertical interaction positions or vertical interaction position ranges or passes a respective of the vertical interaction positions or vertical interaction position ranges in the course of its vertical movement, applies an actuating force or first actuating force onto at least one associated engagement formation, when the actuating member assumes the first position or based on a movement of the actuating member towards the first position, and applies no actuating force onto the at least one associated engagement formation, when the actuating member assumes the second position, or applies a second actuating force onto the at least one associated engagement formation, when the actuating member assumes the second position or based on a movement of the actuating member towards the second position. The actuating force or first actuating force is able to be directed to move the at least one associated engagement formation towards one of the respective releasing and passing position and the respective catching and holding position and the second actuating force is able to be directed to move the at least one associated engagement formation towards the other of the respective releasing and passing position and the respective catching and holding position.

Preferably, one actuating force is needed to move a respective engagement formation from the releasing and passing position to the catching and holding position, and another actuating force is needed to move a respective engagement formation from the catching and holding position to the releasing and passing position. It is further preferred, that these actuating forces are exerted by the actuating member, which assumes the first position or the second position, respectively, or on basis of the movement of the actuating member towards the second position, typically from an initial position corresponding to, or near to, the first position, or on the basis of the movement of the actuating member towards the first position, preferably from an initial position corresponding to, or near to, the second position, respectively.

However, it is also possible that the second position of the actuating member is only a kind of "neutral" position, in which no actuating forces are exerted onto a respective engagement portion. This is able to be appropriate if, e.g., a respective permanently acting interaction device is provided to the engagement formations to move the respective engagement formation from one position of the releasing and passing position to the catching and holding position to the other position of the releasing and passing position to the catching and holding position, so that the actuating member of the moveable member is only needed to move the respective engagement formation from the other position to the one position, where the respective engagement formation is able to be held by an associated individual interaction device, which exerts a holding force that overcomes the actuating force of the permanently acting interaction device to maintain the engagement in this position in a first operation state and exerts no such holding force in a second operation state, when the engagement formation returns to the other position. Such an individual interaction device may include a solenoid to generate the holding force electromagnetically, whereas the individual interaction device defined by the permanently acting interaction device is able to appropriately include a biasing spring arrangement.

Preferably, the moveable interaction device is able to be connected with, and, preferably, directly or indirectly supported by, the carriage to achieve common vertical movement. By providing the movable interaction device at a defined vertical position with respect to a supporting portion of the carriage, common movement of the carriage with the movable interaction device is able to enable a coordinated operation of the engagement formations to assume the releasing and passing position and the catching and holding position, appropriately coordinated with the vertical movement of the carriage.

If the opener apparatus is adapted to operate on the substrate carriers of a selected sub-group of substrate carriers of the substrate carrier stack, preferably a plurality of moveable interactions devices are provided, which are connected with and, preferably, directly or indirectly supported by, the carriage to achieve common vertical movement and are arranged at different vertical positions with respect to a supporting portion of the carriage which supports the substrate carrier stack loaded on the carriage. These moveable interaction devices may be associated with different predefined substrate carrier sub-groups of a respective substrate carrier stack loaded on the carriage.

Preferably, the (respective) moveable interaction device includes at least one selectively operable actuator, preferably a pneumatic or electromechanical actuator, to move the actuating member from the first position towards the second position and/or to move the actuating member from the second position towards the first position.

The selectively operable actuator is able to be adapted to apply the respective actuating force onto the respective engagement formation using the actuating member by moving the same towards the first or second position, wherein the actuating member includes at least one abutting portion which is adapted to abut against an associated counter abutting portion of the respective engagement formation in the course of its movement towards the first or second position, to apply the respective actuating force or first actuating force or second actuating force onto the respective engagement formation via the abutting portion. In order to move the vertically staggered engagement formations from the releasing and passing position to the catching and holding position and from the catching and holding position to the releasing and passing position, respectively, the abutting portion performs repeated movements from the respective initial position towards the respective of the first position and the second position and back to the respective initial position, to apply the actuating forces sequentially on the abutment portions of the engagement formations.

Alternatively, the actuating member may include at least one reaction portion which is adapted to interact with at least one associated counter reaction portion of the respective engagement formation, such that, when the actuating member is in its first or second position and the moveable interaction device passes a respective of the vertical interaction positions or vertical interaction position ranges, the resulting vertical movement of the reaction portion relative to the counter reaction portion engaged by the reaction portion produces the actuating force or first actuating force or second actuating force which is applied to the respective engagement formation via the counter reaction portion. In this respect, it is further proposed that the reaction portion and the associated counter reaction portion are adapted to interact like a cam and a cam follower in a cam—cam follower—interaction to produce the actuating force or first actuating force or second actuating force which is directed in a direction orthogonal to the direction of the vertical movement of the reaction portion relative to the counter reaction portion. Accordingly, the reaction portion will be brought only once in an operation position corresponding to the first or second position of the actuating member, to sequentially operate on the counter reaction portions of the engagement formations, to bring the engagement formations from the releasing and passing position to the catching and holding position and from the catching and holding position to the releasing and passing position, respectively.

Preferably, the engagement formations are able to include counter abutting portions or counter reaction portions which are located at defined varying vertical distances from the respective defined vertical opened position of the unstacked substrate carrier and—if provided—the cover associated with the respective engagement formation, to accommodate a varying vertical height of the substrate carrier stack or partial substrate carrier in the course of the opening operation and in the course of the closing operation. Alternatively, a movable interaction device being independently vertically movable, independent from the vertical movement of the carriage, or, if being connected with or indirectly supported by the carriage, a movable interaction device which is able to be moved relative to the carriage, may be provided, to accommodate this varying vertical height of the substrate carrier stack or partial substrate carrier in the course of these operations of the opener apparatus.

With reference to the preferred embodiments discussed above which include engagement elements that include sleeve sections, it is further proposed that the sleeve sections are defined by sleeve members, to which separate counter abutting portions or counter reaction portions are attached, wherein different kinds of counter abutting portions or counter reaction portions are provided, which have different vertical lengths between a portion that interacts with the abutting portion or the reaction portion, respectively, of the actuating member and a portion which is attached to the respective sleeve member, and/or wherein the separate counter abutting portions or counter reaction portions are attached to the respective sleeve member at different vertical heights within the vertical extent of the sleeve members.

In this respect, it is further proposed, that separate counter abutting portions or counter reaction portions of a first type are attached to sleeve members in an upper region of the opener apparatus, which have their portion that interacts with the abutting portion or the reaction portion located below the vertical extent of the respective sleeve member to which the respective counter abutting portion or counter reaction portion is attached, that separate counter abutting portions or counter reaction portion of a second type are attached to sleeve members in a middle region of the opener apparatus, which have their portion that interacts with the abutting portion or the reaction portion located within the vertical extent of the respective sleeve member to which the respective counter abutting portion or counter reaction portion is attached, and that separate counter abutting portions or counter reaction portions of a third type or the first type are attached to sleeve members in a lower region of the opener apparatus, which have their portion that interacts with the abutting portion or the reaction portion located above the vertical extent of the respective sleeve member to which the respective counter abutting portion or counter reaction portion is attached.

Accordingly, it is possible to accommodate the varying vertical height of this substrate carrier stack or partial substrate carrier stack in the course of the opening operation and in the course of the closing operation, by locating the counter abutting portions or counter reaction portions, respectively, or their portions that interact with the abutting portion or the reaction portion, respectively, at an appropriate defined vertical position within the opener apparatus.

The opener apparatus may include a vertical guiding arrangement to guide the carriage during its vertical movement in the course of the opening operation and in the course of the closing operation.

The movement mechanism may include a vertical driving arrangement which selectively vertically moves the carriage downwardly in the course of the opening operation and upwardly in the course of the closing operation and—if provided—in the course of the loading operation. The vertical driving arrangement may include at least one belt drive which is coupled with the carriage and is selectively operable to move the carriage downwardly to effect the opening operation and to move the carriage upwardly to effect the closing operation and—if provided—to effect the loading operation.

The opener apparatus may include a sensor arrangement that monitors at least one of the operation of the opener apparatus and states of the substrate carrier stack.

In this respect, the sensor arrangement includes at least one sensor that senses at least one of a current position of the carriage and a current movement condition of the carriage, and/or senses whether the opener apparatus assumes one or more of a plurality of defined states including a state in which the carriage is located in the upper operational position, a state in which no substrate carrier is loaded on the carriage while the carriage is located in the upper operational position, a state in which a substrate carrier stack is loaded on the carriage while the carriage is located in the upper operational position, a state in which the carriage is located in the upper receiving position, a state in which the carriage is located in the lower operational position, a state in which a substrate carrier stack is loaded on the carriage and assumes the stacked state, and a state in which the substrate carriers of the substrate carrier stack or a selected substrate carrier sub-group thereof and—if provided and applicable—the cover are unstacked and held within the opener apparatus at their respective vertical opened position. The sensor arrangement may include at least one sensor which senses whether a substrate carrier stack is held by the holding formations, if provided.

In order to sense at least one of a current position of the carriage and a current movement condition of the carriage, an optical sensor that sends light and receives reflected light and is able to determine therefrom a distance from a target object is able to be used, such as a co-called diffuse sensor or diffuse reflective sensor, preferably a type with background suppression. Such sensors typically use light pulses. Alternatively, or additionally, a driving shaft or another rotating element of the vertical driving arrangement may be provided with a rotary encoder to determine at least one of the current position of the carriage and the current movement condition of the carriage. Preferably, the rotary encoder is an absolute encoder, which needs no referencing.

The sensor arrangement may include at least one sensor that senses a current state of a respective of the engagement formations. Each engagement formation may be associated with such a sensor. Further, the sensor arrangement may include at least one sensor, which is associated with a plurality of the engagement formations and senses whether the plurality of the engagement formations assume the same state.

Further, the sensor arrangement may include at least one sensor that monitors an operation of at least one interaction device of the interaction arrangement and/or which senses a current state of at least one interaction device of the interaction arrangement. Each interaction device, preferably at least each selectively operable interaction device, may be associated with such a sensor.

The sensor arrangement preferably may include at least one sensor that monitors a changeover between the stacked state and the unstacked state in the opening operation and/or that monitors a changeover between the unstacked state and the stacked state in the closing operation.

Generally, the opener apparatus may include at least one of a stationary sensor arrangement and a moveable sensor arrangement, which monitors the staggered vertical positioning of the substrate carriers and—if provided and applicable—of the cover within the opener apparatus in the course of the opening operation and/or which is responsive to at least one of a presence, an absence, and a state of a substrate loaded on a respective seat of at least one substrate carrier held at its respective vertical opened position within the opener apparatus in the course of the opening operation and in the course of the closing operation. The moveable sensor arrangement may be moveable together with the carriage, downwardly in the opening operation and upwardly in the closing operation.

Generally, a plurality of moveable sensor arrangements may be provided, which are arranged to be moveable together with the carriage, downwardly in the opening operation and upwardly in the closing operation, wherein the moveable sensor arrangements may be arranged at different vertical positions with respect to a supporting portion of the carriage which supports the substrate carrier stack loaded on the carriage. Preferably, the moveable sensor arrangements may be associated with different pre-defined substrate carrier sub-groups of a respective substrate carrier stack loaded on the carriage.

Preferably, the at least one moveable sensor arrangement is connected with the carriage to achieve common vertical movement. To this end, the at least one moveable sensor arrangement may be directly or indirectly supported by the carriage.

The moveable sensor arrangement may be responsive to at least one of the presence, the absence, and the state of a substrate loaded on a respective seat of a plurality of or all substrate carriers held at their respective vertical opened positions within the opener apparatus in the course of at least one of the opening operation and the closing operation, wherein the moveable sensor arrangement includes at least one moveable sensor which is responsive in a horizontal sensing direction and is located at a defined vertical distance above a supporting portion of the carriage that supports a substrate carrier stack loaded on the carriage, such that in the course of the respective operation of the opening operation and the closing operation the moveable sensor or a respective of a plurality of moveable sensors located at different defined vertical distances above the supporting portion, consecutively vertically passes sideways of the substrate seat of at least one associated substrate carrier or a plurality of associated substrate carriers of the substrate carriers held within the opener apparatus at their respective vertical opened position.

In order to accommodate the varying vertical height of the substrate carrier stack or partial substrate carrier in the course of the opening operation and in the course of the closing operation, the movable sensor arrangement or respective moveable sensor arrangement may include a plurality of moveable sensors which each are responsive in a horizontal sensing direction and which are located at different defined vertical distances above the supporting portion of the carriage.

As discussed above, the lowermost substrate carrier is able to remain supported on the carriage also in the unstacked state, e.g., if no engagement formation is able to be associated with the lowermost substrate carrier of the substrate carrier stack or the lowermost substrate of the selected substrate carrier sub-group. In this case, it may be appropriate to provide at least one stationary sensor arrangement that is responsive to at least one of the presence, the absence, and the state of a substrate loaded on the seat of this lowermost substrate carrier, which may include at least one stationary sensor which is responsive in a horizontal sensing direction and is located at a defined vertical distance above the lower operational position of the carriage.

The sensor that is responsive in a horizontal sensing direction may be a light beam or light barrier sensor or the like. This sensor may be a one way sensor including a light transmitter and a separate light receiver or a reflective sensor including the light transmitting circuit and the light receiving circuit integrated in one element.

The opener apparatus may include at least one purging structure defining at least one defined purging gas flow within the opener apparatus. Preferably, at least one purging gas flow passes the substrate carriers at their vertical opened positions in the unstacked state, wherein the purging gas flow preferably is directed downwardly when it passes a respective substrate carrier. Preferably, any abrasion particles, which might be caused due to the interaction of mechanical parts within the opener in the course of the opening operation and the closing operation, would therewith be purged away from the vertically adjacent substrate held in the substrate seat of the respective substrate carrier being unstacked or already unstacked or to be restacked or being restacked.

Preferred Embodiments of the Present Invention further provide a clean room facility for at least one of storing, handling, furnishing, and processing of substrates defined by at least one of semiconductor wafers and reticles. The clean room facility includes at least one opener apparatus according to the preferred embodiments of the present invention discussed above, that accesses substrate seats of substrate carriers of substrate carrier stacks of a type which includes a plurality of substrate carriers arranged stacked in a vertical direction such that, for each pair of vertically adjacent substrate carriers of the substrate carrier stack, a respective lower substrate carrier supports a respective upper substrate carrier, wherein each substrate carrier includes an outer carrier frame which extends horizontally around an inner opening and defines, or is provided with, a substrate seat to accommodate and carry a plate-shaped substrate within an inner accommodation space of the substrate carrier stack.

The clean room facility may include at least one first robot arrangement, which is adapted and operable to load a respective substrate carrier stack into the opener apparatus (or a selected plurality of opener apparatuses) and is adapted and operable to unload a respective substrate carrier stack from the opener apparatus (or a selected plurality of opener apparatuses), and may include at least one second robot arrangement, which is adapted and operable to access at least one or a plurality of substrate seats of selected substrate carriers in the unstacked state, wherein the second robot arrangement is adapted and operable to unload a respective plate-shaped substrate from a respective substrate seat of a respectively selected substrate carrier being accessed and is adapted and operable to load a respective plate-shaped substrate on a respective substrate seat of a respectively selected substrate carrier being accessed. The first and second robot arrangement each are able to include one or a plurality of robot arms or the like which include a support or a gripper, to support or grip a respective substrate carrier stack to load and unload, or to support or grip a respective substrate to load and unload. Such robot arrangements that include robot arms are known in the art.

The first robot arrangement is able to be located between a stocker apparatus to store substrate carrier stacks and the opener apparatus and is able to transfer substrate carrier stacks between the stocker apparatus and the opener apparatus.

The second robot arrangement is able to be located between the opener apparatus and at least one transfer port and is able to transfer substrates between the opener apparatus and the transfer port or a respective device which is permanently connected to, or is temporarily docked to, the transfer port and achieves at least one of substrate processing, substrate treatment, substrate storage, and substrate transportation. For example, the second robot arrangement is able to transfer substrates between the opener and a Front Opening Unified Pod, FOUP, docked to the transfer port.

The at least one transfer port may be provided by a so-called Equipment Front End Module, EFEM, and the stocker apparatus and the EFEM is able to belong to the clean room facility.

In a case that at least one housing wall of the opener apparatus is provided with an array or matrix of venting openings, preferably a flow of clean air through the opener apparatus may be provided, which is able to originate from a zone of the clean room facility in which the stocker apparatus is located. However, it is preferred that the flow of clean air through the opener apparatus is directed in the opposite direction, towards the zone where the stocker apparatus is located. Preferably, this gives the advantage that any abrasion particles which might be caused by the operation of the opener apparatus and the handling with the individual substrates are purged away from the regions where substrates are accessible and substrates are handled individually without being shielded and protected within a substrate carrier stack in the closed condition.

Preferably, the clean room facility may include at least one first ionizer device which is associated with the first robot arrangement and/or at least one second ionizer device which is associated with the second robot arrangement, to eliminate or reduce static electricity, which could potentially be harmful to semiconductor wafers included in a respective substrate seat, or being handled, or to be handled. The clean room facility is also able to include supply and metering equipment to supply pressurized clean air to the at least one ionizer device.

Preferred embodiments of the present invention further provide a method for accessing one or a plurality of substrate seats of a respective substrate carrier of a substrate carrier stack which includes a plurality of substrate carriers stacked in a vertical direction such that, for each pair of vertically adjacent substrate carriers of the substrate carrier stack, a respective lower substrate carrier supports a respective upper substrate carrier, wherein each substrate carrier includes an outer carrier frame which extends in a horizontal frame plane around an inner zone including an inner opening and defines or is provided with a substrate seat to accommodate and carry a plate-shaped substrate within an inner accommodation space of the substrate carrier stack.

The method includes in a first phase to move the substrate carriers of the substrate carrier stack or the substrate carriers of a selected substrate carrier sub-group of the substrate carrier stack relatively with respect to each other along a vertical axis in an opening operation such that the substrate carriers are brought from a stacked state, in which all substrate carriers of the substrate carrier stack are stacked on each other and define the substrate carrier stack, to an unstacked state, in which the substrate carriers of the substrate carrier stack or the selected substrate carrier sub-group, respectively, are unstacked and positioned staggered with respect to each other along the vertical axis at defined vertical opened positions, with such vertical distances between vertically adjacent substrate carriers in the unstacked state that the substrate seats of all those substrate carriers are accessible from a horizontal direction for at least one of unloading at least one plate-shaped substrate from a respective substrate seat of a respectively selected substrate carrier and loading at least one plate-shaped substrate on a respective substrate seat of a respectively selected substrate carrier. The first phase of the method may include to vertically distance the respective lower substrate carrier from the respective upper substrate carrier of each respective pair of vertically adjacent substrate carriers of the substrate carrier stack or the selected substrate carrier sub-group, respectively, in the opening operation by moving the respective lower substrate carrier vertically downwardly.

The method includes in a second phase to access one or a plurality of the seats of the unstacked substrate carriers at their vertical opened positions for at least one of unloading at least one plate-shaped substrate from a respective substrate seat of a respectively selected substrate carrier and loading at least one plate-shaped substrate on a respective substrate seat of a respectively selected substrate carrier.

The method includes in a third phase to move the substrate carriers of the substrate carrier stack currently being in the unstacked state relatively with respect to each other along the vertical axis in a closing operation such that the substrate carriers are brought back to the stacked state in which all substrate carriers define the substrate carrier stack. The third phase of the method may include vertically moving the respective lower substrate carrier towards the respective upper substrate carrier of each respective pair of vertically adjacent substrate carriers of the vertically staggered substrate carriers in the closing operation by moving the respective lower substrate carrier vertically upwardly.

Preferably, the method is able to be performed by using the opener apparatuses according to preferred embodiments of the present invention discussed in the foregoing.

The opener apparatus may accommodate and open a substrate carriers stack of a favorable type, and the method for accessing one or a plurality of substrate seats of a respective substrate carrier of a substrate carrier stack may be applied to a substrate carrier stack of this favorable type, as defined in the following, namely a substrate carrier stack including a plurality of substrate carriers arranged stacked in a vertical direction such that, for each pair of vertically adjacent substrate carriers of the substrate carrier stack, a respective lower substrate carrier supports a respective upper substrate carrier, wherein each substrate carrier includes an outer carrier frame which extends in a horizontal frame plane around an inner zone including an inner opening and is provided with a substrate seat to accommodate and carry a plate-shaped substrate within an inner accommodation space of the substrate carrier stack, wherein the inner accommodation space or portions thereof are defined by the inner openings of the substrate carriers of the substrate carrier stack.

Each of the substrate carriers includes at its outer carrier frame at least one upper supporting formation and at least one lower supporting formation such that a lower substrate carrier of a respective pair of vertically adjacent substrate carriers of the substrate carrier stack supports with its at least one upper supporting formation the upper substrate carrier of this pair of vertically adjacent substrate carriers at its at least one lower supporting formation.

Each substrate carrier of the substrate carrier stack preferably further fulfills the following features:

the outer carrier frame includes a first frame web extending along a first frame web axis, a second frame web extending along a second frame web axis, a third frame web extending along a third frame web axis, and a fourth frame web extending along a fourth frame web axis, the first frame web axis intersects the fourth frame web axis at right angles at a first vertex associated with the first frame web and the fourth frame web and a first frame vertex region of the outer carrier frame at which the first frame web and the fourth frame web are integrally connected, the first frame web axis intersects the second frame web axis at right angles at a second vertex associated with the first frame web and the second frame web and a second frame vertex region of the outer carrier frame at which the first frame web and the second frame web are integrally connected, the third frame web axis intersects the fourth frame web axis at right angles at a fourth vertex associated with the third frame web and the fourth frame web and a fourth frame vertex region of the outer carrier frame at which the third frame web and the fourth frame web are integrally connected, the third frame web axis intersects the second frame web axis at a third vertex associated with the third frame web and the second frame web and a third frame vertex region of the outer carrier frame at which the third frame web and the second frame web are integrally connected.

The substrate carriers of the substrate carrier stack preferably each are able to be provided with a set of interfacing elements arranged at an outer circumference of the outer carrier frame, at which it is able to be individually and directly interacted with the respective substrate carrier without necessarily directly interacting with other substrate carriers of the substrate carrier stack. The interfacing elements may be projection elements which project from a neighborhood of the outer circumference of the respective outer carrier frame horizontally, such that the projection elements are able to be engaged from below to individually support a respective substrate carrier and relatively move the respective substrate carrier vertically with respect to at least one other substrate carrier positioned below the respective substrate carrier in the substrate carrier stack. These interfacing elements or projection elements of a respective substrate carrier may define the above-mentioned counter engagement formations which are engageable by associated engagement formations of the opener apparatus.

The arrangement is able to be such that each substrate carrier includes one pair of projection elements that project in a common horizontal direction and another pair of projection elements that project in an opposed common horizontal direction, wherein the projection elements are able to be provided at a respective of the frame vertex regions, preferably at a substantially planar outer vertex portion of the respective frame vertex region, or at a respective frame web close to a respective frame vertex region, such that the projection elements are arranged at the substrate carrier stack in four sets of vertically staggered projection elements. Correspondingly, the opener apparatus may include four sets of vertically staggered engagement formations, for example.

A first projection element may be provided at the first frame vertex region or at the fourth frame web near or adjacent to the first frame vertex region, and a fourth projection element may be provided at the fourth frame vertex region or at the fourth frame web near or adjacent to the fourth frame vertex region, the first and fourth projection elements project in the same horizontal direction, and a second projection element may be provided at the second frame vertex region or at the second frame web near or adjacent to the second frame vertex region, and a third projection element may be provided at the third frame vertex region or at the second frame web near or adjacent to the third frame vertex region, the second and third projection elements project in the same direction which is opposed to the horizontal direction in which the first and fourth projection elements project.

Alternatively, a first projection element may be provided at the first frame vertex region or at the first frame web near or adjacent to the first frame vertex region, and a second projection element may be provided at the second frame vertex region or at the first frame web near or adjacent to the second frame vertex region, the first and second projection elements project in the same horizontal direction, and a third projection element may be provided at the third frame vertex region or at the third frame web near or adjacent to the to the third frame vertex region, and a fourth projection element may be provided at the fourth frame vertex region or at the third frame web near or adjacent to the fourth frame vertex region, the third and fourth projection elements project in the same direction which is opposed to the horizontal direction in which the first and fourth projection elements project.

The first and fourth projection elements or the first and second projection elements may be projection elements of a first type and the second and third projection elements or the third and fourth projection elements may be projection elements of a second type, wherein a projection element of the first type and a projection element of the second type have different shapes and/or are positioned differently at, or relative to, the respective frame vertex region. The projection elements of the first and second type may define the above-mentioned counter engagement formations of the first and second type, which are engageable by a respectively associated engagement formation of the first type and the second type, respectively, of the opener apparatus.

For example, a projection element of the first type may be a projection element which is located near or adjacent to an outer transverse edge of the outer carrier frame, and a projection element of the second type may be a projection element which is located somewhat more inwardly with respect to the outer transverse edge of the outer carrier frame than a projection element of the first type. Of course, such projection elements may be associated differently to a first type and a second type of projection elements, so that a projection element of the second type may be a projection element which is located near or adjacent to the outer transverse edge of the outer carrier frame, and a projection element of a first type may be a projection element which is located somewhat more inwardly with respect to the outer transverse edge of the outer carrier frame than a projection element of the second type.

Preferably, the projection elements may be arranged at the substrate carrier stack in plural sets of vertically staggered projection elements, wherein the projection elements of a respective set are arranged such that vertically directly adjacent projection elements do not overlap vertically or do not completely overlap vertically.

The substrate carrier stack including the substrate carriers may be structured such that each substrate carrier of the substrate carrier stack includes at least one first positioning formation and at least one second positioning formation, wherein for each pair of vertically adjacent substrate carriers the at least one first positioning formation of the lower substrate carrier of this pair of vertically adjacent substrate carriers is engaged or engageable with the at least one second positioning formation of the upper substrate carrier of this pair of vertically adjacent substrate carriers, to safeguard or contribute to a proper relative positioning of the two substrate carriers of this pair of vertically adjacent substrate carriers.

Each substrate carrier of the substrate carrier stack of the favorable type is able to further fulfill one or plural of the following features:

a plurality of substrate holding arms that extend inwardly and upwardly from the outer carrier frame, overlap with the inner zone, and define the substrate seat, which is located at a distance above the vertical extent of the carrier frame and carries a plate-shaped substrate having a circular circumference and a diameter corresponding to a predetermined allowable diameter or within a predetermined allowable diameter range given by a predetermined allowable minimum diameter and a predetermined allowable maximum diameter;

at least one first arc-shaped portion of the partition webs that extends in a space between the fourth frame web and the inner opening defining at least one first auxiliary opening, at least one second arc-shaped portion of the partition webs that extends in a space between the second frame web and the inner opening defining at least one second auxiliary opening, the arc-shaped portions have a radius of curvature which is adapted to the predetermined diameter or predetermined diameter range.

Preferably, the substrate carrier stack may be structured such that the arc-shaped portions of the partition webs of the substrate carriers of the substrate carrier stack define the inner accommodation space of the substrate carrier stack at least in a direction parallel to a first horizontal axis of the stack of carriers which is parallel to the first and third web frame axes of the substrate carriers; wherein the first auxiliary openings and the second auxiliary openings of the inner zones of the substrate carriers of the substrate carrier stack define at least one first purging channel and at least one second purging channel of the substrate carrier stack which extend vertically parallel to the inner accommodation space at opposing sides thereof; and wherein the substrate carrier stack is provided with purging structures which enable horizontal purging flows within the substrate carrier stack through spaces between substrates held by the substrate seats of the substrate carriers. In order to allow a purging treatment of substrates held within the substrate carrier stack, a first of the cover and the base may include a first port which communicates with the first purging channel and a second of the cover and the base may include a second port which communicates with the second purging channel, so that purging gas is able to be supplied into the substrate carrier stack via one of the first port and the second port that defines a supply port and is able to be discharged from the substrate carrier stack via the other of the first port and the second port that defines a discharge port, to achieve a purging gas flow through the inner accommodation space via that first and second purging channels and purging passages of the purging structures.

The clean room facility referred to in the foregoing preferably may be provided with purging connectors to connect with a respective of the first port and the second port of a respective substrate carrier stack, to allow a purging treatment of substrates accommodated within the substrate carrier stack. Preferably, the stocker apparatus may include such sets of purging connectors, so that a respective substrate carrier stack stored within this stocker apparatus, e.g., positioned on a storing shelf or the like, may be connected with a purging gas supply line and the purging gas discharge line, so that substrates held within the substrate carrier stack may be subjected to a purging treatment.

The arrangement may be structured such that the base of a respective substrate carrier stack is provided with the supply port as well as with the discharge port, so that the connections with the associated purging gas supply line and the associated purging gas discharge line may be established automatically, when a respective substrate carrier stack is properly positioned at or in a storage location of the stocker apparatus. To this end, the storage location may include appropriate counter connectors, which are engageable with appropriate connectors that define the supply port and the discharge port provided at the bottom side of the base, by properly positioning the respective substrate carrier stack at or in the storage location. Suitable male and female connectors that establish sealed gas connections are well known in the art.

BRIEF DESCRIPTION OF THE DRAWINGS

FIG. 6 shows a substrate carrier stack including substrate carriers of a further preferred embodiment properly stacked on each other together with a base and a cover of the substrate carrier stack.

FIG. 19A is a side view of the movable interaction device.

FIG. 19B is sectional upward view of the movable interaction device according to section B-B in FIG. 19A.

FIG. 19C is a sectional side view of the movable interaction device according to section C-C in FIG. 19A.

FIG. 23A is a side view of the third side of the opener apparatus.

FIG. 23B is a close-up side view of the third side according to detail B in FIG. 23A.

FIG. 23C is a close-up side view of the third side according to detail C in FIG. 23A.

FIG. 23D is a side sectional view of the opener apparatus according to section D-D in FIG. 23A.

FIG. 23E is a side sectional view of the opener apparatus according to detail E in FIG. 23D.

FIG. 23F is a side sectional view of the opener apparatus according to detail F in FIG. 23D.

DETAILED DESCRIPTION OF THE PREFERRED EMBODIMENTS

FIGS. 1 to 5 illustrate substrate carriers and substrate carrier stacks. Such substrate carriers and substrate carrier stacks are able be provided to as a high-density replacement or augmentation to already existing systems and transfer mechanisms such as FOUPs, providing a higher storage density and improved and additional and enhanced abilities as aforementioned. The opener apparatuses of preferred embodiments of the present invention may be adapted to accommodate and open and close such types of substrate carrier stacks.

Figure 1:
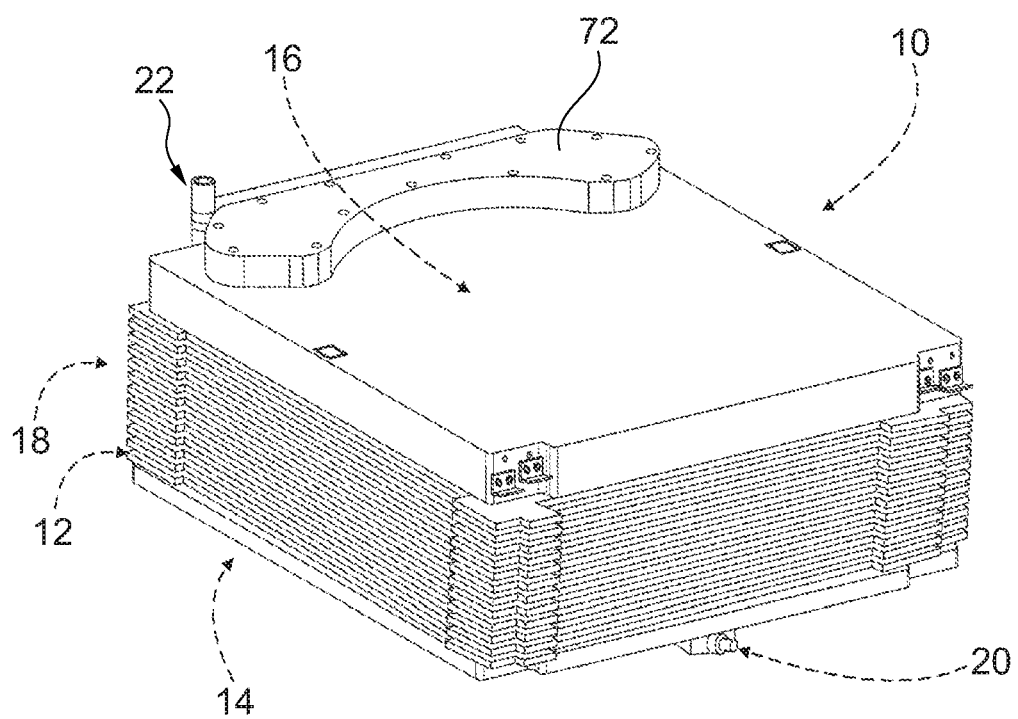
FIG. 1 is a perspective view of a first preferred embodiment of a substrate carrier stack, which includes a plurality of substrate carriers, a base, and a cover.

FIG. 1 is a perspective view of a first preferred embodiment of a substrate carrier stack 10 including a plurality of substrate carriers 12 stacked on each other, wherein the substrate carriers are stacked on a base 14 of the substrate carrier stack, and a cover 16 of the substrate carrier stack is stacked on the substrate carriers. The base 14 and the cover 16 may be included in the substrate carrier stack 10.

As shown in FIG. 1, the base 14 may include a gas connector 20 and the cover 16 may include a gas connector 22, which may be connected to a gas supply and a gas return, such that the gas is able to be introduced to the interior environment of substrates held by the substrate carriers 12 within the substrate carrier stack 10, such that the substrates interact with the gas or are treated by the gas. Alternatively, the base may include two such gas connectors defining a supply connector and a return connector, or the cover may include two such gas connectors defining a supply connector and a return connector. Alternatively, no such gas connectors may be provided at all.

Figure 2:
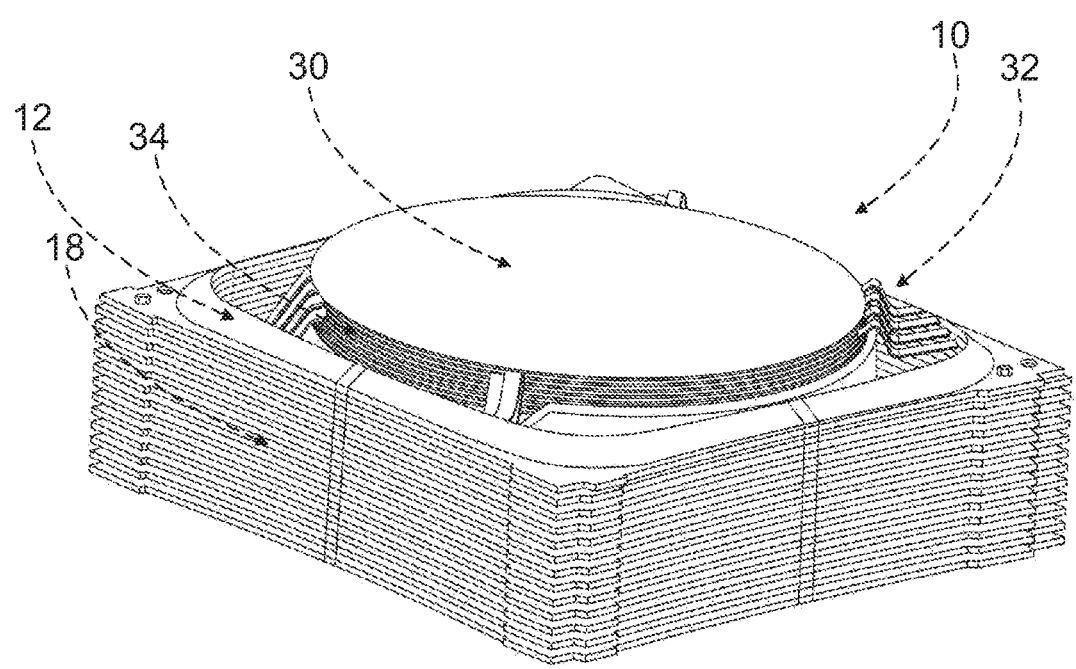
FIG. 2 is a perspective view of the substrate carrier stack according to FIG. 1, with substrates held by the substrate carriers, and with the base and the cover removed.

FIG. 2 is a perspective view of the stacked substrate carriers 18, i.e., the plurality of individual substrate carriers 12 stacked on each other, without the base and the cover 16. As shown in FIG. 2, each substrate carrier 12 is able to hold a respective substrate 30. To this end, the substrate carriers 12 each include a plurality of substrates holding arms 32 which commonly define a substrate seat of the respective substrate carrier. According to the present preferred embodiment, a respective substrate carrier 12 includes four substrate holding arms 32, for example.

The plurality 34 of the substrates 30 held by the substrate carriers 12 of the substrate carrier stack 10 are positioned at defined vertical positions, with defined vertical spaces between vertically adjacent substrates. Depending on the use scenario, it is possible that not all of the substrate carriers of the substrate carrier stack hold a respective substrate in their respective substrate seat. If all of the substrate carriers 12 of the substrate carrier stack 10 hold a respective substrate of the same kind, it is preferred that these substrates are positioned by the substrate seats at equidistant vertical positions.

Figure 3:
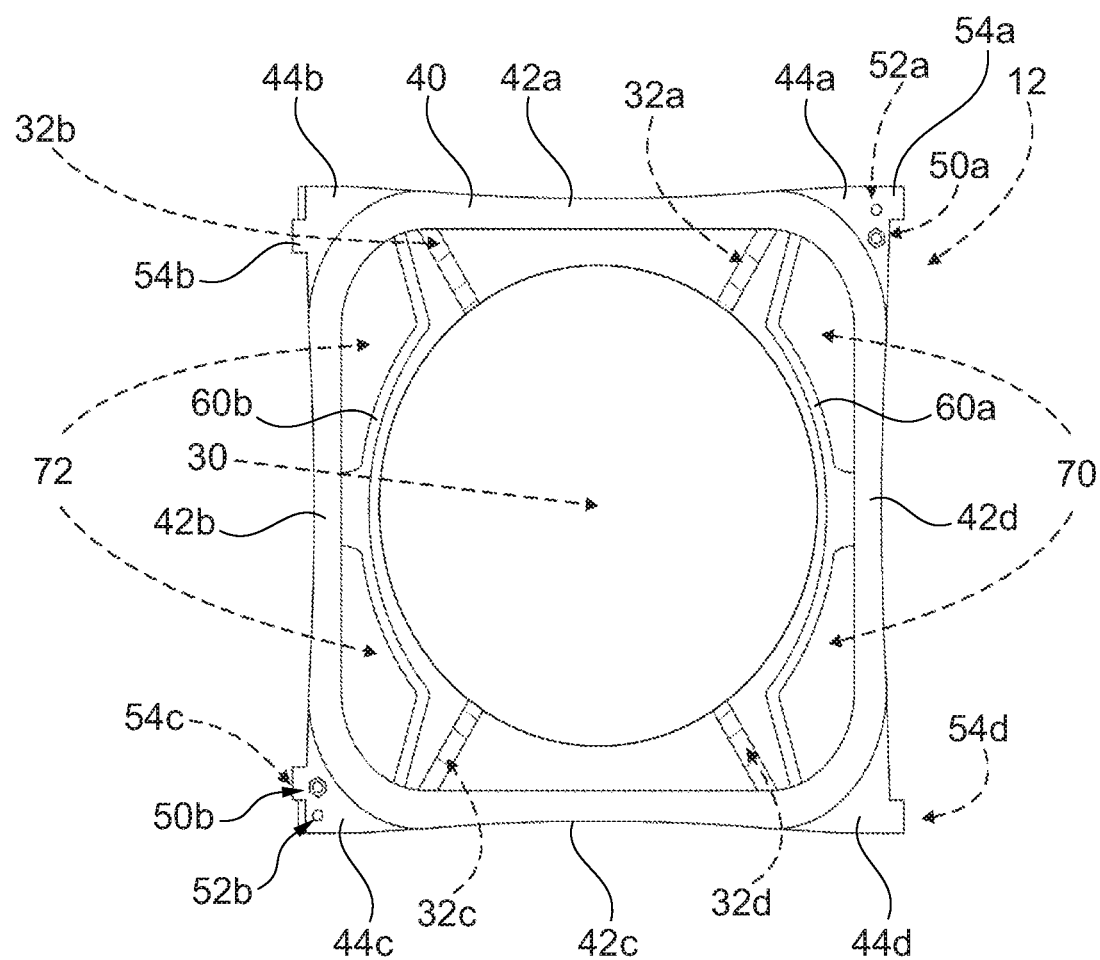
FIG. 3 is a top down view of a substrate carrier holding a substrate according to a second preferred embodiment which differs slightly from the substrate carriers of the first preferred embodiment as shown in FIGS. 1 and 2.
Figure 4:
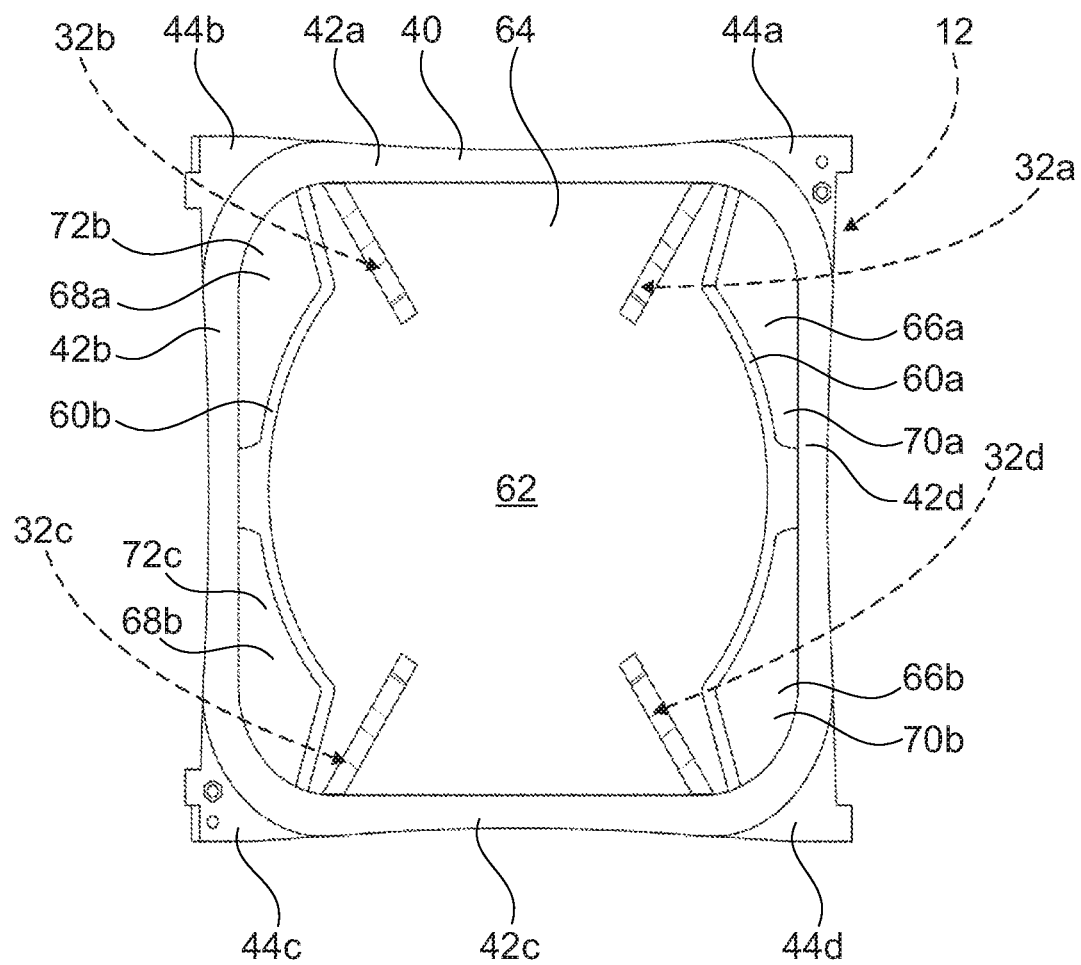
FIG. 4 is a top down view of the substrate carrier according to FIG. 3 without the substrate.

FIG. 3 is a top down view of a substrate carrier 12 of a second preferred embodiment holding a substrate 30. Since the substrate carriers of the second preferred embodiment differ only slightly from the substrate carriers 12 of the substrate carrier stack 10 according the first preferred embodiment shown in FIGS. 1 and 2, the same reference numbers are used for both preferred embodiments. FIG. 4 is a top down view of the substrate carrier of the second preferred embodiment without the substrate.

Similar to the substrate carrier 12 of the first preferred embodiment, the substrate carrier 12 of the second preferred embodiment includes an outer carrier frame 40, which includes four frame webs 42a, 42b, 42c, and 42d, which are integrally connected in pairs at a respective frame vertex region of the outer carrier frame. The four frame vertex regions of the outer carrier frame 40 are assigned the reference numbers 44a, 44b, 44c, and 44d. The outer carrier frame is of quadratic or rectangular shape or substantially quadratic or rectangular shape, as shown in FIGS. 3 and 4.

The substrate carrier 12 of the second preferred embodiment, like the substrate carrier 12 of the first preferred embodiment, includes four substrate holding arms 32 which are assigned the individual reference numbers 32a, 32b, 32c, and 32d, and define, with their respective free holding ends, the substrate seat for the substrate. The free holding end is also to be denoted as seat portion of the respective substrate holding arm. As shown in FIG. 4, the four substrate holding arms 32a, 32b, 32c, and 32d protrude inwardly from the outer carrier frame 40, in a direction towards a center of the substrate holder or substantially in a direction towards the center of the substrate holder.

As shown in the figures, the substrate carriers 12 are able to include protrusions 50a, 50b and recesses or openings 52a, 52b. A first pair of a protrusion 50a and an adjacent recess or opening 52a and a second pair of a protrusion 50b and an adjacent recess or opening 52b are arranged at diametrically opposing frame vertex regions 44a and 44c of the outer carrier frame 40. Each protrusion 50a, 50b is able to protrude into a corresponding respective opening or recess of the vertically adjacent above substrate carrier stacked on the respective substrate carrier, and into each opening or recess 52a, 52b a corresponding respective protrusion of the vertically adjacent below substrate carrier, on which the respective substrate carrier is stacked, is able to protrude. Here, upwardly protruding protrusions are assumed, for example, as shown in the figures. Alternatively, downwardly protruding protrusions are possible. In the case of downwardly protruding protrusions, each protrusion is able to protrude into a corresponding respective opening or recess of the vertically adjacent below substrate carrier, on which the respective substrate carrier is stacked, and into each opening or recess a corresponding respective protrusion of the vertically adjacent above substrate carrier stacked on the respective substrate carrier is able to protrude. A combination of upwardly and downwardly protruding protrusions is also possible.

Figure 8:
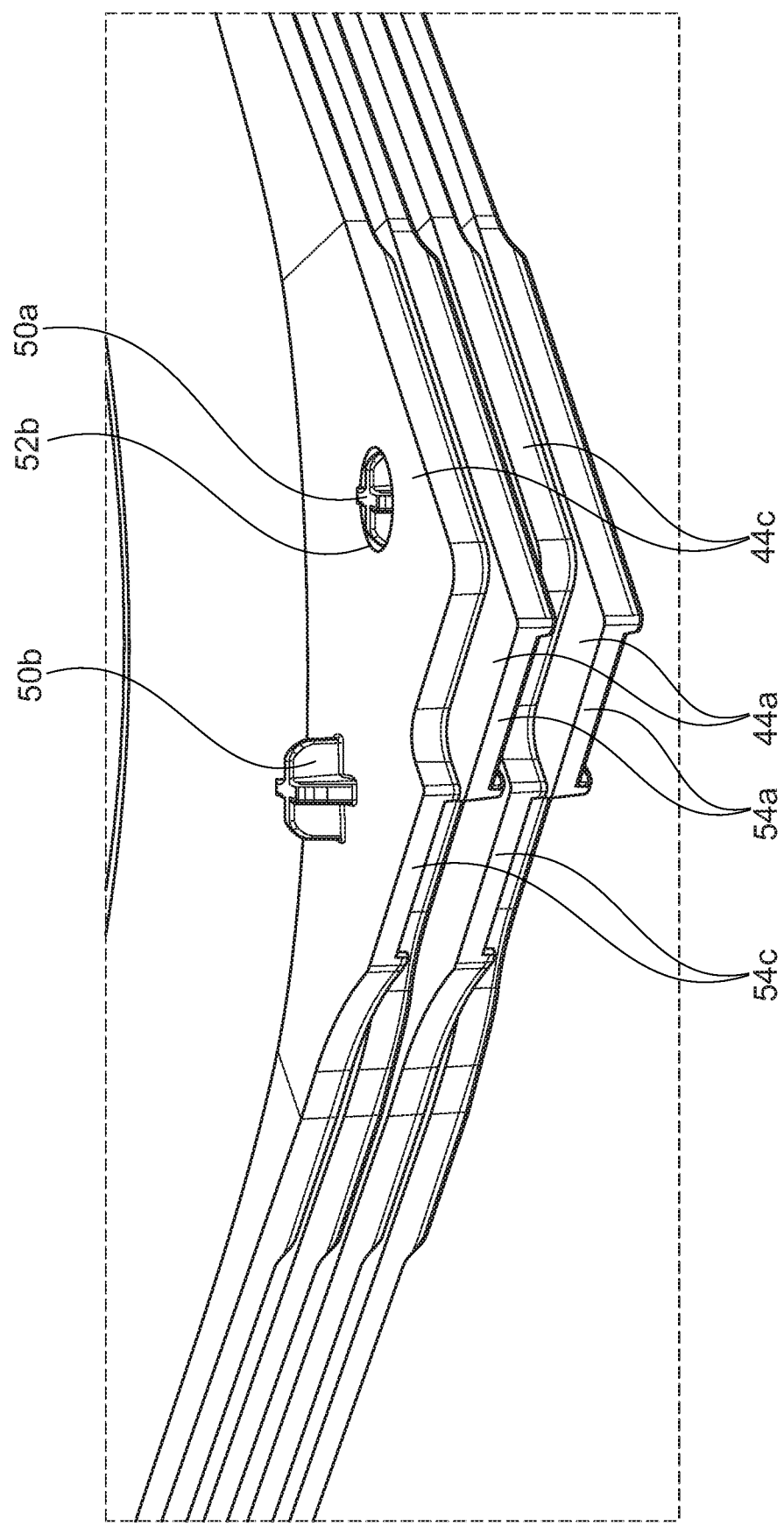
FIG. 8 is a perspective view of vertex regions of four substrate carriers of the substrate carrier stack of FIG. 6 properly stacked on each other, with mutually engaged positioning formations that attain and maintain a proper relative positioning of the substrate carriers within the substrate carrier stack.

The arrangement of the protrusions 50a, 50b and the recesses or openings 52a, 52b shown in FIGS. 3 and 4 is such that, in a substrate carrier stack including identical substrate carriers stacked on each other, the protrusions of all of the substrate carriers are vertically aligned and the recesses or openings of all of the substrate carriers are vertically aligned, so that no protrusion is able to engage with an associated recess or opening of the vertically adjacent below or above substrate carrier. This applies also in a case that the substrate carriers are stacked on each other in alternating relative rotational positions corresponding to rotations by 180 degrees about a vertical rotation axis, so that alternatingly the frame vertex regions 44a and 44c are located above each other at diametrically opposing vertical edge regions of the substrate carrier stack. Therefore, at least two subtypes of substrate carries are preferably needed, namely the substrate carrier 12 of a first subtype as shown in FIGS. 3 and 4 and a substrate carrier of a second subtype being basically identical but having the positions of the respective protrusion and the respective recess or opening at the respective vertex region interchanged, so that a mutual engagement between vertically next adjacent substrate carriers similar to what is shown in FIG. 8 for another preferred embodiment is able to be achieved.

The substrate carriers 12, 12' according to the two subtypes include, at an outer circumference of the outer carrier frame 40 with particular formations, in the present case, projections 54a, 54b, 54c, and 54d, which project in a sideward or horizontal direction and enable an interaction device or mechanism, e.g., a handling, supporting, or movement device or mechanism to interact with a respective substrate carrier in a substrate carrier stack.

In the present case, there are four such interfacing projections 54a, 54b, 54c, and 54d, which are located respectively at the frame vertex regions 44a, 44b, 44c, and 44d. A first type of these projections, namely the projections 54a and 54d, are located at the frame vertex regions 44a and 44d and project in a sideward direction with respect to frame web 42d, and a second type of these projections, namely the projections 54b and 54c, are located at the frame vertex regions 44b and 44c and project in a sideward direction with respect to frame web 42b, so that the projections of the first type and the projections of the second type project in opposing directions from the outer carrier frame 40.

The projections 54b and 54c of the second type are located somewhat more inwardly at the respective frame vertex region along a frame web axis which is able to be assigned to the frame web 42b than the projections 54a and 54d of the first type located at the respective frame vertex region along a frame web axis which is able to be assigned to the frame web 42d. This allows stacking of the substrate carriers 12 according to the two sub-types alternatingly on each other to achieve horizontally staggered interfacing projections, similar to what is shown in FIGS. 5, 6, 7A, 7B, and 8. To this end, the substrate carriers of the two sub-types are stacked on each other in relatively rotated relative positions on basis of rotations of 180° about a vertical axis, so that alternatingly interfacing projections of the first type and interfacing projections of the second type protrude in the sideward direction from the substrate carrier stack and do not overlap or overlap only slightly in a vertical direction. This is favorable to simplify the engagement of engagement formations of an interaction device or mechanism as mentioned with a respective of the substrate carriers of the substrate carrier stack.

It should be noted, that the substrate carriers 12 of the substrate carrier stack 10 shown in FIGS. 1 and 2 include different kinds of interfacing projections which protrude in sideward or horizontal direction from the outer carrier frame of the respective substrate carrier. According to the preferred embodiment shown in FIGS. 1 and 2, interfacing projections of a respective identical type projecting from a respective frame web or respective frame vertex regions of the respective substrate carriers overlap completely in a vertical direction. Preferably, it is able to be assumed that this is the only relevant difference between the preferred embodiment of FIGS. 1 and 2 and the preferred embodiments shown in FIGS. 3, 4, and 5.

The substrate carriers of the preferred embodiments of the present invention discussed above are provided with partition webs 60a and 60b, which divide an inner zone 62 of the respective substrate carrier 12 into multiple openings. The outer carrier frame 40 extends around the inner zone, and the partition web 60a and 60b extend between the frame webs 42a and 42c and are integrally connected with these frame webs 42a and 42c such that a large inner opening 64 and two pairs of smaller inner openings 66a, 66b and 68a, 68b are defined. The large inner opening 64 is located between a first pair of smaller inner openings 66a, 66b, which extend between the frame web 42d and the partition web 60a, and a second pair of smaller inner openings 68a, 68b, which extend between the frame web 42b and the partition web 60b. For example, the smaller inner openings have identical or corresponding symmetric shapes, as shown in the figures. Preferably, for stability reasons, the partition webs 60a and 60b are integrally connected at a medial region with the respective adjacent frame web 42d and 42b, respectively, so that a respective pair of smaller inner openings is obtained. Instead, a respective larger inner opening on both sides of the lager inner opening 64 may be provided, if no such integral connection with the adjacent frame web at the medial region of the respective partition web is included.

The large inner openings 64 of the substrate carriers 12 define an inner accommodation space of a substrate carrier stack including the substrate carriers 12. In this inner accommodation space, the substrates or semiconductor wafers are held by a respective of the substrate carriers, as shown in FIG. 2. The substrates or wafers are held in an inner region of the inner accommodation space which is delimited in opposing sideward directions by a respective arc-shaped portion of the partition webs 60a and 60b of the substrate carriers 12 of the substrate carrier stack. As shown in FIG. 3, the arc-shaped portions of the partition webs have a radius of curvature adapted to the diameter of the substrate or wafer, so that the arc-shaped portions extend in the top down view of FIG. 3 with a small defined radial distance along a portion of the outer circumference of the substrate or wafer. This distance is able to be substantially smaller than as indicated in this figure.

The smaller inner openings 66a, 66b and 68a, 68b of the substrate carriers define purge gas distribution channels or purging channels 70 and 72 of the substrate carrier stack, as shown in FIG. 3. Channel 70 may include a pair of channels 70a and 70b corresponding to the smaller inner openings 66a, 66b, and channel 72 may include a pair of channels 72a and 72b corresponding to the smaller inner openings 68a, 68b, as shown in FIG. 4A. One of the distribution channels 70 and 72 (e.g., pairs of channels 70a, 70b and 72a, 72b) is able to define and function as a supply channel (or as a pair of supply channels) and the other is able to define and function as a removal or collector channel (or as a pair of removal or collector channels).

As shown, in FIGS. 3 and 4 for example, these channels or pairs of channels are arranged diagonally opposite or in opposing sideward directions, such that the substrates or wafers are arranged there between in the substrate carrier stack.

In particular, and with reference to FIG. 1, each of the channels or pairs of channels is able to be connected in the substrate carrier stack with respective nozzles or connectors of the substrate carrier stack, so that the substrates held by the substrate carriers are able to be submitted to a purging treatment as discussed above. The purging gas is passed to the substrates via one of the channels or pairs of channels so that the purging gas passes between adjacent substrates held within the substrate carrier stack by a respective substrate carrier, and is collected by the other of the channels or pairs of channels after having passed between the substrates.

Figure 5:
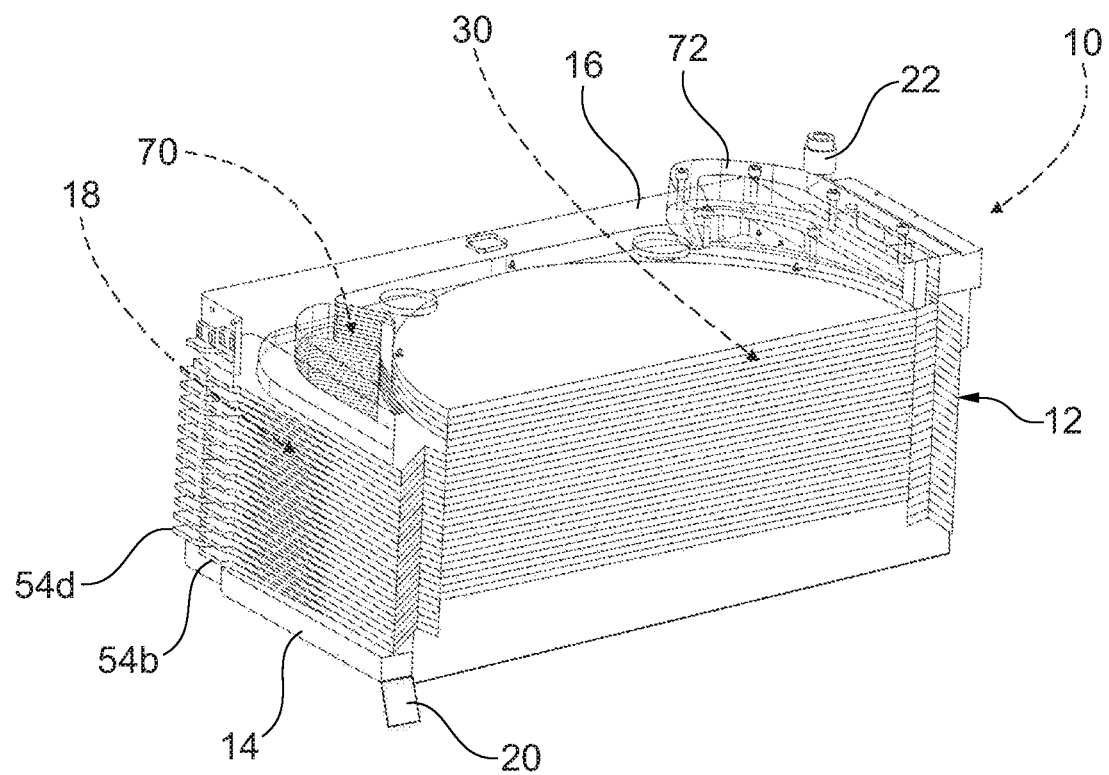
FIG. 5 is a cross-sectional perspective view of a substrate carrier stack including a cover and a base according to a further preferred embodiment similar to the second preferred embodiment.

FIG. 5 is a cross-sectional perspective view of a further preferred embodiment of a substrate carrier stack including multiple substrate carriers. However, one is able to assume that the substrate carriers are basically identical or very similar to respective substrate carriers 12 of the first and second subtypes shown in figures discussed above, and the same applies to the base 14 and the cover 16.

A further preferred embodiment of a substrate carrier stack and substrate carriers thereof is shown in FIGS. 6, 7A, 7B, and 8. Concerning the substrate carriers 12, which are able to be provided in two sub-types as explained in the foregoing, it is able to be assumed that the substrate carriers correspond more or less identically to the two sub-types of substrate carriers described in the foregoing with reference to FIG. 3 and FIG. 4. However, the cover 16 and the base 14 are designed somewhat differently from the cover and the base shown in FIGS. 1 and 5.

Alternatively, only one type of substrate carriers, without any sub-types, may be provided, which basically is able to correspond to the substrate carrier according FIG. 3, but include the positions of the respective protrusion and the respective recess or opening at one of the two diametrically opposed vertex regions interchanged, so that a mutual engagement between vertically next adjacent substrate carriers, as shown in FIG. 8, is able to be achieved on basis of only one type of substrate carriers. This is assumed in the following further description.

Accordingly, diametrically opposing frame vertex regions, namely, e.g., the first frame vertex region 44a and the third frame vertex region 44c, are provided with positioning formations, namely positioning protrusions and positioning recesses or positioning openings. In the present preferred embodiment, the first frame vertex region 44a is provided with a pair of a protrusion 50a and an opening or recess 52a, and the third frame vertex region 44c is provided with a pair of a protrusion 50b and a recess or an opening 52b, as shown in FIG. 8. These positioning formations safeguard a proper relative positioning of vertically adjacent substrate carriers 12 within the substrate carrier stack 10, including a relative positioning such that adjacent substrate carriers in the substrate carrier stack have been rotated by 180° about a vertical axis of rotation.

FIG. 8 shows the frame vertex portions 44a and 44c of a plurality of substrate carriers 12, which are properly stacked on each other. In particular, the mutual engagement of the protrusion 50a of a respective lower substrate carrier with the opening 42b of an upper substrate carrier is shown as well as a transversely staggered arrangement of the interfacing projections 54a and 54c of adjacent substrate carriers within the substrate carrier stack. This enables a simplified interaction of external interfacing devices, such as movement devices with respective ones of the substrate carriers, since there is a relatively large vertical gap between vertically aligned interfacing projections, namely between vertically adjacent interfacing projections 54a as well as between vertically adjacent interfacing projections 54c.

Figure 7A:
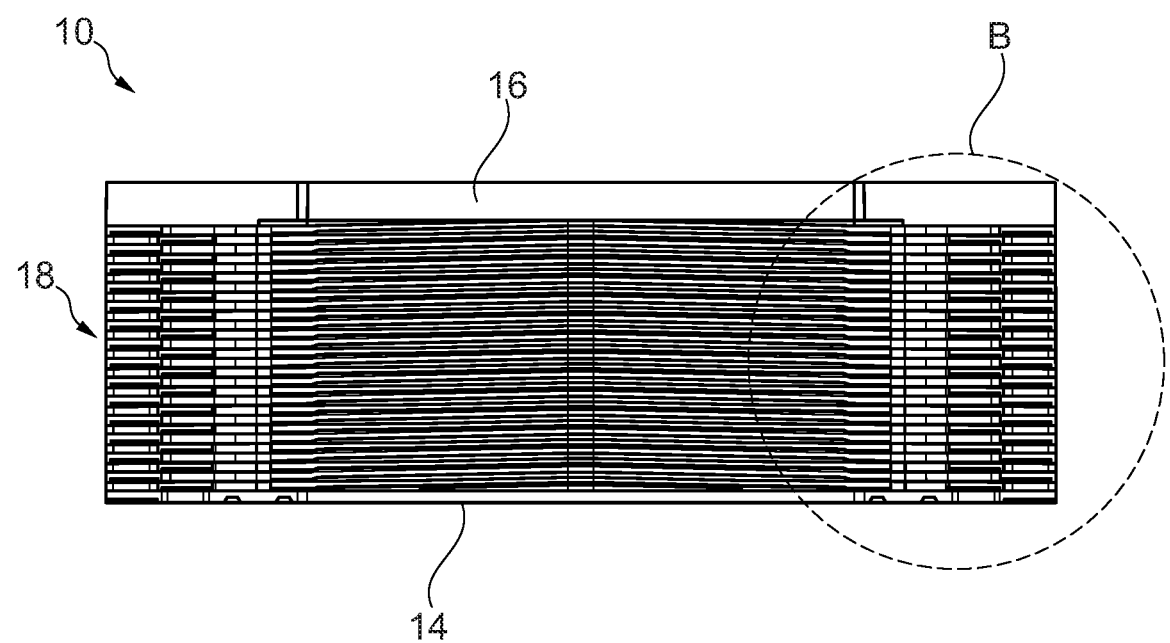
FIG. 7A is a side view of the substrate carrier stack of FIG. 6.
Figure 7B:
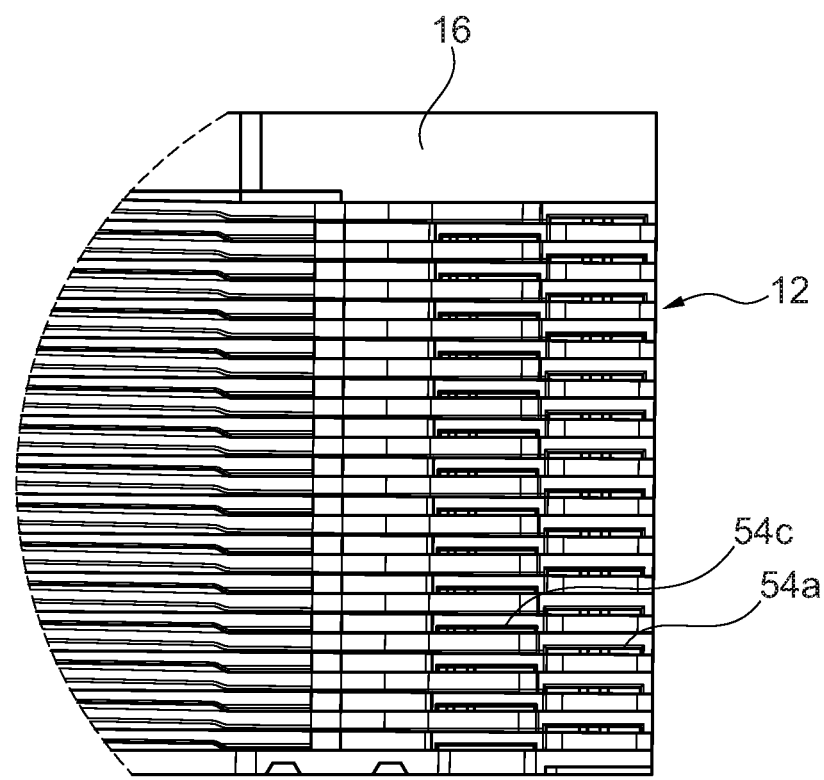
FIG. 7B is a close-up side view of interfacing elements defined by projection elements of the substrate carriers according to detail B in FIG. 7A.

FIGS. 6, 7A, and 7B show an example for such a substrate carrier stack 10. In the present example, well over twenty five substrate carriers 12, e.g., twenty seven or twenty eight substrate carriers 12 are stacked on each other, with the lowermost substrate carrier 12 being stacked on a base 14, and a cover 16 being stacked on the uppermost substrate carrier 12. As seen from the transversely staggered interfacing projections 54a and 54c, and the transversely staggered interfacing projections 54b and 54d, the substrate carriers 12 are stacked in the explained manner relatively rotated with respect to each other about a vertical axis by 180°, which is safeguarded by the explained positioning formations, in the present case, the protrusions 50a, 50b and the openings or recesses 52a, 52b. As shown, a high stacking density and a high storage density for substrates held within the substrate carrier stack 10 in the seats of the substrate carriers 12 is obtained. In principle, such substrate carrier stack may include any number of substrate carriers, for example, many more substrate carriers than as shown in the non-limiting examples illustrated in the figures. An even number of substrate carriers or alternatively an uneven number of substrate carriers are able to be provided in such a substrate carrier stack.

According to the perspective view of FIG. 6 and the side views of FIGS. 7A and 7B, the base 14 and the cover 16 are able to be provided as a base plate and a cover plate. Preferably, the cover plate may be provided, at its lower side, a suitable recess that accommodates the substrate holding arms of the uppermost substrate carriers and the substrates held thereby.

Alternatively, the base 14 and the cover 16 are able to be provided with structures that enable a purging treatment of the substrates 30 held within the substrate carrier stack 10, as is the case for the preferred embodiments shown in FIG. 1 and FIG. 5.

Concerning all types of substrate carriers stacks and substrate carriers as described in the foregoing as well as concerning other types of substrate carriers stacks and substrate carriers, the substrate seats of a respective substrate carrier included in a substrate carrier stack is able to be accessed to load a substrate into the seat or unload a substrate from the seat by appropriate loader after a respective vertical loading and unloading gap is opened between the substrate carrier including the substrate seat to be accessed and the substrate carrier stacked onto this substrate carrier or—if provided—between the substrate carrier including the substrate seat to be accessed and the cover stacked onto this substrate carrier. To this end, the preferred embodiments of the present invention provide favorable opener apparatuses, for which exemplary, non-limiting preferred embodiments are described in the following. One or a plurality of such opener apparatuses 100, which are briefly also denoted as "opener", are able to be included in a clean room facility 80 which is able to be used in a semiconductor fabrication plant.

Figure 9A:
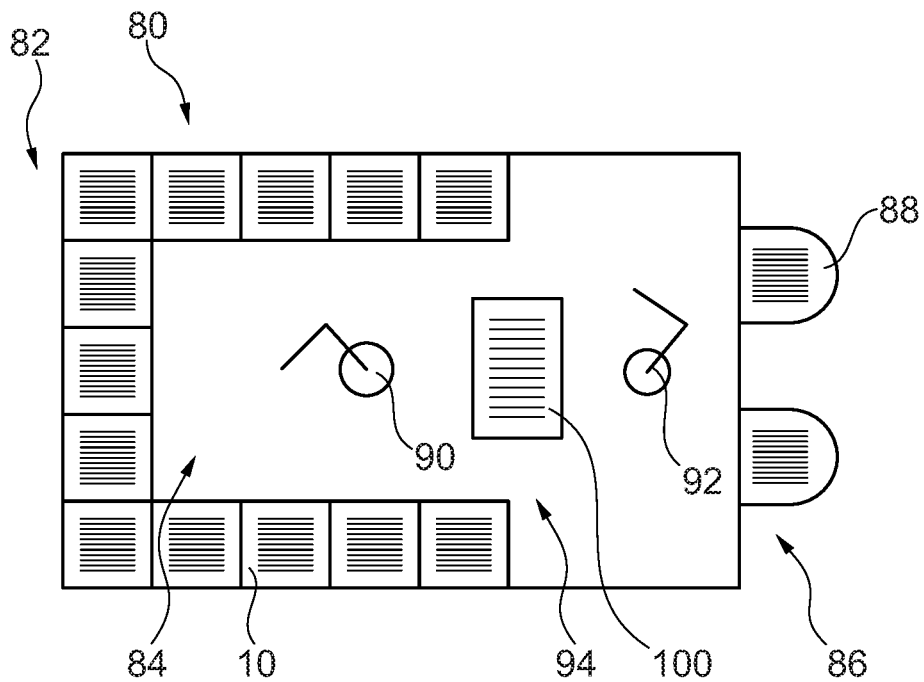
FIG. 9A illustrates schematically a clean room facility including a stocker arrangement to store substrate carrier stacks, at least one Equipment Front End Module, EFEM, including a least one load or connection port, and one opener apparatus associated with the stocker arrangement and the EFEM.

An illustrative preferred embodiment of a clean room facility 80 as shown in FIG. 9A includes a stocker arrangement 82 including a storage chamber 84 that accommodates and stores substrate carrier stacks 10, e.g., substrate carrier stacks of the types described in the foregoing, on storage shelves or other supporting or holding equipment, a first robot arrangement 90 that transfers a selected substrate carrier stack 10 to an opener station 94, which includes an opener apparatus 100 according to preferred embodiments of the present invention, and returns a respective substrate carrier stack 10 from the opener station 94 back to the storage chamber 84.

The opener station 94 and the opener apparatus 100 included therein open the respective substrate carrier stack 10 by bringing the substrate carriers or a selected sub-group of substrate carriers of the substrate carrier stack from a stacked state to an unstacked state, so that the substrate seats of the substrate carriers are able to be accessed. The opener apparatus 100 also closes the respective substrate carrier stack by bringing the substrate carriers or the selected sub-group of substrate carriers of the substrate carrier stack 10 from the unstacked state back to the stacked state.

A second robot arrangement 92 accesses the substrate seats of the substrate carriers in the unstacked state, to unload a respective individual substrate (e.g., a semiconductor wafer) from the substrate seat of a selected substrate carrier and transfer it to a port of an Equipment Front End Module (EFEM) 86 and, for example, into a Front Opening Unified Pod (FOUP) 88 docked to the port of the EFEM 86. The second robot arrangement 92 also transfers a respective individual substrate (e.g., a semiconductor wafer) from a port of the EFEM 86 or a FOUP 88 docked to the port to the opener apparatus 100 to load the substrate into the substrate seat of a selected substrate carrier of the substrate carrier stack 10 in the unstacked state. The EFEM 86 may include a plurality of such ports, e.g., two such ports, as shown in FIG. 9A.

Figure 9B:
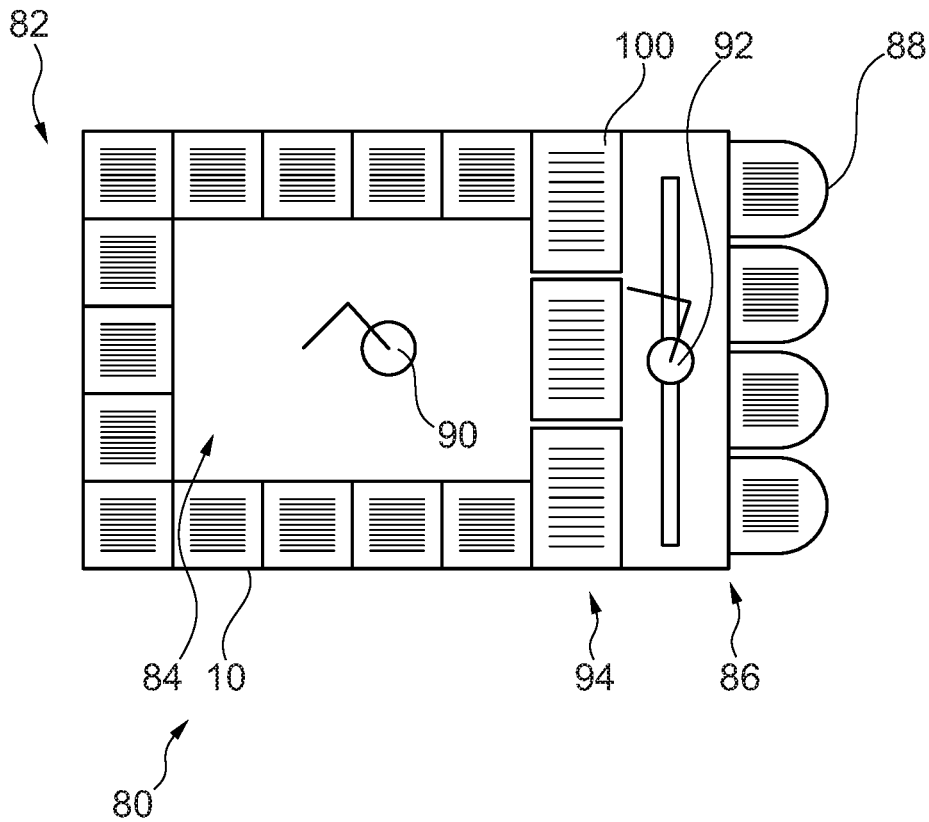
FIG. 9B illustrates schematically a clean room facility of the kind shown in FIG. 9A, including a plurality of opener apparatuses associated with the stocker arrangement and the EFEM.

The clean room facility 80 shown in FIG. 9B corresponds to the clean room facility shown in FIG. 9A, with the exceptions that the clean room facility 80 shown in FIG. 9B includes a plurality of opener apparatuses 100, namely three opener apparatuses 100 in FIG. 9B which are located side by side in the opener station 94, includes an EFEM 86 that includes more ports to dock FOUPs 88 or other equipment and devices, and includes another type of second robot arrangement 92 which is able to serve all these ports, in the present case four such ports, and all three opener apparatuses 100.

Figure 26:
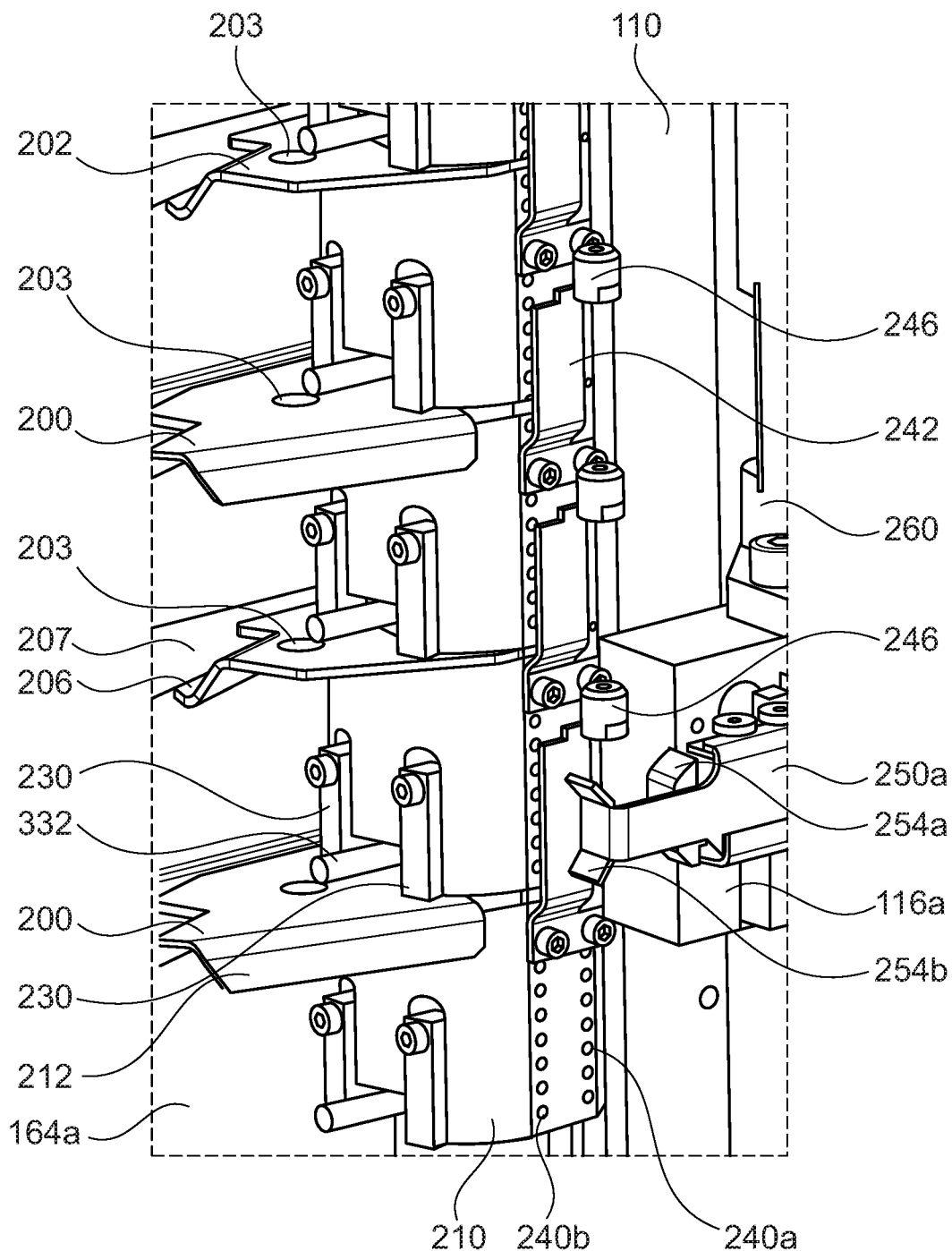
FIG. 26 shows in a partial side view details of a variant of the opener apparatus with respect to the monitoring of its engagement formations of the first and second types.
Figure 27:
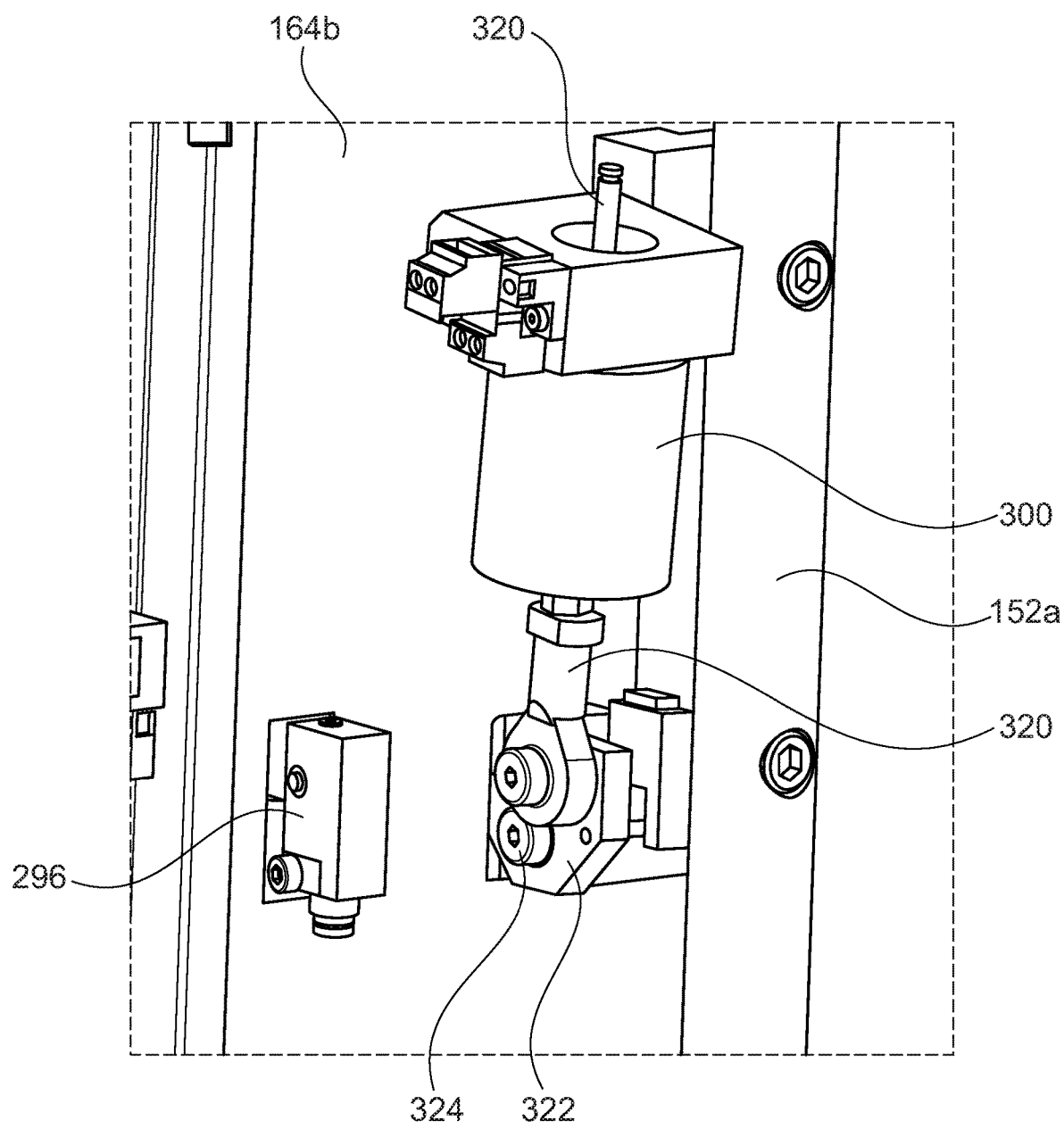
FIG. 27 is a partial side view of further details of a preferred embodiment of the opener apparatus, including an actuator to actuate a holding element that holds a substrate carrier stack in an upper loading position within the opener apparatus and a sensor that senses the presence of a substrate carrier stack in the upper loading position.
Figure 28:
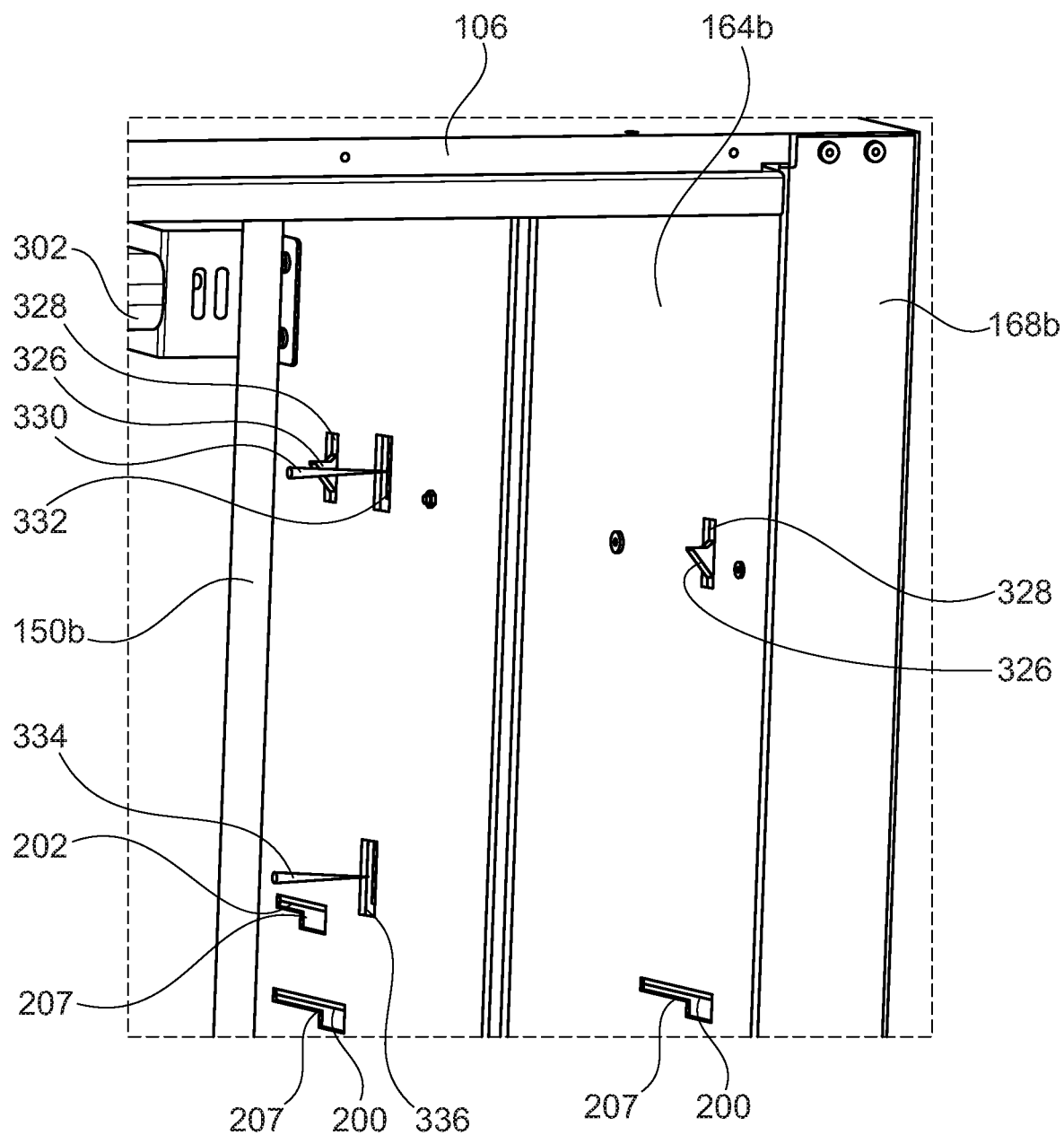
FIG. 28 is a partial view of an inner side of the opener apparatus showing the holding element and a further holding element according to FIG. 27, which assume a holding position.
Figure 34:
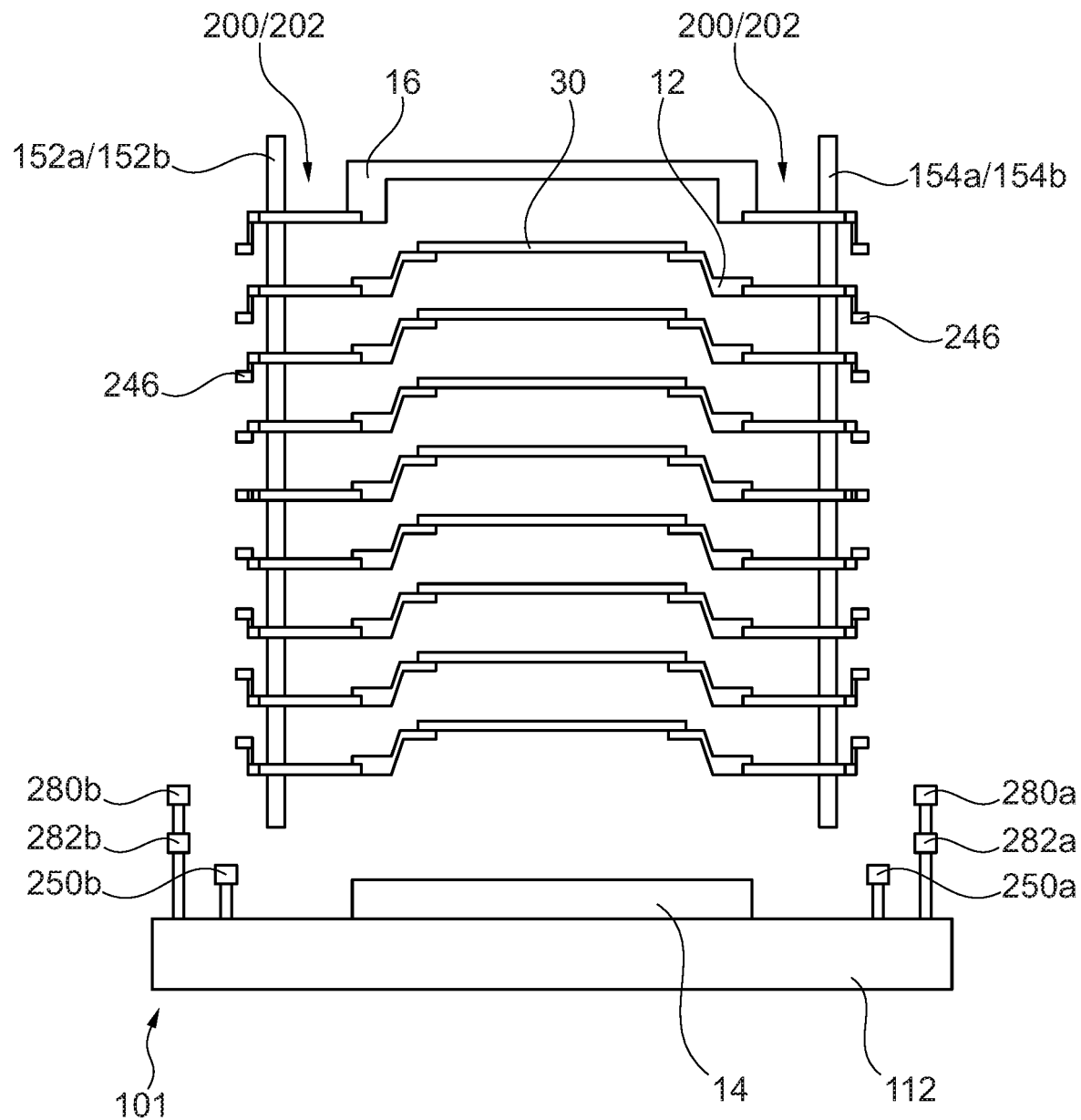
FIG. 34 schematically illustrates a variant of the opener apparatus according to FIGS. 29A and 29B, and shows a substrate carrier stack including a cover and a base in the unstacked state.
Figure 35:
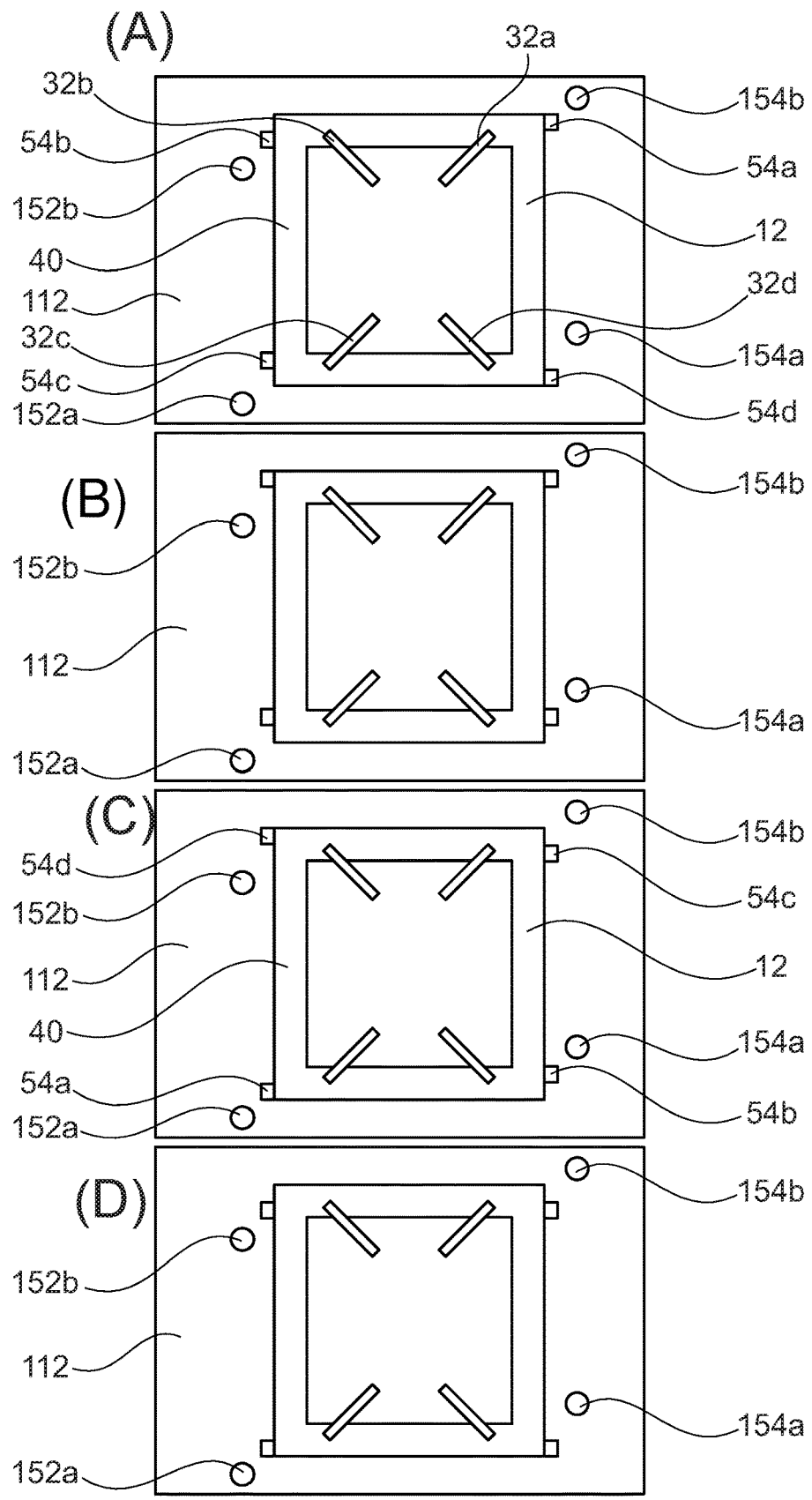
FIG. 35 schematically illustrates the uppermost substrate carrier of a substrate carrier stack positioned on the carriage of an opener apparatus according to different variants of the substrate carriers, to indicate associated variants of the opener apparatus.
Figure 36:
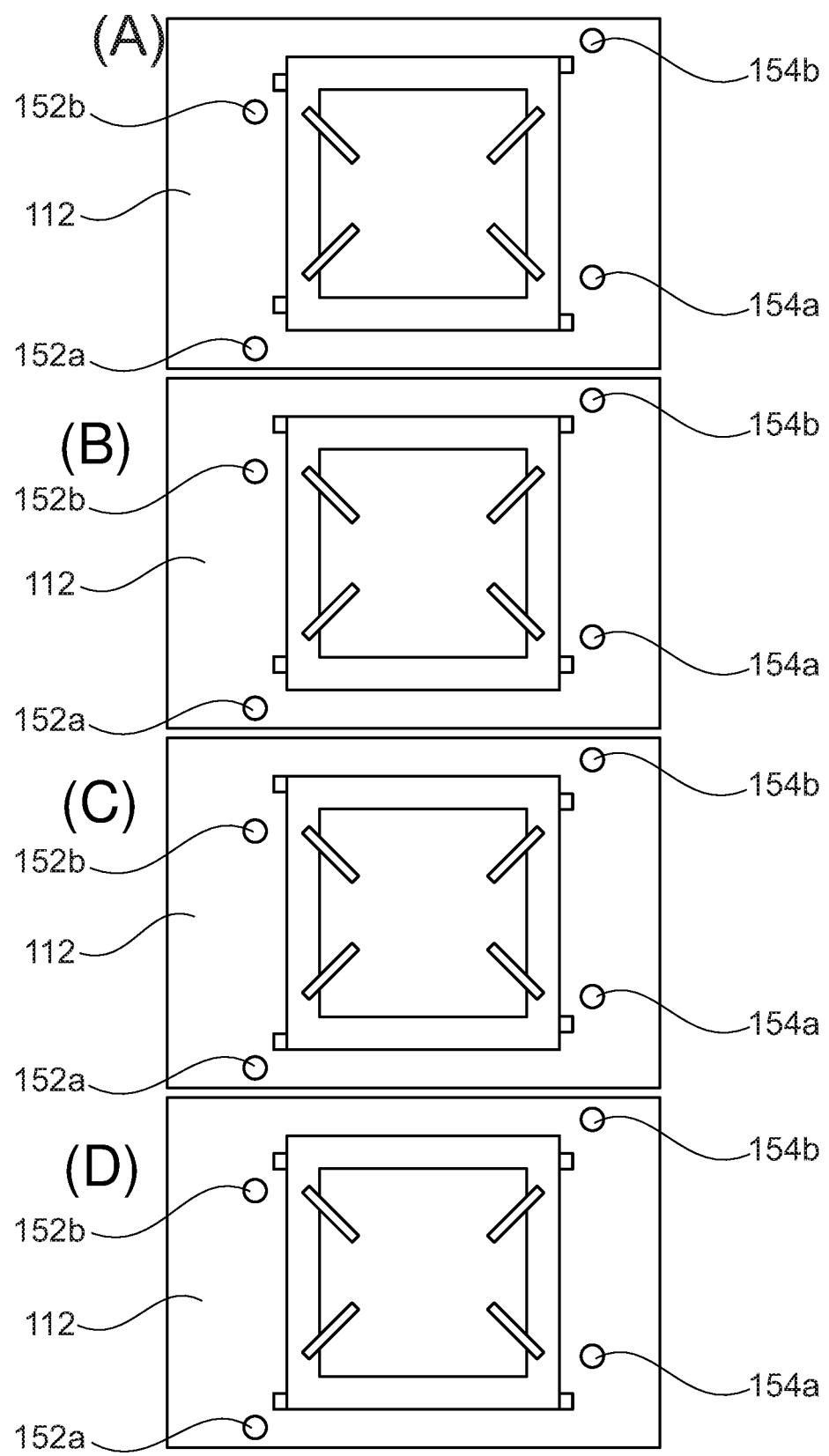
FIG. 36 schematically illustrates the uppermost substrate carrier of a substrate carrier stack positioned on the carriage of an opener apparatus according to further different variants of the substrate carriers, to indicate associated variants the opener apparatus.

A suitable exemplary preferred embodiment of an opener apparatus 100 according to the present invention, which may be used as an opener apparatus 100 in the opener station 94 of a clean room facility 80 of the type as shown in FIGS. 9A and 9B, is shown in various views in FIGS. 10 through 23J and in FIGS. 27 and 28. FIGS. 24A, 24B, 25, and 26 illustrate variants thereof and illustrate operations. Further, FIGS. 29A, 29B, 30A, 30B, 30C, 31 through 34, and 37 illustrate the general functionality of an opener apparatus according to preferred embodiments of the present invention and illustrate certain features, for example, that show how an opener apparatus and variants thereof are able to be realized. The opener apparatus may be adapted to operate on various types of substrate carrier stacks and substrate carriers, for example, as schematically illustrated in FIGS. 35 and 36.

In this description, the opener apparatus is able to be referred to as a "new opener" or an "opener," the substrate carriers (e.g. substrate carriers 12 as described in the foregoing) are able to be referred to as "carriers," and a substrate carrier stack (e.g. a substrate carrier stack 10 as described in the foregoing) is able to be referred to as a "stack of carriers," or a "stack".

First, a general overview of the described preferred embodiment of the opener apparatus 100 and the construction and functionality of the opener apparatus 100 is given, which is followed by a more detailed description.

The new opener works differently from a prior art solution, for example, in that the new opener includes a new kind of movement mechanism 101 that effects relative movements between the carriers of a respective stack of carriers. The movement mechanism 101 allows a stack of carriers to move from the top of the opener downwards, and about every 5 cm, holding arms or other appropriate engagement formations belonging to the movement mechanism are inserted in the way of the stack of carriers, to catch and support the respective top carrier of the stack and hold it at the vertical height which it has reached. The same is true for a cover element or the cover of the respective substrate carrier stack, if such a cover element or cover is provided. Accordingly, a staggered arrangement of carriers is obtained with a mutual distance of, e.g., about 5 cm between adjacent carriers. Thus, the whole stack including, e.g., twenty five or more carriers is opened with respect to all carriers, so that all twenty five carriers and respective substrates or wafers held within the seat of a respective carrier are accessible to a handling robot or the like at the same time, without additional opening steps.

To achieve this, the stack of carriers, which is supported on a support or carriage 112 of the opener, as shown in FIGS. 10 through 13 for example, is moved by, e.g., a belt drive arrangement 130a, 130b from top down in the negative Z-axis direction, i.e., downwards. The carriage is able to stop shortly at the catching position for each carrier, and then preferably two opposing holding arms on both sides in the transverse direction (i.e., preferably altogether four holding arms) are moved, preferably pivoted from a respective current release position into a respective catching position, to catch and support exactly the respective top carrier of the current stack of carriers. The holding arms are able to be moved or pivoted through associated slots of an opener housing wall to reach their catching positions. One set of altogether four vertically staggered sets of holding arms is shown in FIG. 15A, and FIGS. 15B through 15E show details thereof.

Figure 12:
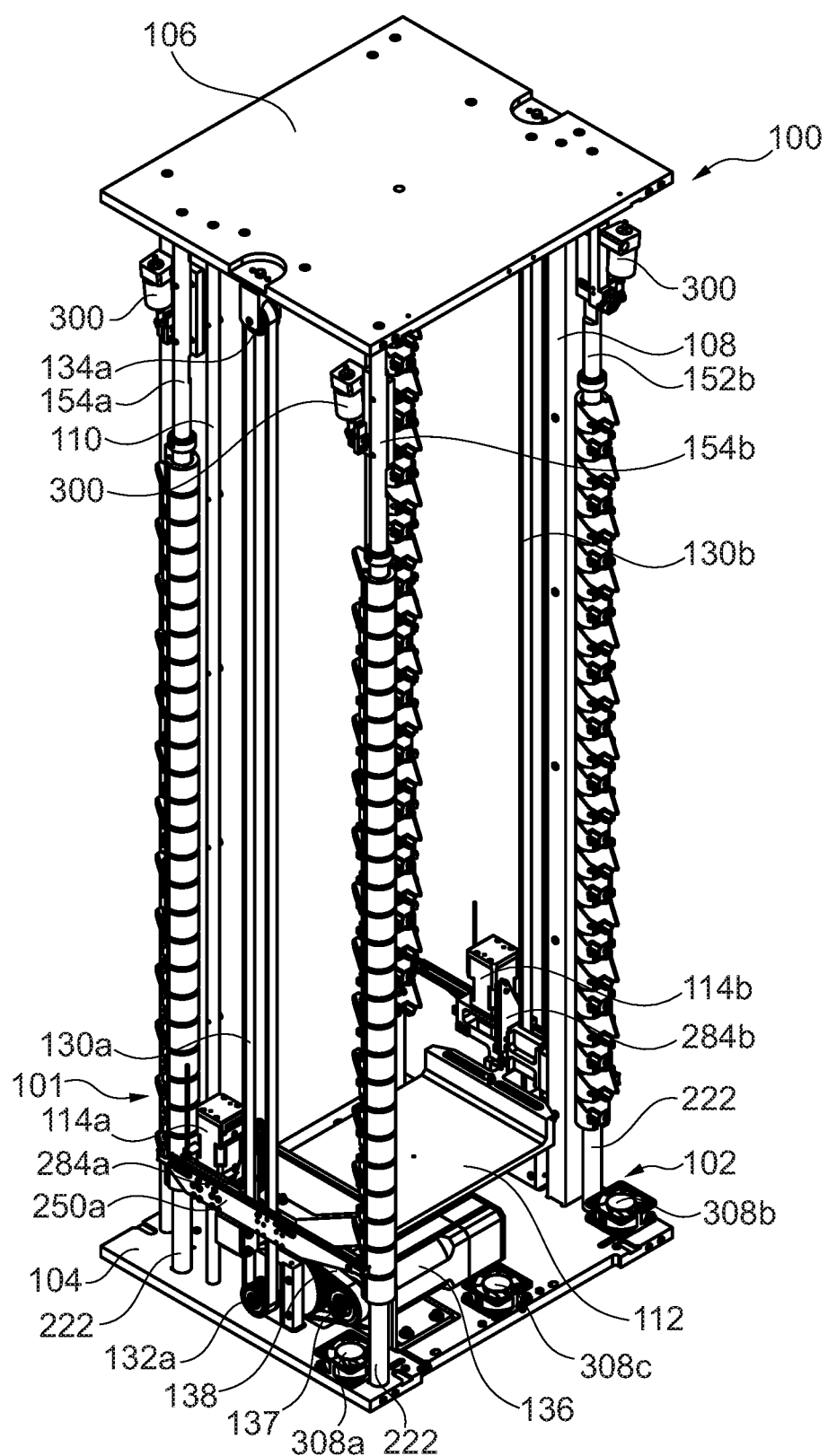
FIG. 12 is a perspective view of the fourth side and the second side of the opener apparatus with some housing and panel elements of the opener apparatus not being shown.
Figure 13:
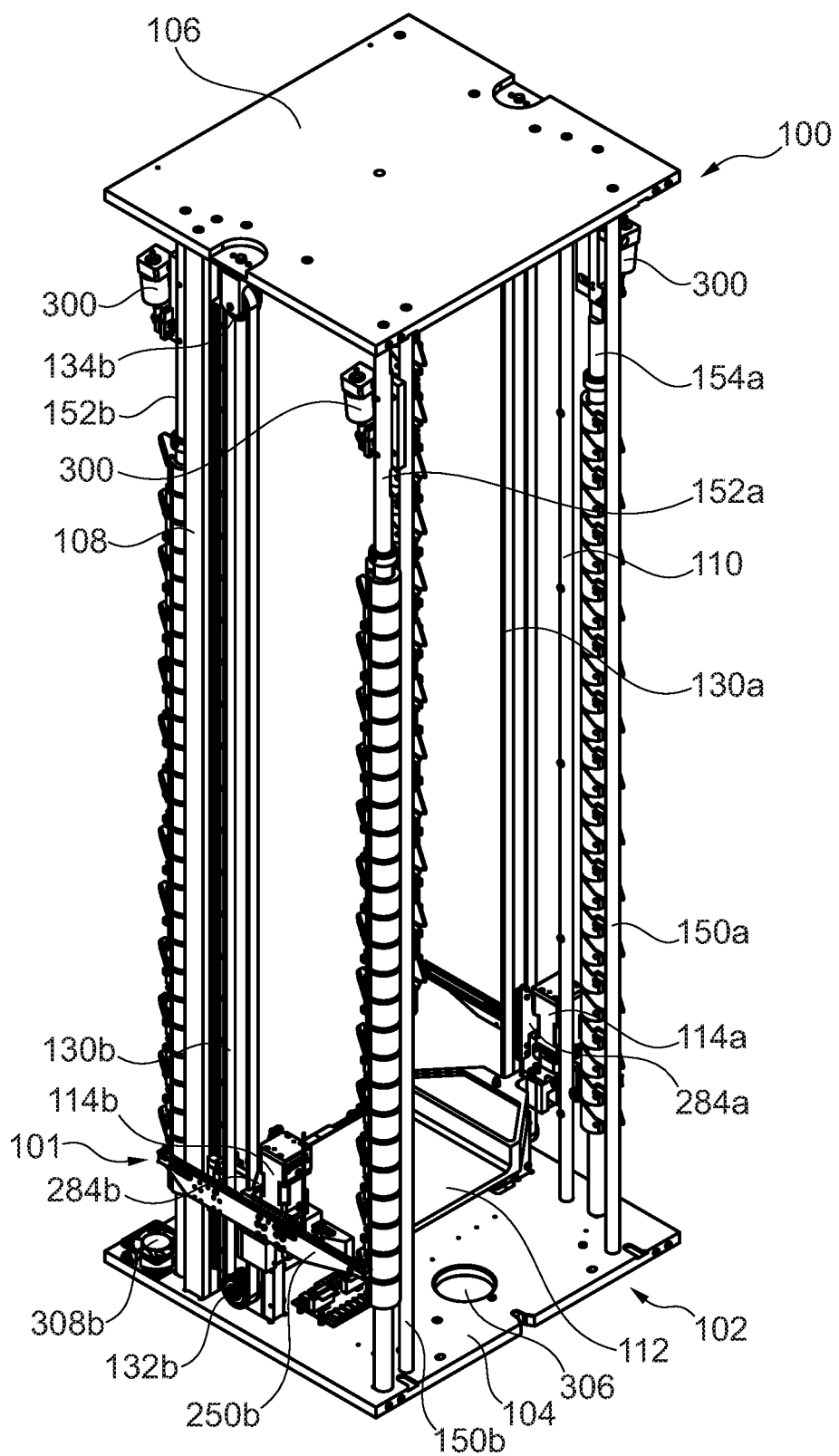
FIG. 13 is a perspective view of the third side and the first side of the opener apparatus with some housing and panel elements of the opener apparatus not being shown.
Figure 14A:
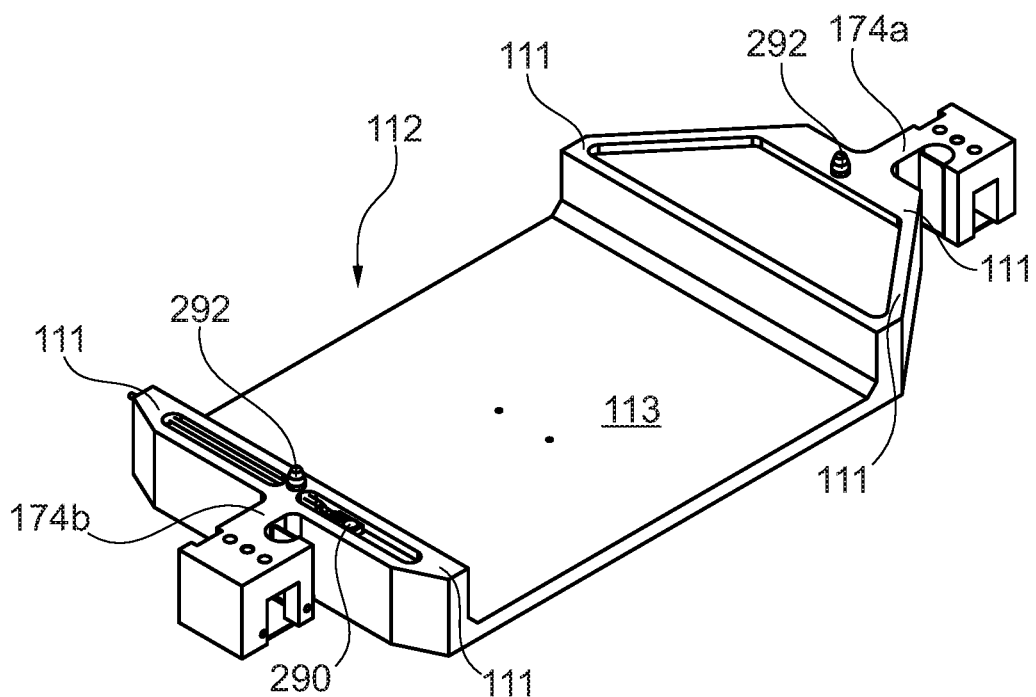
FIG. 14A is a perspective view of an upper side of a carriage of the opener apparatus.
Figure 14B:
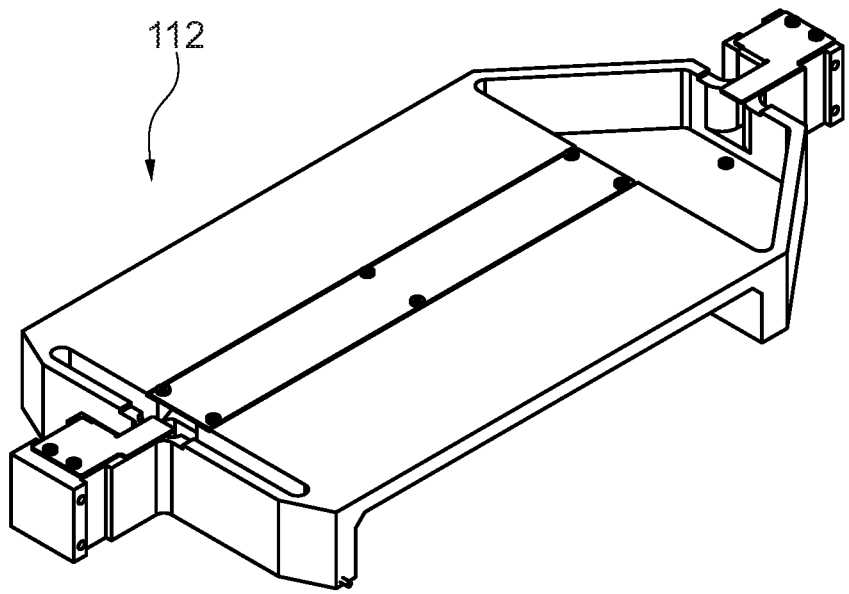
FIG. 14B is a perspective view of a lower side of the carriage of the opener apparatus.

Accordingly, the support or carriage 112, as shown in FIGS. 14A and 14B for example, on which the stack of carriers is placed in the opener and which is included in the movement mechanism 101, moves downward in each step the intended distance between the opened carriers minus the height of one carrier. Together with the carriage, a respective actuator device 114a, 114b, which actuates the holding arms, is moved downward, as shown in FIGS. 17A through 17C, FIG. 18, and FIG. 19A through 19C in different views. The actuator device is carried on a support or carriage which is linked to the support or carriage that carries the substrate carrier stack. Alternatively, a common support or carriage for the substrate carrier stack and the actuator device or actuator devices may be provided. Preferably, two such actuator devices 114a, 114b are provided on opposing sides of the support or carriage 112, as shown in FIGS. 12 and 13. Each actuator device preferably acts on two respective holding arms at a respective time.

In order to close the stack of carriers, the support or carriage 112 is moved back in the positive Z-axis direction, i.e., upwards, and the four holding arms are retracted from the respective catching position by the respective actuator device back to the respective release position, in an appropriate timing with respect to the intermittent upward movement of the support.

Figure 18:
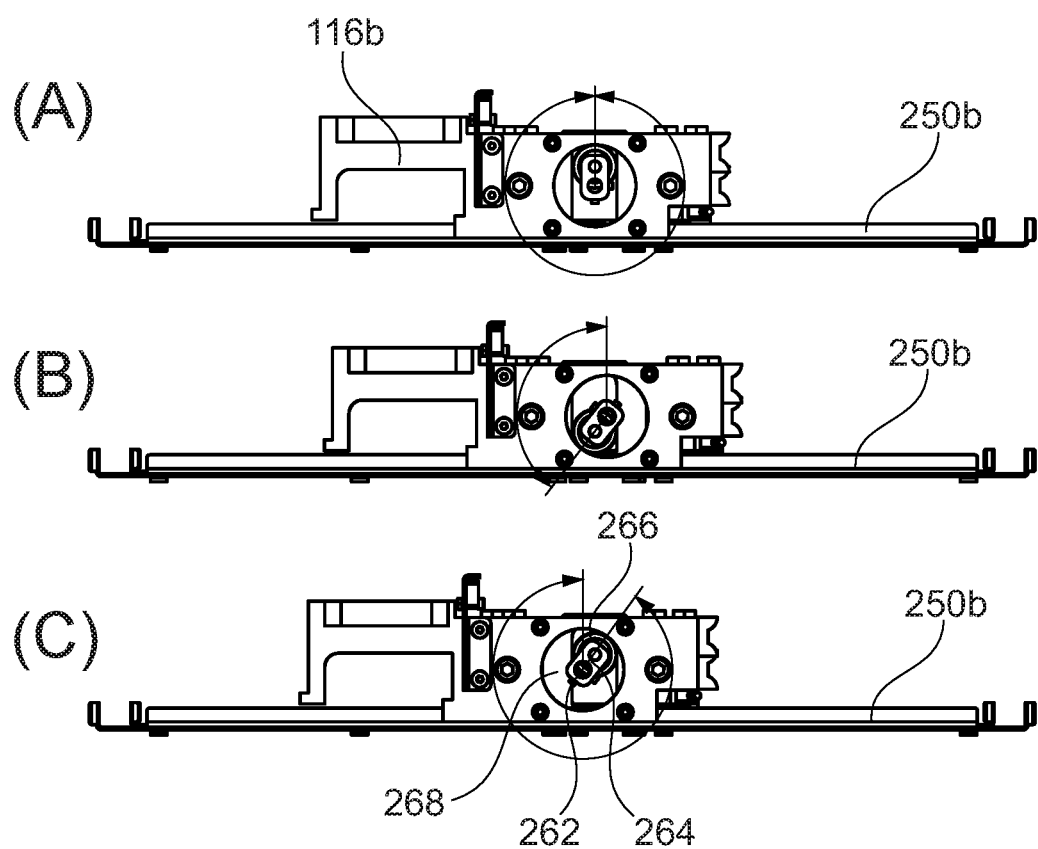
FIG. 18 shows a sectional downward view of the movable interaction device corresponding to FIG. 17C for three different transverse positions of an actuating member of the movable interaction device.

FIG. 18 shows respective operational positions of an actuator arm or actuating member of such an actuator device.

Alternatively, continuous downward and upward movements of the support or carriage in the opening and closing process instead of the intermittent downward and upward movements are possible.

The holding arms are able to be arranged on cylindrical elements 210 which pivot the holding arms into engagement with an appropriate formation, e.g., a slot, in the stack of carriers, when it has reached the correct vertical position. Preferably, two kinds of holding arms 200 and 202 are able to be provided in a vertically staggered manner, which interact with a respective associated kind of formation of a respective carrier of the stack, as shown in FIGS. 15A through 15E and FIGS. 16A through 16C. The holding arms are able to be made out of sheet metal material, preferably stainless steel sheet material, for example.

In particular, the holding arms 200 and 202 of the opener, which are engagement elements or more generally are engagement formations of the opener apparatus, are able to be engaged with associated counter engagement formations of a respective substrate carrier 12 to be held at a particular vertical position within the opener apparatus 100. In the case of the substrate carriers 12 and the substrate carrier stacks described above, for example, on the basis of FIGS. 3 through 8, the counter engagement formations are defined by the two types of interfacing projections 54b, 54c and 54a, 54d which project in pairs in opposing sideward directions from the substrate carrier frame 40 of a respective substrate carrier 12.

Figure 10:
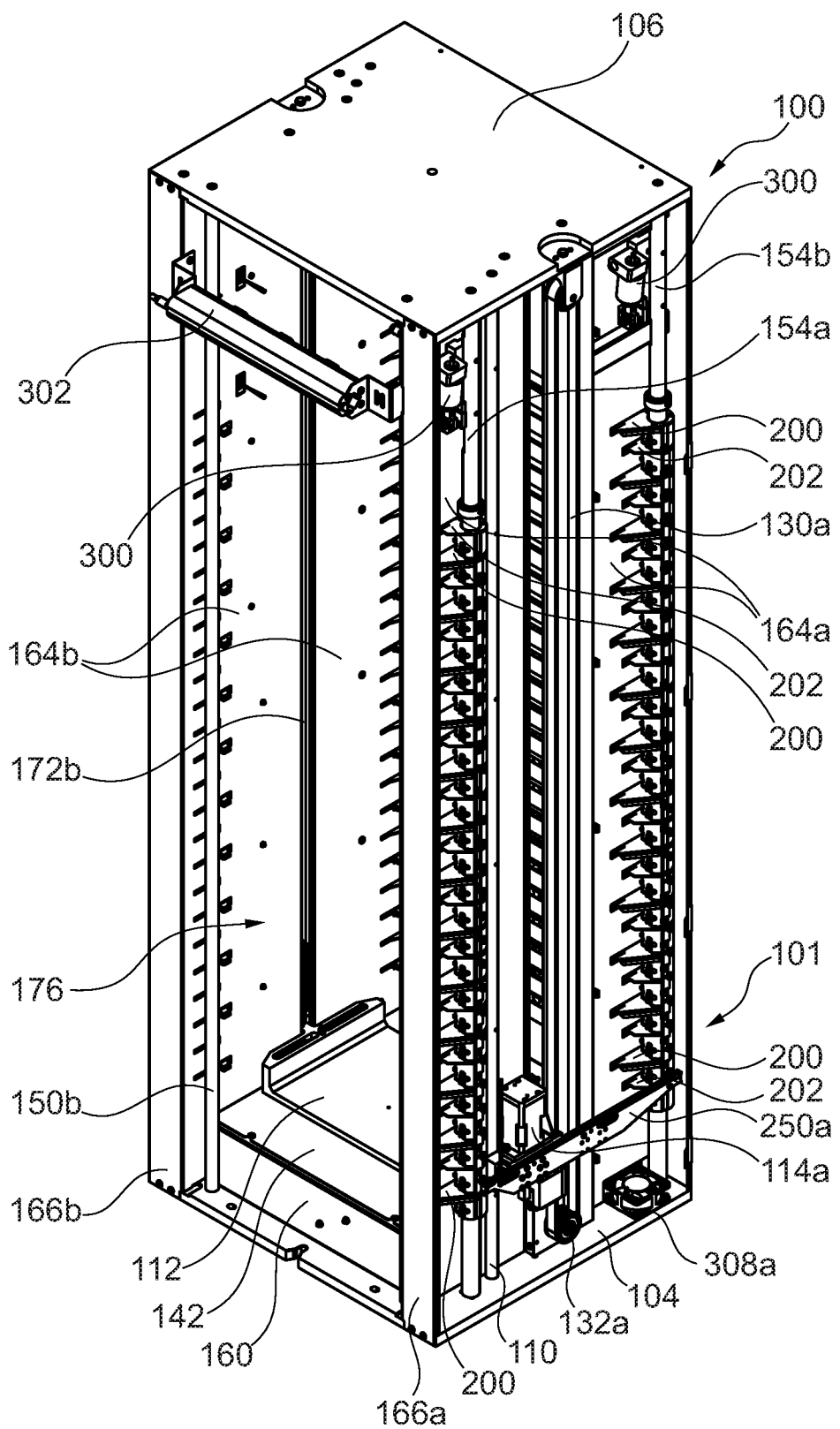
FIG. 10 is a perspective view of a first side and a fourth side of an exemplary opener apparatus according to a preferred embodiment of the present invention, wherein a first loading and unloading port to access substrate carriers within an opened substrate carrier stack at the first side of the opener apparatus is shown.
Figure 11:
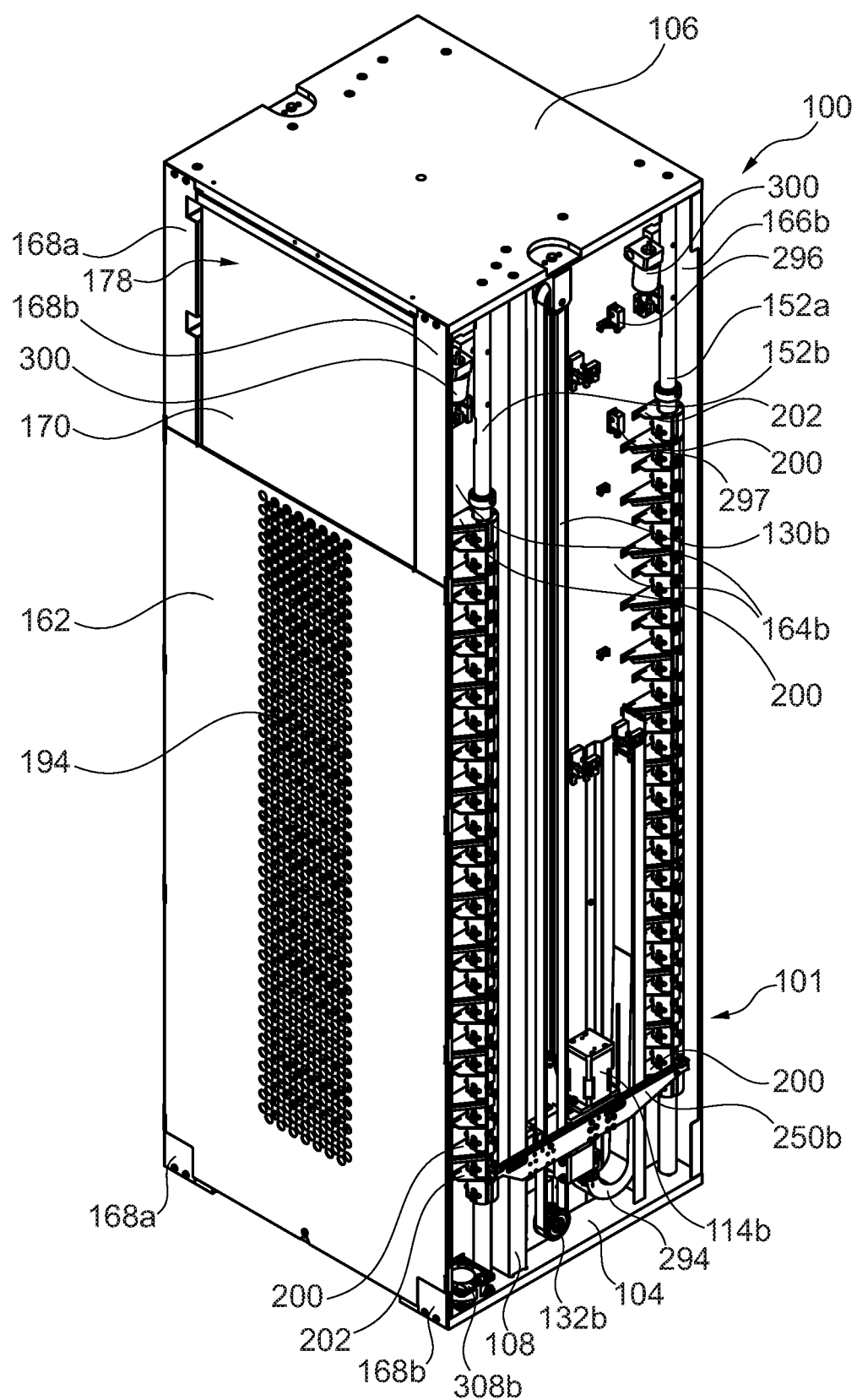
FIG. 11 is a perspective view of a second side and a third side of the opener apparatus, wherein a second loading and unloading port to load substrate carrier stacks into and from the opener at the second side of the opener apparatus is shown.

As shown in FIG. 12 and FIG. 13, the opener apparatus 100 includes a chassis 102, which preferably includes a base plate 104, a top plate 106, and a number of elongated structural elements which extend vertically and connect the base plate and the top plate, which each extend in a respective horizontal plane. The elongated structural elements define, together with the base plate and the top plate, a mounting frame that is used for many or even all components of the opener apparatus and is able to fulfill further functions. Preferably, all structural components of the chassis, which is also able be denoted as a rack of the opener apparatus, are made from metallic materials, such as stainless steel material. This chassis or rack 102 defines, with other structural components to be described, such as various panels, in particular sheet metal panels, a housing of the opener apparatus 100, as shown in FIGS. 10 and 11.

Figure 23H:
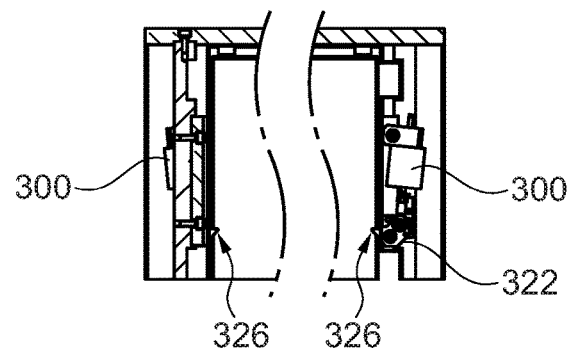
FIG. 23H is a side sectional view of the opener apparatus according to section H-H in FIG. 23A.

The elongated structural elements include a support beam 108 having a rectangular cross-section and a guiding beam 110 having a circular cross-section, which movably guide a carriage arrangement including the carriage 112 which is a support for a substrate carrier stack 10 in the stacked state, which is accommodated in the opener apparatus, and further components fixedly connected therewith. These components include two actuator devices 114a, 114b which are arranged on transversely opposed sides of the carriage 112, which have already been discussed above as well. The actuator device 114b is also shown in FIGS. 17A, 17B, 18, and 19A through 19C and includes a mounting body 116b, to which a sliding guide 118b shown in FIG. 23J is mounted, which is in sliding engagement with a guiding rail 120. The guiding rail 120 is mounted to the support beam 108, as shown in, for example, FIG. 23G and FIG. 23J.

Figure 23G:
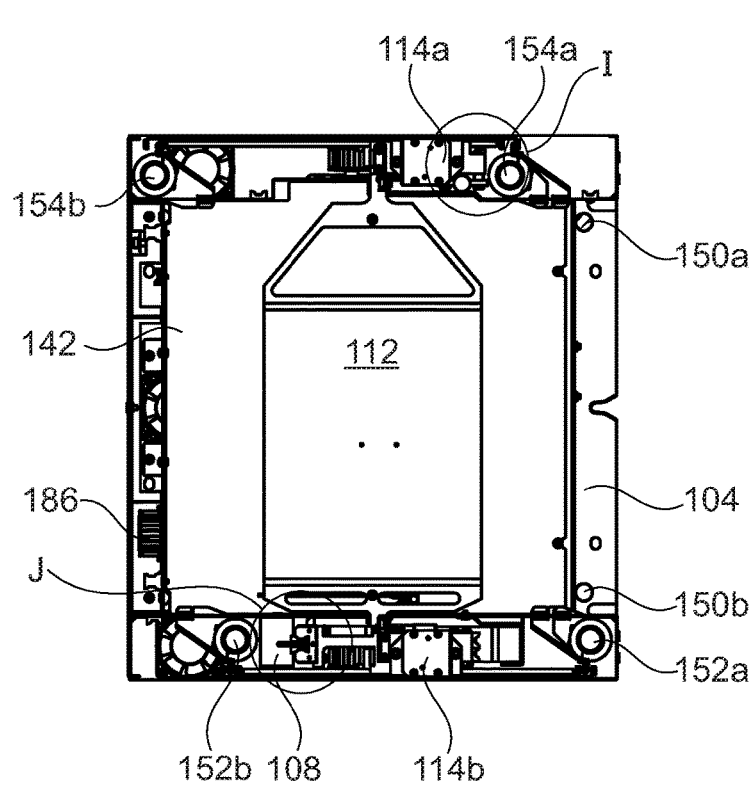
FIG. 23G is a sectional downward view of the opener apparatus according to section G-G in FIG. 23A.
Figure 23I:
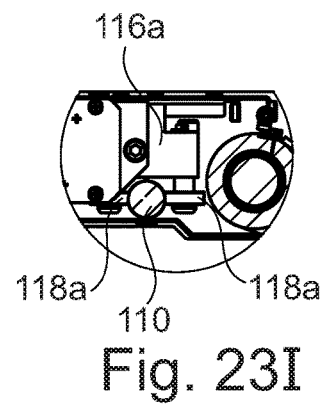
FIG. 23I is a sectional downward view of the opener apparatus according to detail I in FIG. 23G.
Figure 23J:
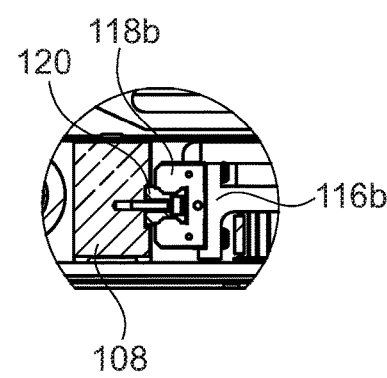
FIG. 23J is a sectional downward view of the opener apparatus according to detail J in FIG. 23G.

Also, the other actuator device 114a includes a mounting body 116a, to which guide elements 118a are mounted, which are in guiding engagement with the guiding beam 110, as shown in, for example, FIG. 23G and FIG. 23I.

Accordingly, the two actuator devices 114a, 114b with their mounting bodies 116a, 116b define, with the carriage 112, a carriage arrangement which is vertically movable upwardly and downwardly along the support beam 108 and the guide beam 110. In order to hold this carriage arrangement at a certain vertical position and drive it upwardly and downwardly, two belt drives are provided. A first belt drive includes a first tooth belt 130a with a first drive pulley 132a and a first return pulley 134a, and the second belt drive includes a second tooth belt 130b with a second drive pulley 132b and a second return pulley 134b. The first and second drive pulleys 132a, 132b are able to be driven in opposing drive directions via a servo motor 136 and a tooth belt gear 138 including a drive pulley 137 of the servo motor 136 and a driven pulley 139 and that provides for speed reduction of the driving speed of the servo motor 136 to a lower driving speed of the first and second belt drives, for example, as shown in FIGS. 12 and 13, as well as FIG. 22B. The two drive pulleys 132a, 132b and the driven pulley 139 of the tooth belt gear 138 are mounted to a common driving shaft 140.

The driven pulley 139 of the tooth belt gear 138, which is mounted to the driving shaft 140, is able to be seen in FIG. 23D. The driving shaft 140 is mounted to the base plate 104 via two supports, one being shown in FIG. 23E which includes a fixed bearing for the driving shaft 140 and the other is shown in FIG. 23F which includes a floating bearing for the driving shaft 140. These bearings may be grooved ball bearings.

Referring again to the elongated structural elements that define the chassis together with the base plate 104 and the top plate 106, these elongated structural elements may further include two beams 150a, 150b having a circular or substantially circular cross-section according to the present preferred embodiment. These beams on a first side of the opener apparatus, shown in FIG. 10 for example, are able to provide additional support between the base plate 104 and the top plate 106, and are able to secure and guide the substrate carriers held by the respective set of holding arms in the unstacked condition as well as the substrate carrier stack in the stacked condition at the correct place within the opener apparatus. Normally, such a securing and guiding function with respect to the unstacked substrate carriers and the substrate carrier stack is not required, however, it might be appropriate to provide such a securing and guiding function for unusual conditions and failures, including earthquake effects, for example. Further, these two elongated elements 150a and 150b are not required to belong to the elongated structural elements that define the chassis together with the base plate 104 and the top plate 106, and are able to be defined by rods made from a suitable plastic material such as polyethylene terephthalate (PET), which have no or substantially no supporting function with respect to the top plate 106.

In the assembled opener apparatus 100, the servo motor 136, the tooth belt gear 138, the driving shaft 140, and other components are covered by a sheet metal plate 142. Further, these components are shielded in the assembled opener apparatus 100 in transverse directions by a sheet metal faceplate 160 on the first side of the opener apparatus, by a sheet metal face panel 162 of the opener apparatus on a second side of the opener apparatus (see, for example, FIG. 11) opposite to the first side, and a first pair of sheet metal partition panels 164a and a second pair of sheet metal partition panels 164b on a third side (see, for example, FIG. 11) and on a fourth side (see, for example, FIG. 10) of the opener apparatus 100. These pairs of partition panels are located somewhat inwardly, so that the partition panels are located between the carriage 112 and a respective of the actuator devices 114a, 114b.

Further, there are two slender sheet metal faceplates 166a, 166b, which are provided on the first side of the opener apparatus and extend parallel to the support beams 150a, 150b over the vertical extent of the opener apparatus, and two slender sheet metal faceplates 168a, 168b on the second side of the opener apparatus 100, which extend analogously over the vertical extent of the opener apparatus and are partially covered by the face panel 162.

The opener apparatus 100 includes a large opening 176 between the two faceplates 166a, 166b on the first side, which defines a loading and unloading port 176 of the opener apparatus to unload substrates from a respective substrate seat of a respective substrate carrier of a substrate carrier stack being in an unstacked state and to load substrates on such a respective seat of such a respective substrate carrier.

Further, the opener apparatus 100 includes an opening 178 on the second side of the opener apparatus, which is located above the face panel 162, between the two faceplates 168a, 168b. Preferably, a sliding door or some other shielding arrangement may be provided, to open and close this opening, which defines a loading and unloading port 178 to load a respective substrate carrier stack on the carriage 112 (or alternate holder, as explained below with reference to FIGS. 27 and 28) or to unload a respective substrate carrier stack from the carriage 112, which assumes for the loading and unloading an upper operational position or upper loading and unloading position within the vertical movement range of the carriage 112. The embodiment shown in the figures includes a sliding door 170, which in FIG. 11 is in an upper closing position and is able to be moved downwardly to open the loading and unloading port.

Between the two partition panels of the first pair of sheet metal partition panels 164a and between the two partition panels of the second pair of sheet metal partition panel 164b a respective vertical slit, shown in FIG. 10 for example, is defined, through which a respective of two narrow connection portions 174a and 174b of the carriage 112 extends, as shown in FIG. 10 and FIG. 23D. These partition panels further include short transversely extending slits for the holding arms 200 and 202, as it will be described in more detail in the following.

Figure 20:
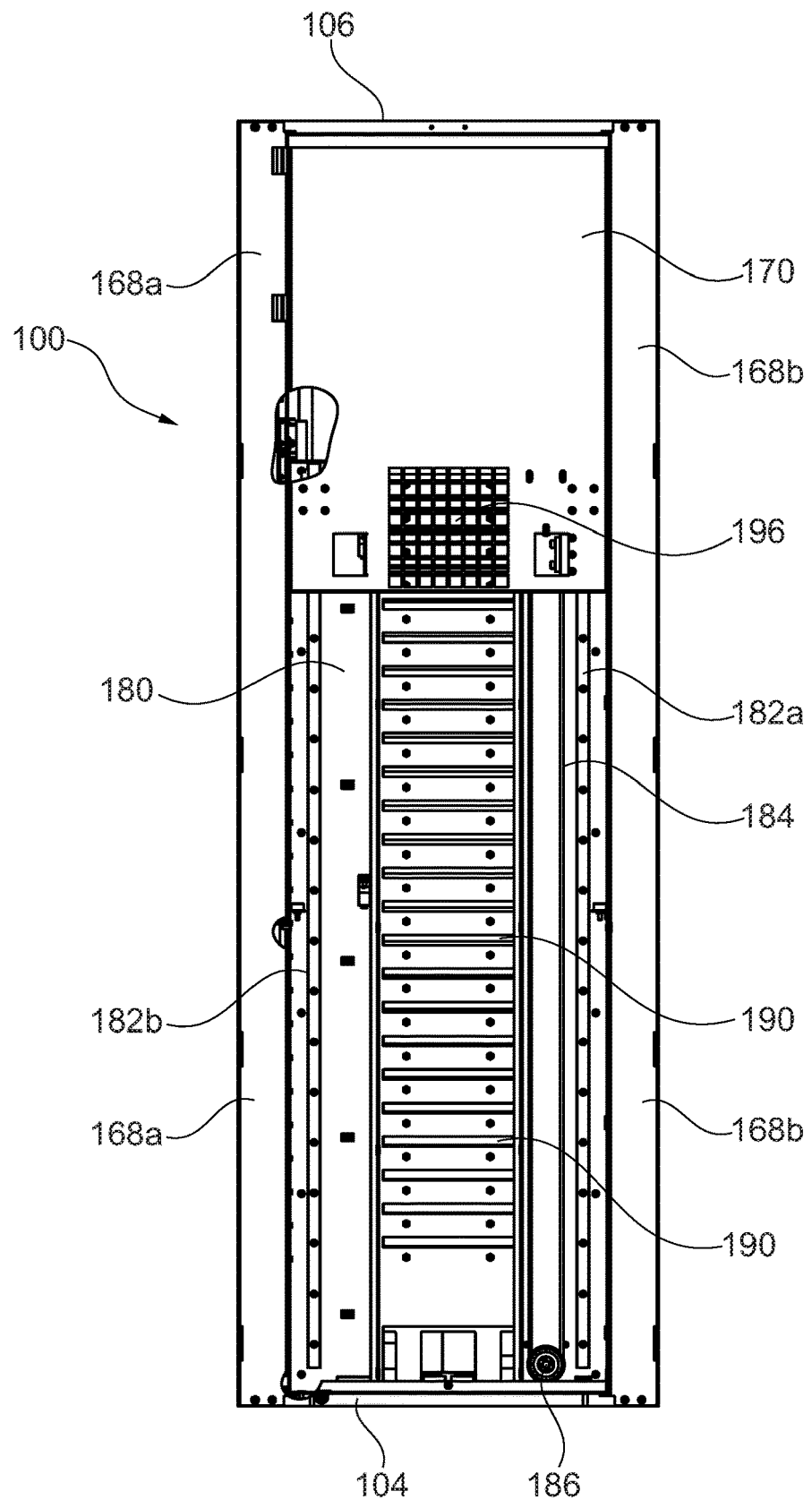
FIG. 20 is a side view of the second side of the opener apparatus without a face plate belonging to a housing of the opener apparatus being shown.
Figure 21:
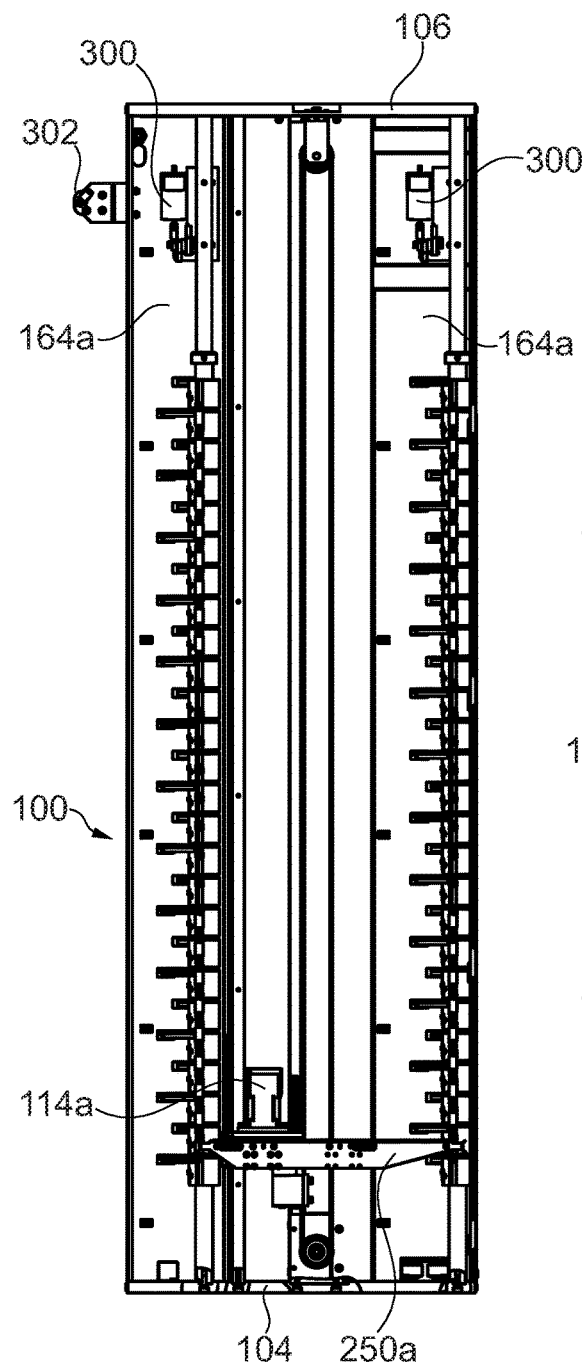
FIG. 21 is a side view of the fourth side of the opener apparatus.
Figure 22A:
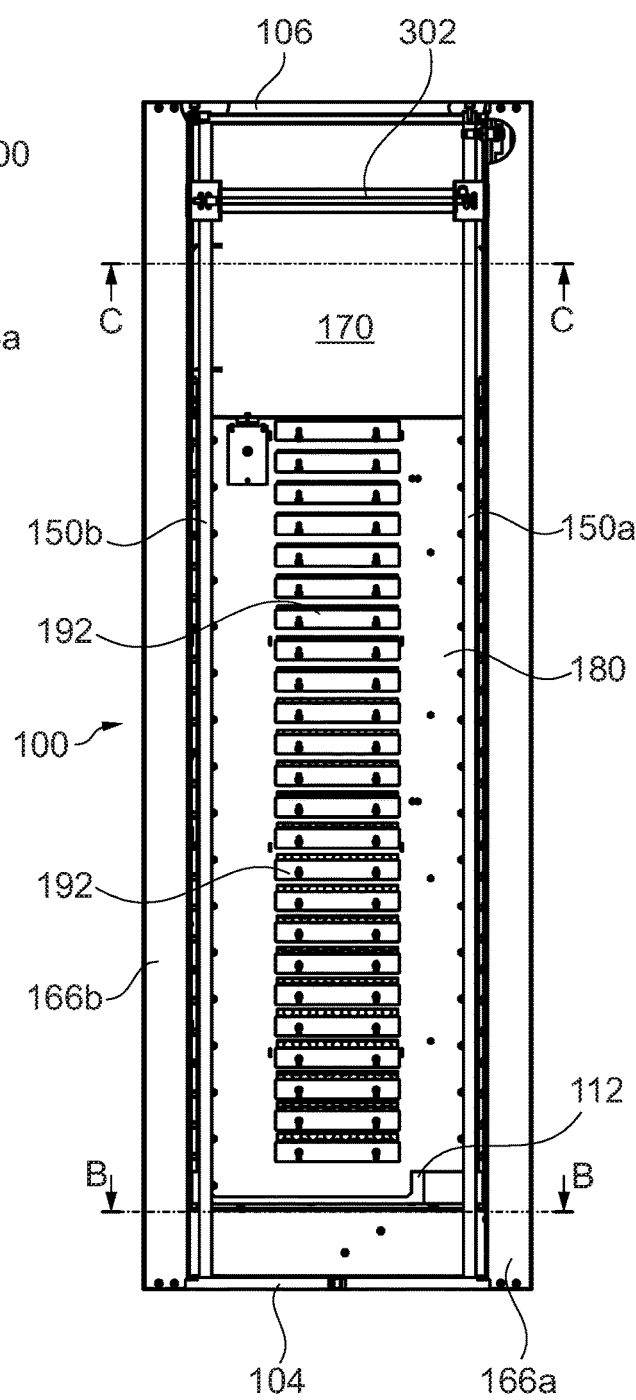
FIG. 22A is a side view of the first side of the opener apparatus.
Figure 22B:
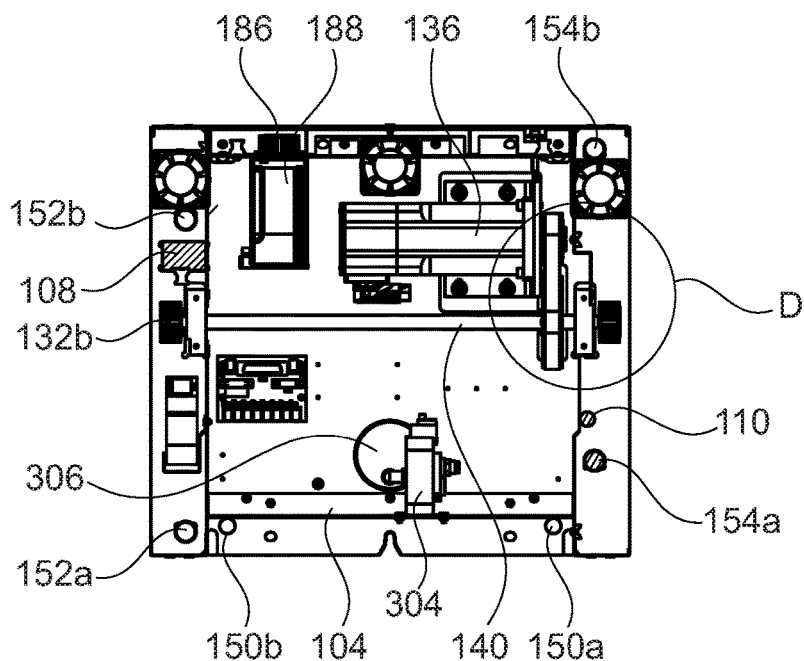
FIG. 22B is a sectional downward view of the opener apparatus according to section B-B in FIG. 22A.
Figure 22D:
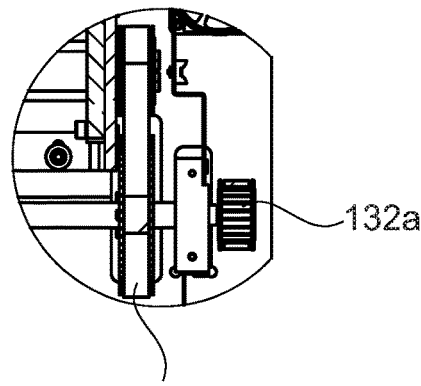
FIG. 22D is a close-up sectional upward view of the opener apparatus according to detail D in FIG. 22B.
Figure 22C:
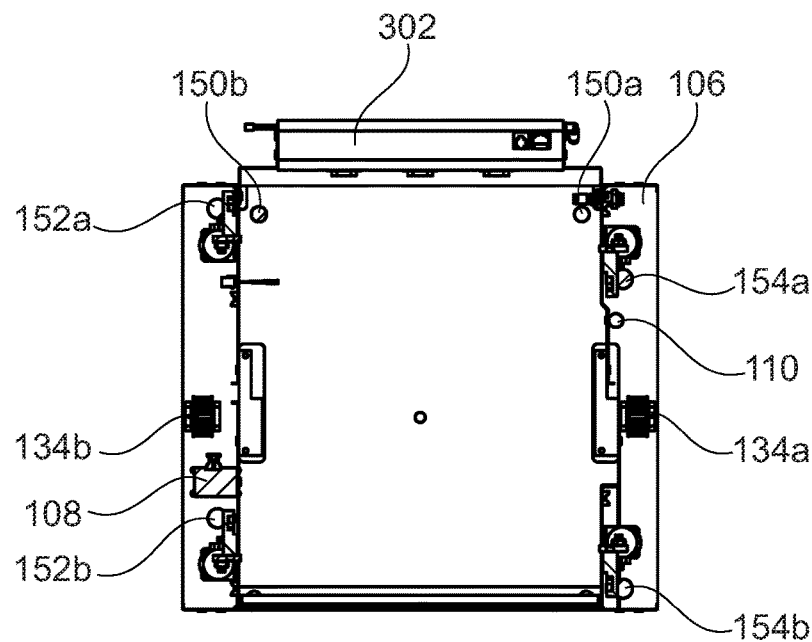
FIG. 22C is a sectional upward view of the opener apparatus according to section C-C in FIG. 22A.

A further sheet metal partition panel 180 is located on the second side of the opener apparatus, inwardly with respect to the face panel 162 and with respect to the sliding door 170, so that the sliding door 170 is located between the face panel 162 and the partition panel 180 and is able to be moved downwardly so as to be being hidden between the face panel 162 and the partition panel 180 and to open the loading and unloading port for the substrate carrier stacks. FIG. 20 shows a view on the second side of the opener apparatus 100 without the external face panel 162. There are two guiding rails 182a, 182b, which are mounted to the partition panel 180, extend in a vertical direction, and interact with sliding guides of the sliding door 170. There is a third belt drive including a third tooth belt 184, a drive pulley 186 and a return pulley. The drive pulley 186 is driven by an additional servo motor 188, which is shown in FIG. 22B.

Accordingly, the sliding door 170 is able to be moved by the third belt drive and the second servo motor 188 downwardly to open the port in order to enable at least one of unloading a substrate carrier stack from the carriage 112 and loading a substrate carrier stack on the carriage 112 (or the alternate holder) and upwardly to close this port again. For such an operation, the carriage 112 will have been brought to the upper operational position or upper loading and unloading position, which preferably is a position in which an upper surface 113 of a central plate-shaped portion of the carriage 112 is aligned with or positioned slightly higher than the lower boundary of the port. The upper surface 113 is able to define a supporting surface for a substrate carrier stack, in particular the base of the substrate carrier stack, which is preferably provided. But instead, preferably, upper surface portions 111 of elevated supporting structures of the carriage 112, as shown in FIG. 14A for example, which are displaced upwardly with respect to the upper surface 113, support the respective substrate carrier stack. This improves the ability to load a substrate carrier stack on the carriage 112 and to unload a substrate carrier stack from the carriage 112 using a suitable loading and unloading structure, e.g., a robot arm arrangement, which includes a supporting portion or gripper which is able to engage between the lower side of the base and the upper surface 113.

Preferably, this loading and unloading port for the substrate carrier stacks is closed after the loading of a substrate carrier stack on the carriage 112 and before further operation of the opener apparatus, namely to bring the substrate carriers 12 of the substrate carrier stack 10 in a completely or partially unstacked state, so that the seats of the substrate carriers are able to be accessed to unload and load a respective substrate, e.g., a semiconductor wafer.

The third tooth belt 184 and the drive and return pulleys of this belt drive are located between the face panel 162 and the partition panel 180. The return pulley preferably is attached to an upper end section of the partition panel 180, below the lower border of the port opening. At least one sensor may be provided to sense the current position or at least the closed state of the sliding door 170.

The partition panel 180 may be provided with an array of horizontal venting slits 190 in a middle strip portion between the guide rails 182a and 182b, as shown in FIG. 20. Preferably, on the inner side of the partition panel 180, i.e., on the side of the partition panel 180 facing the first side of the opener apparatus, horizontally extending shutter elements 192 are able to be provided and mounted to the partition panel 180, as shown in FIG. 22A. The vertical positions of these shutter elements are able to be adjustable in vertical direction in a certain extent, so that an effective slit opening width of the venting slits 190 is able to be adjusted. Preferably, this contributes to achieving a desired, uniform, preferably laminar flow of clean air through the opener apparatus 100, and in the case of a clean room facility 80 as mentioned above, preferably from the EFEM 86 towards and into the storage chamber 84 of the stocker arrangement 82. From here, clean air is able to continuously be exhausted by an air suction or drainage system. Alternatively, a clean air flow in the opposite direction may be provided, if desired. In order to enable the clean air flow in either direction, the face panel 162 may include a matrix of venting openings 194 in a middle strip portion, which is aligned with the array of venting slits 190. Further, the sliding door 170 may include a matrix of venting openings 196 in a lower middle strip portion, which is aligned with an upper portion the array of venting slits 190, when the sliding door is in an upper closing position.

Referring again to the elongated structural elements that define the chassis together with the base plate 104 and the top plate 106, these elongated structural elements are able to further include a first pair of support beams 152a, 152b and a second pair of support beams 154a, 154b, which define mounting pillars for the engagement formations, namely the holding arms that move or pivot between a release position and a catching position in the course of the opening and closing operations of the opener apparatus 100. The two pairs of support beams or mounting pillars are located on opposing transverse sides of the carriage 112. The mounting pillars 152a, 152b are located on the side of the actuator device 114b, i.e., the third side of the opener apparatus 100, and the mounting pillars 154a, 154b are located on the side of the actuator device 114a, i.e., the fourth side of the opener apparatus, in each case externally with respect to the partition panels 164a and 164b, respectively.

Preferably, two kinds of engagement formations, namely two kinds of holding arms 200 and 202 according to the present preferred embodiment are provided. These holding arms are mounted in the vertical direction in an alternating manner to a respective of the mounting pillars, such that four sets of vertically staggered engagement formations are provided. The arrangement is such that, at each respective vertical height of the opener apparatus 100 corresponding to the vertical holding position of an unstacked substrate carrier or cover, four such engagement formations are provided. Of these four engagement formations, which commonly support a respective substrate carrier at a certain vertical position in the unstacked state, preferably two engagement formations are engagement formations of a first type and two engagement formations are engagement formations of a second type. In the case of the present preferred embodiment, where the engagement formations are defined as holding arms, preferably two holding arms of a first type having a first arm length and two holding arms of a second type having a second arm length are provided at a certain vertical height of the opener apparatus 100 to commonly catch and hold the cover (if provided) and a respective substrate carrier, respectively, to unstack and hold the same in the unstacked state.

Figure 15B:
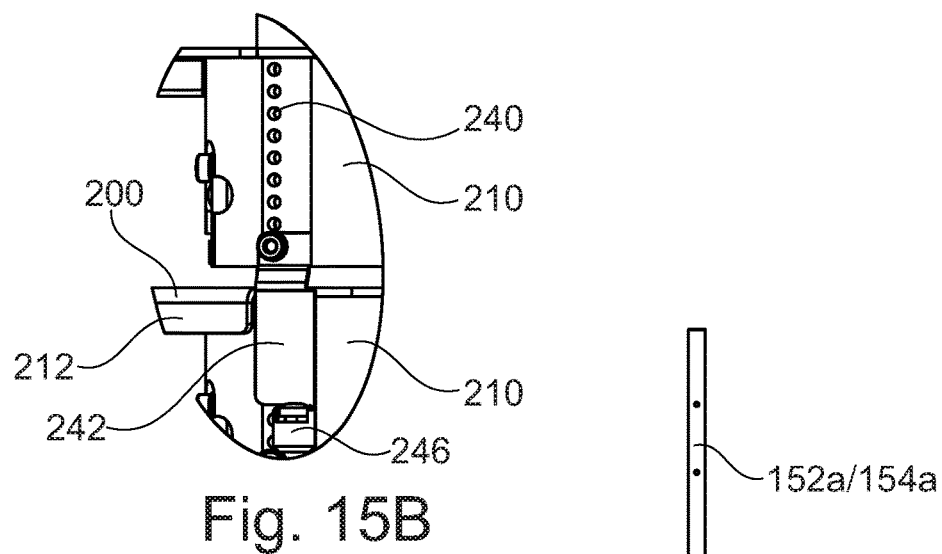
FIG. 15B is a close-up side view of two adjacent engagement formations according to detail B in FIG. 15A.
Figure 15D:
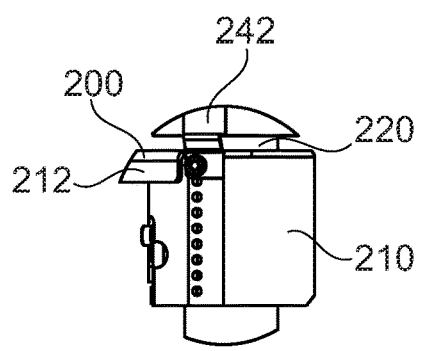
FIG. 15D is a close-up side view of an engagement formation according to detail D in FIG. 15C.
Figure 15C:
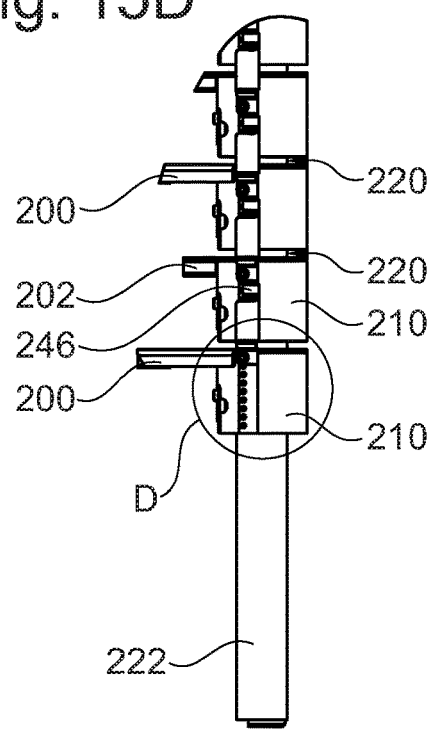
FIG. 15C is a close-up side view of a plurality of adjacent engagement formations according to detail C in FIG. 15A.
Figure 15A:
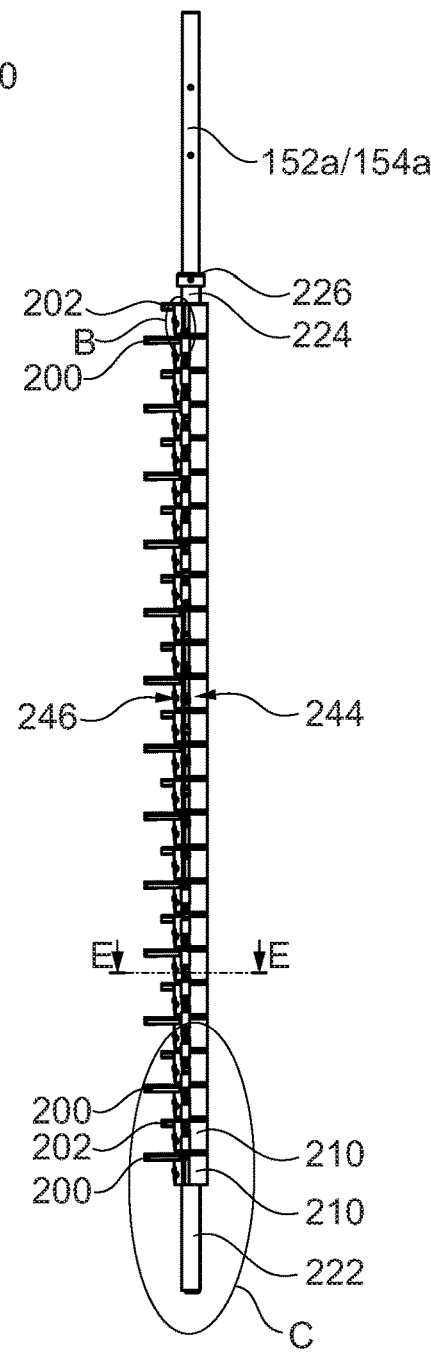
FIG. 15A is a side view of a set of vertically staggered engagement formations of a first and a second type mounted to a mounting pillar of the opener apparatus.

Such a mounting pillar, which corresponds to the mounting pillar 152a and the mounting pillar 154a, is shown in FIGS. 15A to 15E, for example. As shown in FIG. 15A, the shorter and the longer holding arms are alternatingly provided along the vertical extent of the mounting pillar 152a/154b. The lowermost holding arm 200 has a longer arm length, the vertically adjacent holding arm 202 has a shorter arm length, the next adjacent upper holding arm has again a longer arm length, and so forth, and the uppermost holding arm has again a shorter arm length. In the following, long holding arms 200 and short holding arms 202 are referred to.

Preferably, the other two mounting pillars 152b and 154b are analogously provided with vertically alternating holding arms. For example, preferably the only relevant difference is able to be that the respective lowermost holding arm is a short holding arm 202 and that the respective uppermost holding arm is a long holding arm 200, as realized according to the present preferred embodiment, as shown in FIGS. 10 and 11.

In order to identify one of the two kinds of holding arms as a holding arm of a first type associated with a respective counter engagement formation, e.g., a projection, of a first type of the cover (if provided) and a respective substrate carrier to be caught and held, and the other of the two holding arms as a holding arm of a second type associated with a respective counter engagement formation, e.g., a projection, of a second type of the cover (if provided) and a respective substrate carrier to be caught and held, preferably makes sense with respect to the set of vertically staggered holding arms mounted to the same mounting pillar. The associated counter engagement formations preferably are provided in an analogous vertically staggered alternating manner along the vertical height of the substrate carrier stack, so that a long holding arm 200 catches and holds a respective substrate carrier (or the cover) by engagement with a counter engagement formation of one type and a respective short holding arm 202 catches and holds a respective substrate carrier (or the cover) by engagement with a counter engagement formation of another type.

Figure 15E:
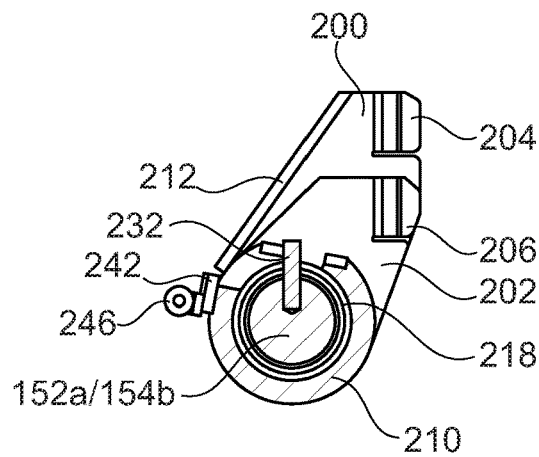
FIG. 15E is a sectional downward view of the mounting pillar with engagement formations of the first and second type mounted thereto according to section E-E in FIG. 15A.
Figure 16A:
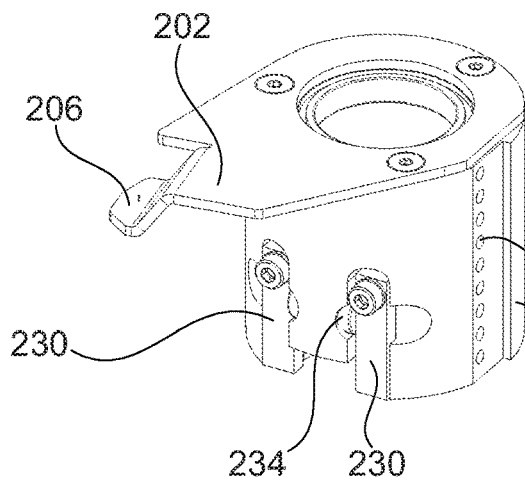
FIG. 16A is perspective view of an engagement formation of the first type.

Preferably, these counter engagement formations are provided at the substrate carrier stack in four sets of vertically staggered counter engagement formations, which preferably are defined as projections. Within each set, which is associated commonly to a set of holding arms mounted to the same mounting pillar, the counter engagement formations of a first and a second type are alternatingly provided in a vertical direction, e.g., as shown FIGS. 5 to 8 and as described above. These counter engagement formations of adjacent substrate carriers, for example projections 54a, 54b, 54c and 54d of the substrate carriers 12 described above, are displaced transversely with respect to each other, and adjacent holding arms, namely a pair of a long holding arm 200 and a next adjacent short holding arm 202 may include correspondingly displaced engagement sections 204 and 206, i.e., engagement sections 204 and 206 transversely displaced with respect to each other, with the engagement section 204 being the engagement section of a long holding arm 200 and the engagement section 206 being the engagement section of a short holding arm 202, as shown in FIG. 15E. FIG. 16A shows the shape of such a short holding arm 202 and a long holding arm 200 is preferably shaped analogously, except for the longer arm length, for example.

Whether and which of the four sets of holding arms being mounted to a respective of the mounting pillars 152a, 152b, 154a, 154b includes as uppermost holding arm a short holding arm 202 and as lowermost holding arm a long holding arm 200, and whether and which of these sets of holding arms includes as uppermost holding arm a long holding arm 200 and as lowermost holding arm a short holding arm 202, is based on the substrate carrier stacks 10 and its substrate carriers 12 and the relative arrangement of the substrate carriers 12 with the cover 16 (if provided) therein and how the substrate carrier stack 10 is positioned on the carriage 112, as illustrated in FIGS. 35 and 36.

Assuming that substrate carriers like the substrate carriers 12 of FIGS. 3 and 4 and FIGS. 6 to 8 are stacked on each other to define a substrate carrier stack 10, the opener apparatus 100 shown in the detailed figures is able to be considered to be designed to operate on a substrate carrier stack as schematically illustrated in FIG. 35(A) for the case that the substrate carrier stack is provided with the cover.

In this case, the substrate carrier 12 shown in FIG. 35(A) shall represent the uppermost substrate carrier 12 of the substrate carrier stack, which would be caught and held by the uppermost short holding arm 202 that is mounted to the mounting pillar 154b and engages with interfacing projection 54a of this substrate carrier 12, by the uppermost long holding arm 200 that is mounted to mounting pillar 152a and engages with interfacing projection 54d of this substrate carrier 12, by the uppermost long holding arm 200 that is mounted to mounting pillar 152a and engages with interfacing projection 54c of this substrate carrier 12, and by the uppermost short holding arm 202 that is mounted to mounting pillar 152b and engages with interfacing projection 54b of this substrate carrier 12. The cover would be held by the uppermost holding arm being a long holding arm 200 mounted to mounting pillar 154b, by the uppermost holding arm being a short holding arm 202 mounted to mounting pillar 154a, by the uppermost holding arm being a short holding arm 202 mounted to mounting pillar 152a, and by the uppermost holding arm being a long holding arm 200 mounted to mounting pillar 152b.

Preferably, if the opener apparatus 100 operates on a substrate carrier stack which does not include a cover stacked on the uppermost substrate carrier, then FIG. 35(C) would represent such a situation. In this case, FIG. 35(C) would show the uppermost substrate carrier 12 of the substrate carrier stack, which would be caught and held by the uppermost holding arm being a long holding arm 200 mounted to the mounting pillar 154b, by the uppermost holding arm being a short holding arm 202 mounted to the mounting pillar 154a, by the uppermost holding arm being a short holding arm 202 mounted to the mounting pillar 152a, and by the uppermost holding arm being a long holding arm 200 mounted to the mounting pillar 152b.

However, a substrate carrier stack to be opened and closed by the opener apparatus preferably includes a cover which is stacked on the uppermost substrate carrier of the substrate carrier stack. In this case, FIG. 35(C) represents a variant of the opener apparatus including the long holding arms 200 and the short holding arms 202 mounted to the respective mounting pillar interchanged, so that the uppermost holding arm mounted to mounting pillar 154b would be a short holding arm 202, the uppermost holding arm mounted to mounting pillar 154a would be a long holding arm 200, the uppermost holding arm mounted to mounting pillar 152a would be a long holding arm 200, and the uppermost holding arm mounted to mounting pillar 152b would be a short holding arm 202. For such a realization of the opener apparatus 100, the stack of substrate carriers would have to be placed in a position rotated by 180 degrees about the vertical axis on the carriage in comparison to the embodiment of FIG. 35(A), and further adaptations of the opener apparatus might be required, so that the opener apparatus might even correspond to a mirrored copy of the opener apparatus shown in the figures, for example.

FIGS. 35B and 35D correspond to further variants of the opener apparatus concerning the arrangement of the long holding arms 200 and the short holding arms 202 being adapted to handle substrate carrier stacks including alternate preferred embodiments of substrate carriers, as is also the case with FIGS. 36A through 36D. All of these figures respectively show the respective uppermost substrate carrier of a substrate carrier stack of a respective alternate preferred embodiment, which differs from the substrate carriers described regarding FIGS. 3 through 8 with respect to the relative arrangement of the interfacing projections at the outer carrier frame of the substrate carrier. The opener apparatus is able to be adapted to deal with any of these preferred embodiments by correspondingly arranging the long holding arms 200 and the short holding arms 202 on the respective mounting pillar 152a, 152b, 154a, and 154b.

Further variants of the opener apparatus are able to be considered. The shown preferred embodiments include the mounting pillars located such that, with respect to the substrate carrier stack 10 located on the carriage 112, the holding arms are to be pivoted towards the catching and holding position in a clockwise direction. Alternatively, the mounting pillars are able to be arranged such that, with respect to the substrate carrier stack, the holding arms are pivoted towards the catching and holding direction in a counterclockwise direction. To this end, the mounting pillars 154a and 154b are preferably displaced towards the first side of the opener apparatus and the mounting pillars 152a and 152b are preferably displaced towards the second side of the opener apparatus, in comparison to FIGS. 35 and 36.

Figure 32:
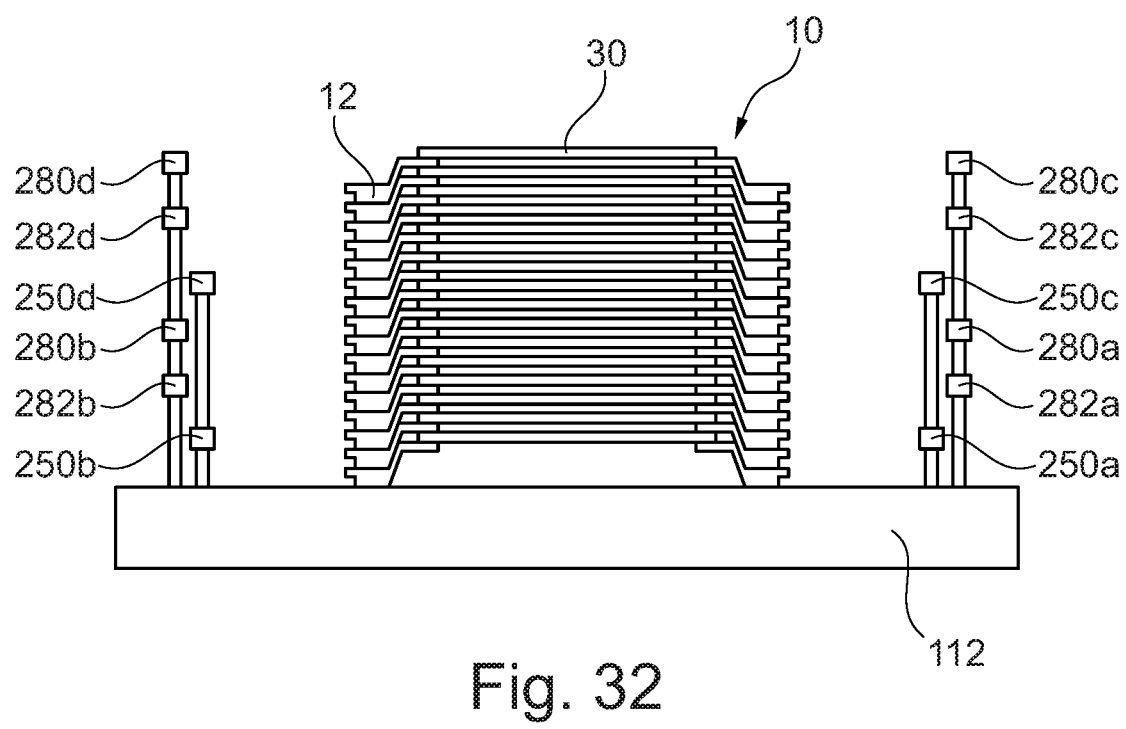
FIG. 32 schematically illustrates the carriage of a variant of the opener apparatus according to FIGS. 30A through 30C, and shows a substrate carrier stack in the stacked condition placed on the carriage.

Preferably, other preferred embodiments of the opener apparatus, different from the detailed preferred embodiments shown in FIGS. 10 to 25, different from what is considered herein on the basis of FIGS. 32 and 33, and will be considered in the following on basis of the other figures, are feasible. For example, preferred embodiments adapted to operate on substrate carrier stack and substrate carriers which are shaped substantially different from what is shown and described herein are feasible.

The long holding arm 200 and the short holding arm 202 each belong, or are mounted to, a respective cylindrical element, which mounts the respective holding arm to the respective mounting pillar and enables the respective holding arm to be pivoted between the release position and the catching position. Each of the holding arms engages with a respective horizontal slit in the respective partition panel 164a or 164b, at least in the catching position, but preferably to a certain extent also in the release position. In the catching position, the respective holding arm is inserted further through the respective slit in the respective partition panel 164a or 164b to engage with an associated counter engagement formation of a respective substrate carrier or, in the case of the uppermost holding arms, with an associated counter engagement formation of the cover (if provided), so that the catching position is also able to be denoted as an (fully) inserted position. In the release position, the holding arm is retracted from the inner space of the opener apparatus, so that its engagement section is not engageable with a counter engagement formation of a substrate carrier or the cover, so that the release position is also able to be denoted as a retracted position.

Preferably, for the present preferred embodiment, the holding arms 200 and 202 each are able to be mounted to a respective sleeve member, preferably identical sleeve members 210 for both types of holding arms. Preferably, identical sleeve members 210 for all holding arms of all four sets mounted to the four mounting pillars are used.

Figure 16B:
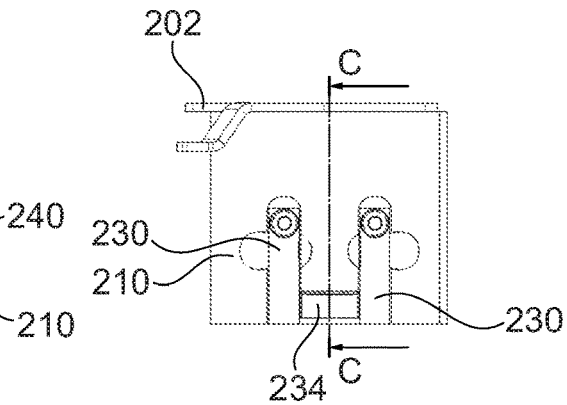
FIG. 16B is a side view of the engagement formation of the first type.
Figure 16C:
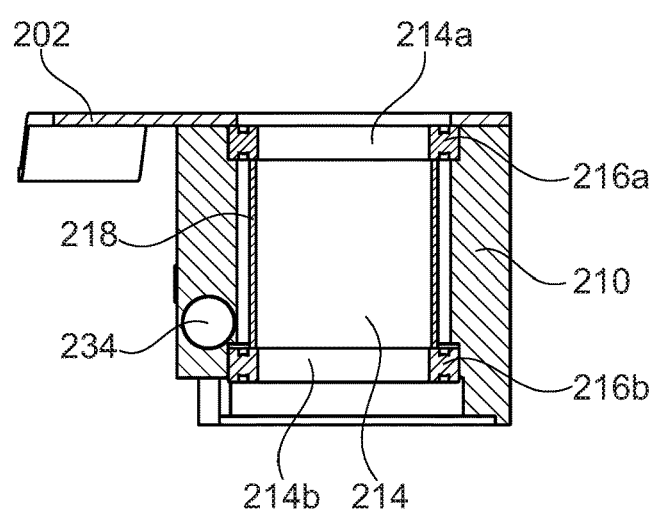
FIG. 16C is side sectional view of the engagement formation of the first type according to section C-C in FIG. 16B.
Figure 17A:
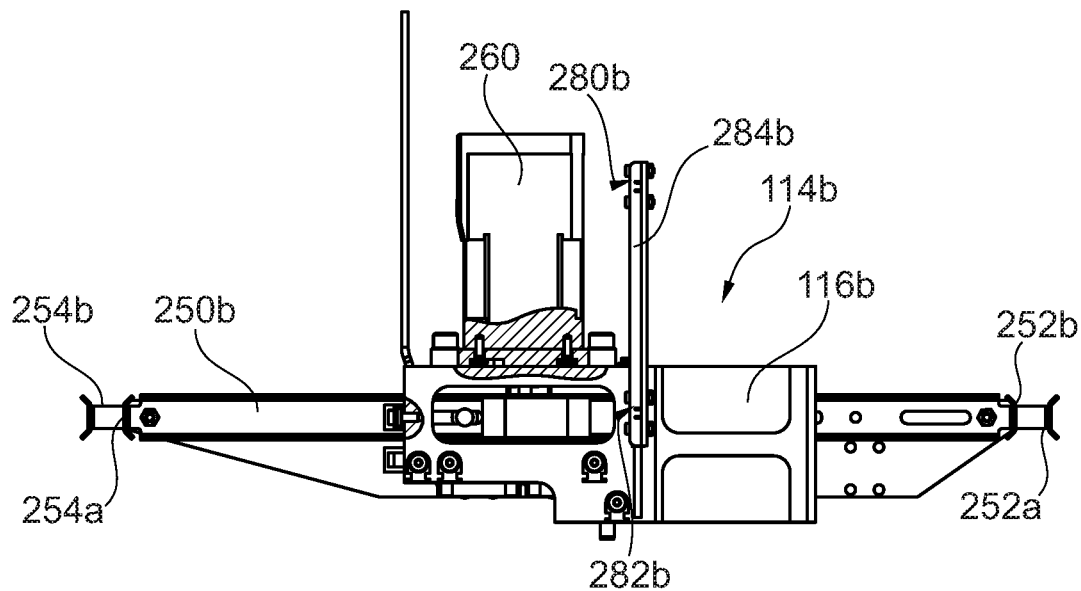
FIG. 17A is a side view of a vertically moveable interaction device of the opener apparatus, which applies actuating forces to associated engagement formations of the opener apparatus using an actuating member moveable in a transverse direction.
Figure 17B:
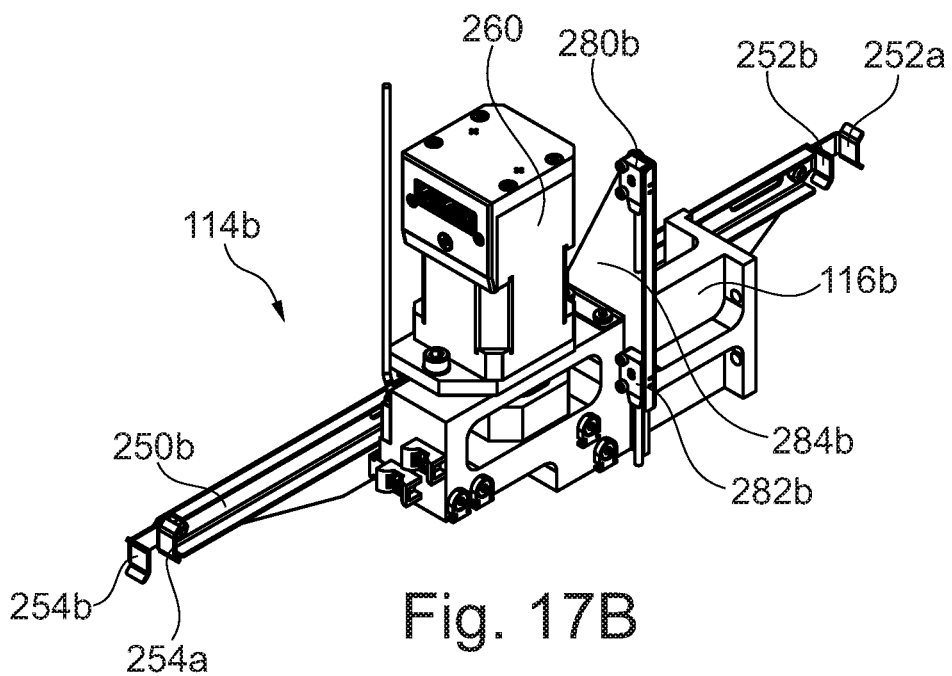
FIG. 17B is perspective view of the interaction device.
Figure 17C:
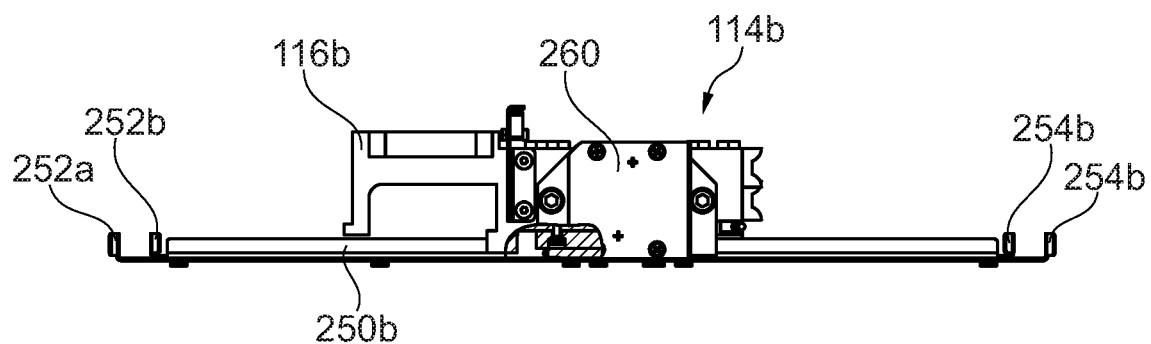
FIG. 17C a top down view of the interaction device.

As shown in FIGS. 16A through 16C, the short holding arm 202 is defined by a sheet metal plate of an appropriate shape which includes a section bent downwardly to provide the engagement section 206. The same is true for the long holding arm 200 which is somewhat longer and which includes, in addition, along its side opposite to the side including the engagement section 204, a section 212 being bent downwardly, as shown in FIGS. 15B, 15D, and 15E, and also illustrated in FIGS. 10 and 11. This section 212 increases the stiffness of the long holding arms 200.

The holding arms are mounted to the respective sleeve member 210 using a plurality of screws, for example, the three screws as shown in FIG. 16A, or other mounting structures. The sleeve members 210, shown in FIG. 16C for example, are able to be made from a suitable plastic material or more preferably from a metallic material, e.g., stainless steel or aluminum, and each include a through opening 214 with an upper radial extension 214a and a lower radial extension 214b, in which a respective ring bearing is mounted that includes an outer ring, associated with and at least in frictional engagement with, the sleeve member 210, and an inner ring, associated with an inner support sleeve 218. The outer rings of the respective two ring bearings support the sleeve member 210 with its holding arm. The inner ring of the lower ring bearing 216b supports the inner support sleeve 218 which supports the inner ring of the upper ring bearing 216a. Preferably, bearing roller elements are provided between the inner ring and the outer ring of the respective ring bearing, so that the outer ring and the sleeve member 210 with the respective holding arm are able to be pivoted on basis of rather low pivoting forces with respect to the inner ring of the ring bearing and the inner support sleeve 218, and with respect to the chassis of the opener apparatus 100 including the four mounting pillars 152a, 152b, 154a, 154b.

Vertically adjacent inner support sleeves 218 of the vertical row of sleeve members 210 mounted to the same mounting pillar are supported on each other by short support sleeve members 220, so that the lower ring bearing 216b of the respective upper sleeve member 210 is supported with its inner ring via the respective short support sleeve member 220 on the inner ring of the upper ring bearing 216a of the respective lower sleeve member 210.

The inner ring of the lower ring bearing 216b of the lowermost sleeve member 210 supporting the lowermost holding arm, being a long holding arm 200 in a case of the set of holding arms shown in FIGS. 15A through 15E, is supported on a support tube or long support sleeve member 222, which is supported on the base plate 104 of the assembled opener apparatus 100, and the inner ring of the upper ring bearing 216a of the uppermost sleeve member 210 that carries the uppermost holding arm, in the present case, a short holding arm 202, carries a support tube or long support sleeve member 224, which is fixed by a clamping ring 226, which is clamped to the mounting pillar or support beam of the respective set of holding arms, namely the mounting pillar 152a or 154a as shown in FIGS. 15A through 15E.

The mounting pillar or support beam extends through the vertically aligned elements, namely through the upper support tube 224, the upper and lower ring bearings 216a and 216b, and the respective support sleeves 218 of each sleeve member 210, the short support sleeves 220, and the lower support tube 222. The clamp ring 226 secures these elements in mutual supporting engagement without undue vertical play (undue vertical clearance). Preferably, the support tubes 222 and 224, the support sleeves 218, and the short support sleeve members 220 have identical or substantially identical diameters and the respective mounting pillar extends through these elements snugly or with minor radial play (minor radial clearance), as shown in FIG. 15E, for example.

In order to ensure that the sleeve members 210 and thus also the holding arms 200 and 202 are in one of two defined positions (retracted or release position or inserted or catching position), each of the sleeve members 210 or holding arms 200, 202 are able to include an associated individual interaction device that maintains the holding arms in a current of these two defined positions and, preferably, to bias the sleeve members or the holding arm towards a respective of these two defined positions, the latter at least if the sleeve member or the holding arm has already approached the respective defined position to a certain extent. These interaction devices are able to be defined as magnetic interaction devices. To this end, a slit, e.g., defined by a sector or an opening or other kind of recess is able to be arranged in the respective sleeve member 210 which is able to be confined by soft iron abutment elements 230 which are mounted to the sleeve member 210. The respective mounting pillar, for example, the mounting pillars 152a or 154b shown in FIGS. 15A through 15E, are able to carry a respective permanent magnetic pin 232, which protrudes between these soft iron abutment elements 230, so that either magnetic attraction forces between the left abutment element 230 and the magnetic pin 232 or magnetic attraction forces between the right abutment element 230 and the magnetic pin 232 prevail (e.g., are greater), so that the sleeve member 210 is pivoted towards and maintained in abutment engagement between the respective abutment element 230 and the magnetic pin 232.

Alternatively, the respective pin 232 is able to be a soft iron pin and the respective sleeve member 210 is able to house in a suitable receptacle at least one permanent magnet which is located with a respective end in close proximity to the two abutment elements 230. According to FIGS. 16A to 16C, one such magnet 234 is provided which includes its opposing ends located in close proximity to a respective of the abutment elements 230. Thus, one of the abutment elements 230 will always be attracted by the pin 232, and thus the holding arms 200, 202 are kept in one or the other defined positions, namely the retracted or release position or the inserted or catching and holding position.

According to further preferred embodiments of the present invention, the abutment elements 230 are able to be permanent magnets.

According to the above-described preferred embodiments, the holding arms 200 and 202 of the four vertical sets of holding arms are actuated by the actuator device 114a associated with the holding arms mounted to the mounting pillars 154a and 154b, and by the actuator device 114b associated with the holding arms mounted to the mounting pillars 152a and 152b. As discussed above, these actuator devices define, with the carriage 112, a carriage arrangement which is a movable structure that is moved upwards and downwards by the belt drives described above. Preferably, for proper operation, the respective actuator device actuates a respective holding arm in a manner which is coordinated with the vertical movement of the carriage. However, the number of stacked substrate carriers and the vertical position of the uppermost substrate carrier 12 of a current stack or partial stack supported by the carriage 112 relative to the supporting surface portions 111 of the carriage 112 varies, namely, decreases by each substrate carrier caught by a respective set of four holding arms in the course of the downward movement of the carriage in the opening operation and increases by each substrate carrier restacked in the course of the upward movement of the carriage in the closing operation. Accordingly, an actuating member of the respective actuating device, which acts on a respective of the holding arms or its sleeve members, preferably cannot have the appropriate vertical position for all holding arms of a respective vertical set of holding arms unless a height compensation is provided, which compensates for the subsequent unstacking of substrate carriers from the stack or partial stack of carriers in the course of the opening operation and for the subsequent restacking of substrate carriers on the stack or partial stack of carriers in the course of the closing operation.

In order to compensate for this reduction in the height of the stack of carriers while the stack is moved downwards and one carrier after the other is caught by the respective set of holding arms in the opening process, and correspondingly for this increase of height of the stack of carriers while the stack is moved upwards and one carrier after the other is added as a top carrier of the stack, a electromechanical and/or software controllable solution is able to be adopted. For example, the two actuator devices 114a and 114b are able to include vertically adjustable actuating members, which are moved downwardly relative to the supporting surface portions 111 of the carriage 112 in the course of the opening operation and are moved upwardly with respect to the supporting surface portions 111 in the course of the closing operation. The vertical movement of the respective actuating member with respect to the carriage 112 is able to be controlled by a processor configured or programmed to control a suitable servo drive. However, also a mechanical solution is able to be appropriate, as realized according to the preferred embodiments shown in the figures, for example.

To this end, a respective engagement element 246 associated with each respective cylindrical element (e.g., in the present preferred embodiment, to each respective sleeve member 210) is mounted to the respective sleeve member 210 using a linking element, to assume a particular vertical position with respect to the vertical extent of the sleeve member which depends on the vertical position of the respective sleeve member 210 with its holding arm 200 or 202 in the vertical row of sleeve member mounted to the respective mounting pillar within the opener apparatus, as shown in FIGS. 15A through 15E.

The sleeve members 210 are provided with at least one vertical row of screw holes 240 which enable the respective linking element 242 or 244 to be screw mounted at an appropriate vertical position along the vertical extent of the respective sleeve member 210, so that the respective engagement element is located within the vertical extent of the respective sleeve member, respectively, or below the respective sleeve member or above the respective sleeve member. Therewith, the respective engagement element 246 is able to be held at an appropriate vertical position with respect to the associated holding arm 200 and 202, respectively.

The sleeve members 210 shown in the figures include one vertical row of screw holes 240, however, two parallel rows of screw holes to mount a respective linking element using two screws is appropriate as well, to maintain a proper orientation of the linking element. If one screw is used to mount the linking element, then a form fit engagement between the mounting end of the linking element and a structure of the sleeve member which maintains the linking element in the proper orientation is preferably provided. To this end, the vertical row of screw holes 240 is able to be located in a longitudinal recess of the sleeve member or at the side of a longitudinal ridge or similar of the sleeve member 210, so that the mounting end of the linking element is in form fit engagement with at least one vertically extending surface portion which secures the linking element in the correct orientation. This is the case for the preferred embodiments shown in the figures using such a longitudinal recess, in which the vertical row of screw holes is located.

For sleeve members 210 in an upper range of the vertical row of sleeve members 210 mounted to the respective mounting pillar, the engagement element 246 is held below the respective sleeve member, within the vertical height range of the adjacent sleeve member. This is achieved by a longitudinal linking element 242 of a first kind, which includes a first end portion to screw mount to the respective sleeve member and a second end portion holding the engagement element 246. In a lower range of the vertical row of sleeve members 210, the engagement element of a respective sleeve member 210 is held above the respective sleeve member, within the vertical height range of the adjacent sleeve member. This is achieved again by a longitudinal linking element 242 of the first type, which is mounted to the respective sleeve member in an opposite orientation than in the upper range of the vertical row of sleeve members. In a middle range of the vertical row of sleeve members 210, the respective engagement element 246 is mounted to the respective sleeve member within the vertical height range of this respective sleeve member. This is achieved by a small and short linking element 244 of a second type. These linking elements 242 and 244 are screw mounted to the respective sleeve member 210 using an appropriate selection of the screw holes 240 to position the respect engagement element at the appropriate vertical position.

Accordingly, the vertical position of the respective engagement element 246 relative to the sleeve member 210 to which it is mounted, is shifted systematically in incremental steps along the vertical row of sleeve member 210, and may be located at a maximum distance above the respective sleeve member 210 in the case of the lowermost sleeve member, may be located within the vertical height range of the respective sleeve member in a middle range of the vertical row of sleeve members, and may be located at a maximum distance below the respective sleeve member in the case of the uppermost sleeve member. Therefore, the reduction of the height of the stack of substrate carriers in the course of the opening operation and the increase of the height of the stack of substrate carriers in the course of closing operation is compensated for, so that an actuating member of the respective actuator device 114a and 114b, respectively, is able to be positioned at a fixed vertical position with respect to the supporting surface portions 111 of the carriage 112.

Preferably, the positions of the engagement element 246 with respect to the respective sleeve member 210 reflect the vertical position of a respective actuating member of the respective actuator device relative to the support surface portions 111 of the carriage 112, a vertical dimension of a base (if provided) such as the base 14 of the above preferred embodiments of substrate carriers 10, and the vertical dimensions of the substrate carriers 12. Preferably, if the actuating members of the actuator devices are located at a different vertical position with respect to the carriage 112, then the engagement element 246 would preferably be positioned differently with respect to their sleeve members 210, but the explained staggered vertical positioning including this systematical shifting in incremental steps of the vertical positions would analogously be realized, if such a mechanical compensation of the decreasing and increasing height of the stack of carriers is to be adopted.

According to the present preferred embodiment, the engagement elements 246 are separate elements, for example, cylindrical roller type elements, which are mounted to the respective linking element in a rotatable manner. However, the linking elements and the engagement elements alternatively are able to be sections of integral elements or one-part elements.

Preferably, the engagement elements 246 are made from a plastic material such as polyoxymethylene (POM) or polyethylene terephthalate (PET), and are mounted in a non-rotatable manner to the respective metallic linking element and interact with the metallic actuating member 250a or 250b of the respective actuator device 114a or 114b, so that a pair of a hard material and a softer material is submitted to frictional engagement, to reduce abrasion of particles which could potentially be problematic in the manufacturing of semiconductor circuits. For example, abraded plastic particles, if any, would be less problematic than abraded metallic particles in this respect. Preferably, the actuator devices include actuating members 250a and 250b made from aluminum. However, these actuating members preferably are able to include abutment parts (or alternatively reaction parts, as explained below) made from stainless steel, which interact with the respective engagement element.

In the present case, the engagement elements 246 receive an actuating force directed to pivot the respective sleeve member 210 with its holding arm towards and into the catching and holding position in the course of the opening operation, and receive an actuation force directed towards and into the release position in course of the opening operation. To this end, the actuating member 250a or 250b of the respective actuator device 114a or 114b abuts with an abutting portion or a respective abutting portion of two abutting portions against the engagement elements 246, which correspondingly may be denoted as a counter abutting portion 246 of the respective engagement formation 210, 200 or 210, 202, or as a counter abutting element 246. In order to apply the respective actuating force onto this engagement element or counter abutting element 246, the actuating member needs only to be moved in a transverse direction, and the vertical movement of the actuating device and its actuating member might only be required to bring the actuating member to a vertical position or position range associated with the respective engagement element or counter abutting elements 246, so that the transverse movement of the actuating member is able to bring the actuating member with its abutting portion in abutting engagement with the respective engagement element or counter abutting elements 246, to apply the respective actuating force thereon and therewith on the sleeve member 210 with its holding arm 200 or 202.

As discussed above, there are two actuator devices 114a and 114b located on both sides, in a transverse direction, of the opener apparatus 100, and which actuate the respective two opposing holding arms 200 and 202 at a respective vertical height of the opener apparatus at the respective opener side using an elongated actuating member 250a and 250b, respectively. The actuating device, which is explained further in the following on the basis of FIGS. 17A through 19C showing the actuating device 114b, includes an electromechanical drive such as a solenoid drive, a servo motor or stepping motor or the like, or alternatively another kind of drive, e.g., a pneumatic drive. The drive moves the actuating member 250b (or correspondingly the actuating member 250a) in either of two opposing transverse directions, to bring the respective holding arms from the release position into the catching position on the basis of a movement of the actuating member in a first transverse direction, and to bring the holding arms from the catching position into the release position on basis of a movement of the actuating member in a second transverse direction, which is opposed to the first transverse direction. To this end, the actuating member includes a respective pair of abutment portions 252a, 252b and 254a, 254b respectively, on both of its ends, and one abutment portion of the respective pair of abutment portions (in the present the abutment portions 252b and 254b) abuts against the respective engagement element or counter abutting element 246 to pivot the respective holding arm towards and into the catching and holding position, and the other of these abutment portions (in the present case the abutment portions 252a and 254a) abut against the respective engagement element or counter abutting element 246 to pivot the respective holding arm towards and into the release position.

Accordingly, to enable this engagement with the respective engagement element or counter abutting elements 246, the two pairs of abutting portions are positioned on opposing transverse sides of the respective engagement element 246, which is done by an appropriate transverse movement of the actuating member in the course of the vertical movement of the respective actuator device together with the carriage 112. As shown in FIG. 19A, the abutting portions 252a, 252b, 254a and 254b include upper and lower inclined straddling sections, which assist the respective engagement element or counter abutting elements 246 of the respective sleeve member 210 to assume a straddled position between the two abutment portions of the respective pair, to receive the actuating force using the respective transverse actuating movement of the actuating member.

The overall movement of the actuating member in the course of the opening or the closing process is a zig-zag movement, for example. In the opening process, along with the downward movement of the carriage 112, the actuating member 250a, 250b moves in the first transverse direction to bring a pair of holding arms into the catching position, the actuating member then moves back in the second transverse direction to prepare for the interaction with the adjacent lower pair of holding arms, and then to move again in the first transverse direction when the actuating member has reached with the carriage the appropriate vertical position to bring this pair of adjacent lower pair of holding arms in the catching position, and so forth, and a corresponding reversed zig-zag movement of the actuating member, along with the upward movement of the carriage 112, is necessary in the closing process.

Preferably, it would be sufficient if the actuating member includes only one respective abutment portion at its two ends, so that the actuating member would abut with one side of the respective abutment portion against the respective engagement element or counter abutting element 246 in the opening process and with the other side of the respective abutment portion against the respective engagement element or counter abutting element 246 in the closing process.

FIGS. 18(A), 18(B), and 18(C) show sectional top down views of the actuator device 114b without a motor casing 260 (with the motor casing being unmounted from the mounting body 116b). The motor casing preferably includes a stepping motor, but a servo motor may be appropriate and favorable as well. An output shaft 262 of the motor is shown as a section, together with an output lever 264 and an output roller 266 mounted rotatable to the output lever eccentrically with respect to the output shaft. The output roller 266 is in rolling engagement with a circular roller lane that defines a circular opening 268 of the mounting body 216b and engages into a horizontal slit 270 of a shifting portion 272, which is supported slidably within the mounting body 116a and to which the actuating member 250b is attached, as shown in FIG. 19B. Accordingly, by rotating the output shaft 262 with the output lever 264 in the same direction, the actuating member 250b is able to be moved back and forth in the transverse direction. It is not ruled out that the output shaft 262 with the output lever 264 is rotated by the motor in alternating directions in the course of the operation of the opener apparatus. This may alternatively be achieved by a simpler realization of an eccentric drive that obtains a transverse movement on the basis of a rotational drive force.

According to FIG. 18(A), the actuating member 250b assumes a middle or reference position. The actuator device preferably includes a sensor arrangement that detects at least the presence of the actuating member in this middle or reference position or the passing of the actuating members through this middle or reference position. For example, an inductive sensor 274 may be provided on the side of the mounting body 116b, which may respond to a magnetic element mounted to the shifting portion 272 or the actuating member 250b, or may respond to some other structure which moves transversely with the actuating member. Certain inductive sensors, such as sensors of a high frequency oscillator type, preferably do not require a dedicated magnetic element as a counter-part but respond to the presence or non-presence of metallic material in the vicinity.

According to the FIG. 18(B), the output lever 264 is rotated about 140 degrees in a counter clockwise direction and according to FIG. 18(C) the output lever is rotated about 320 degrees in the counter clockwise direction, for example, in both cases with respect to the lever position according to FIG. 18(A). According to FIG. 18(B), the actuating member 250b has substantially been moved in the direction to bring the holding arms in the catching and holding position, and according to FIG. 18(C) the actuating member 250b has substantially been moved in the direction to bring the holding arms into the release position.

The sensor arrangement is able to detect the presence of the actuating member in any appropriate position thereof or is able to continuously sense the transverse movement and the respective current transverse position of the actuating member, if desired.

Figure 24A:
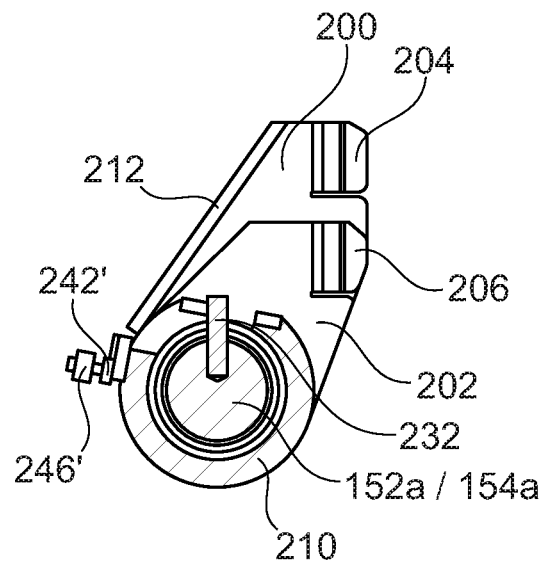
FIG. 24A is a sectional downward view of the mounting pillar analogous to FIG. 15E, and shows alternate engagement formations of a first and second type mounted to the mounting pillar, according to a variant of an exemplary preferred embodiment of the opener apparatus.
Figure 24B:
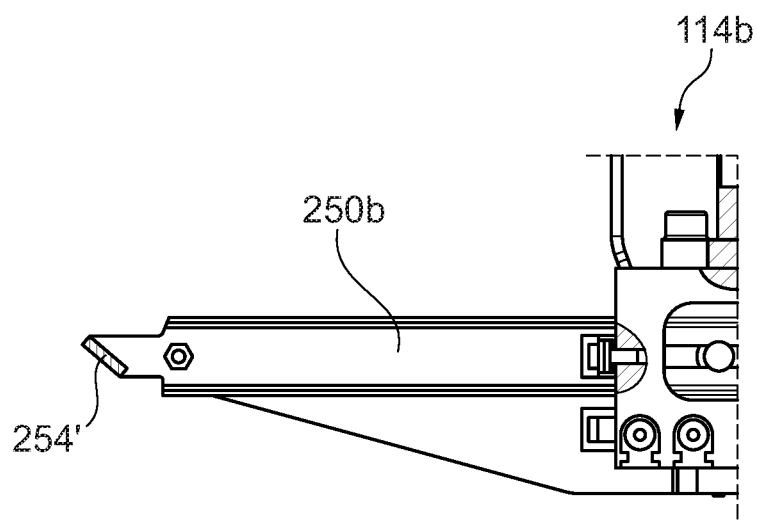
FIG. 24B is a partial side view, substantially analogous to the view of FIG. 17A, of an actuating member of an alternate moveable interaction device of a variant of the opener apparatus.
Figure 25:
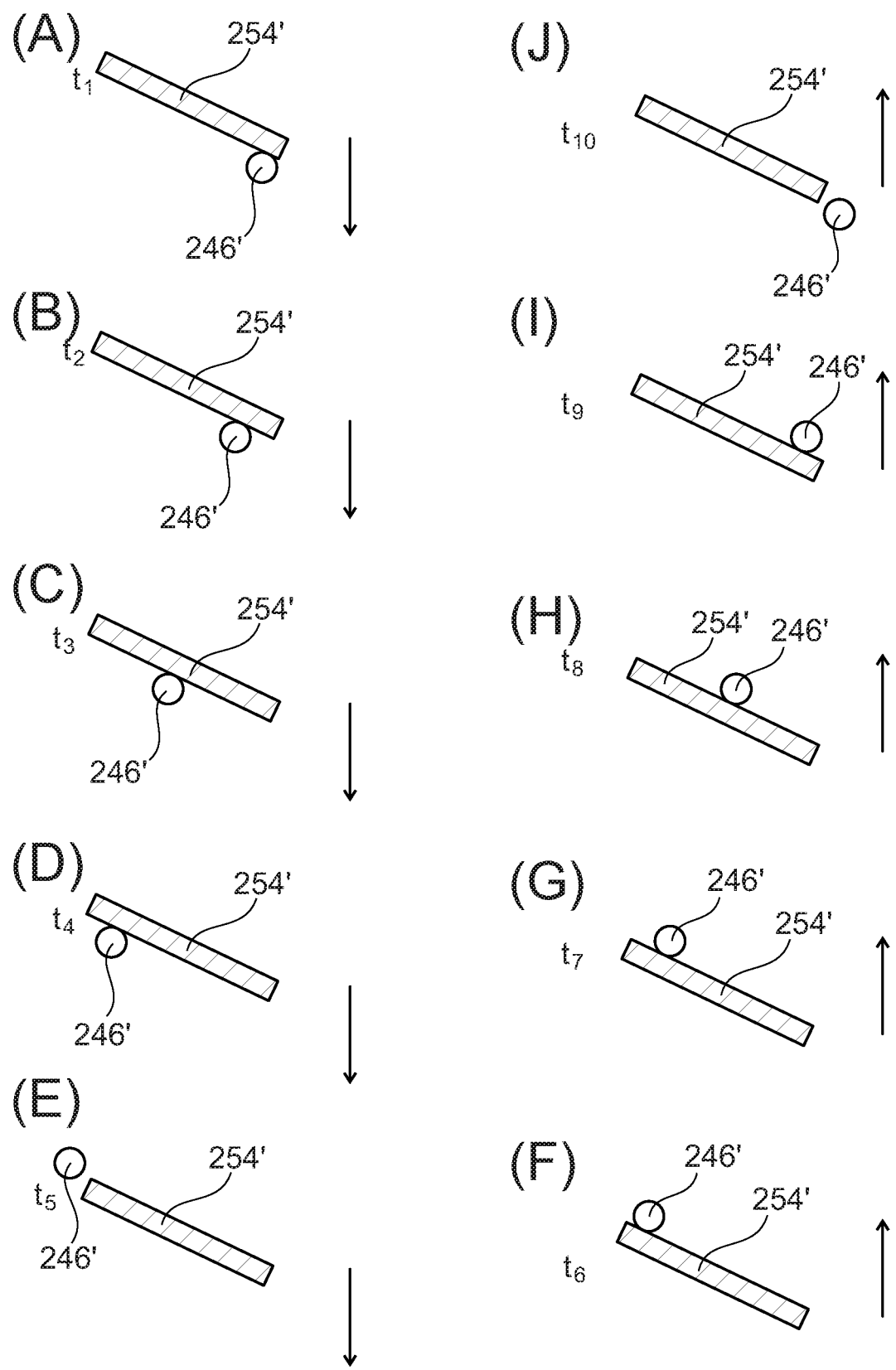
FIG. 25 schematically illustrates the interaction of the actuating member according to FIG. 24B with engagement formations according to FIG. 24A in the course of an opening operation and a closing operation of the variant of the opener apparatus, wherein partial FIGS. 25(A) through 25(E) correspond to a time sequence of interaction states in the course of the opening operation and partial FIGS. 25(F) through 25(J) correspond to a time sequence of interaction states in the course of the closing operation.

Differing in structural features only slightly from the preferred embodiment discussed above, another solution is feasible, which avoids the repeating zig-zag movements of the actuating member and is shown and illustrated in FIGS. 24A, 24B, and 25. According to this variant, slanted engagement surfaces or edges are provided at the two ends of the actuating member, namely at least one or at least one pair (in particular at least one upper engagement surface or edge and one lower engagement surface or edge) for each engagement element of the cylindrical elements or sleeve members 210 or—more generally—of the holding arms 200 and 202. These slanted engagement surfaces are brought using the respective actuator device either in an opening position to bring the holding arms into the catching position in the course of the downward movement of the opening process or in a closing position to bring the holding arms into the release position in the course of the upward movement of the closing process.

For opening, a first slanted surface slanted in a first direction is moved along the engagement elements on a first side thereof downwards to apply pivot forces in the direction of the catching position via the respective engagement element to the respective holding arm, as shown, for example, in FIG. 25(A) through FIG. 25(E). For closing, a second slanted surface slanted in a second direction basically corresponding to the first direction is moved along the engagement elements on an opposing second side thereof upwards to apply pivot forces in the direction of the catching position via the respective engagement element to the respective holding arm, as shown, for example, in FIG. 25(F) through FIG. 25(J). These pivoting forces are derived from the engagement of the respective slanted surface with the first or second side of the respective engagement element while the slanted surface moves downward or upward with respect to the engagement element associated with the respective holding arm, due to a kind of a cam and cam follower interaction. The slanted engagement surfaces are able to be held somewhat elastic to compensate for alignment errors.

FIG. 24A is a modified version of FIG. 15E, which shows that the sleeve member 210 includes a different kind of engagement element 246', which is mounted to the sleeve member using a suitable linking element such as linking element 242' shown in FIG. 24A. The engagement element 246' is able to be defined by a roller element having a rotational axis orthogonal with respect to the rotational axis of the sleeve members. The slanted engagement surfaces of the actuating member of the respective actuating device may be provided by a respective portion of the actuating member 250b, which may be denoted as a reaction portion instead of an abutting portion. FIG. 24B shows reaction portion 254' replacing abutment portions 254a and 254b, and the abutment portions 252a and 252b at the other end of the actuating member 250b may be replaced by a corresponding reaction portion including correspondingly inclined upper and lower engagement surfaces, which interact with the respective engagement element 246' of the respective sleeve member 210, which may be denoted as a counter reaction portion or counter reaction element of the respective sleeve member 210.

The replacement of the counter abutting elements 246 by the counter reaction elements 246', and the replacement of the two pairs of abutment portions 252a, 252b and 254a, 254b by a respective reaction portion like the reaction portion 254' for both actuator devices 114a and 114b, are preferably the only structural differences between the opener apparatus shown in FIGS. 10 through 23J and the variant of the opener apparatus illustrated in FIGS. 24A and 24B. However, this variant enables a substantial different kind of interaction of the respective actuator device 114a and 114b with the respective engagement formations, namely the sleeve members 210 with the holding arms 200 and 202 via the respective reaction portion of the actuating member 250a and 250b and the counter reaction portion or counter reaction element 246' of the sleeve member 210, as illustrated in FIG. 25(A) through FIG. 25(E) for the opening process and FIG. 25(F) through FIG. 25(J) for the closing process.

FIG. 25(A) through FIG. 25(J) illustrate and represent a respective interaction state at a respective time of subsequent points of time t1 to t10. For the opening process and the closing process, the respective reaction portion 254' preferably is only brought in an appropriate position vertically aligned with the counter abutting portion 246' near one end of the reaction portion 254' for the opening process and near the other end of the reaction portion 254' for the closing process.

For the opening process, the reaction portion 254' preferably is brought into a position which is vertically aligned with the counter reaction elements 246' in their positions corresponding to the release or the retracted position of the respective holding arm. The downward movement of the reaction portion together with the respective actuator device caused by the downward movement of the carriage 112 brings the lower surface of the reaction portion 254' into engagement with the respective counter reaction element 246' (FIG. 25(A), t1), and the further downward movement of the reaction portion 254' causes an actuation force directed towards the catching and holding position to be applied to the counter reaction element 246', which causes the transverse movement, more particularly, pivoting movement of the counter reaction element 246' together with the respective sleeve member 210 and the respective holding arm 200 or 202, which is shown in FIG. 25(B) through 25(E). In FIG. 25(E), the counter reaction element 246' has reached its target position corresponding to, or very near to, the position it assumes when the respective holding arm has reached its holding and catching position. In this respect, it is to be noticed that the individual interaction devices, e.g., defined by the explained magnetic interaction devices, are able to affect the final movement of the respective holding arm into the catching and holding position.

For the closing process, the reaction portion 254' preferably is brought into a position in which it is vertically aligned with the counter reaction elements 246' in their positions corresponding to the catching and holding position of the respective holding arm. The upward movement of the reaction portion 254' together with the respective actuator device and the carriage 112 brings the upper surface of the reaction portion 254' into engagement with the respective counter reaction element 246' (FIG. 25(F), t6), and the further upward movement of the reaction portion 254' causes the transverse movement, more exactly pivoting movement of the counter reaction element 246' together with the respective sleeve member 210 and the respective holding arm 200 or 202, which is shown in in FIGS. 25(G) through 25(J). In FIG. 25(J), the counter reaction element 246' has reached its target position corresponding to, or very near to, the position it assumes when the respective holding arm has reached its release position. In this respect, it is to be noticed that the individual interaction devices, e.g., defined by the explained magnetic interaction devices are able to affect the final movement of the respective holding arm into the release position.

What is schematically illustrated in FIG. 25(A) through FIG. 25(J) is effected with respect to all counter reaction elements and with respect to all sleeve members with their respective holding arm of all four vertical sets of holding arms mounted to the four mounting pillars in the course of the opening process and in the course of the closing process, respectively.

According to this variant, a simple control of the movement of the actuating members 250a and 250b of the two actuator devices 114a and 114b is sufficient, since the respective actuating member preferably is to be brought selectively only into one of two alternate operating positions, one being the opening position and the other being the closing position.

FIG. 26 shows a close-up view of the holding arms 200 and 202 with their respective sleeve member 200 according to a variant of the opener apparatus 100. For simplicity, the same reference signs for identical and analogous elements are used. According to this preferred embodiment, the sleeve members 210 are provided with two parallel rows 240a and 240b of screw holes to mount the respective linking element, in FIG. 26, for example, long linking elements 242 that mount the respective engagement element 246 so as to be located above the sleeve member to which the engagement element is attached.

The radially projecting abutment pins 232 that are mounted to the mounting pillar and interact magnetically with the abutment elements 230 are arranged between the two abutment elements 230 of a respective sleeve member 210, as discussed above. These elements define the two operational positions of the respective sleeve member and of the respective long holding arm 200 or short holding arm 202.

The holding arms 200 and 202 differ from the holding arms considered in the preceding description in that each holding arm includes a respective through hole 203. In the case that all holding arms assume the same operational position, e.g., either of the catching and holding position or the release position, all of the through holes 203 are aligned such that a light beam emitted by a light beam sensor arrangement is able to be transmitted through all of the through holes 203 without being interrupted. Therewith, a controller of the opener apparatus 100 is able to be configured or programmed to detect that all of the holding arms assume this same operational position.

Preferably, at least the correct positioning of all of the vertically staggered holding arms in the release position is able to be detected by an appropriately positioned light beam sensor arrangement that provides a light beam which is transmitted vertically through the through holes 203, if all the holding arms assume this release position. However, if the light beam is interrupted by one or a plurality of the holding arms that are not assuming the release position, then the carriage 112 with the associated actuator device 114a or 114b is able to be operated to bring all of the holding arms in the release position, to prepare for a new opening process with respect to a substrate carrier stack to be effected.

Preferably, it is possible to provide two such light beam sensor arrangements with respect to each of the four vertical rows of holding arms of the opener apparatus 100, one to detect that all of the holding arms assume the release position and the other to detect that all of the holding arms assume the catching and holding position. The respective light beam is able to be transmitted through the through holes 203 of all of the holding arms in these two conditions of the respective vertical set of holding arms.

In FIG. 26, the holding arms are shown to assume the release position in which the holding arms do not engage or engage only slightly in the respective horizontal slit 207 of the partition panel 164a. Further, the engagement or abutment end of the actuating member 250a of actuator device 114a is shown. By moving the carriage 112 a short distance upwardly, the adjacent engagement element 246 is located between the two abutment portions of this engagement or abutment end, so that the long holding arm 200 of the associated sleeve member 210 is able to be actuated to assume the catching and holding position, by appropriately operating the actuator device 114a.

The opener apparatus 100 may include at least one light beam sensor, e.g., an upper and a lower light beam sensor, which moves upward and downward with the carriage 112. In the opening process, the light beam of a respective light beam device passes downward along the substrate (e.g., a wafer) of a respective caught substrate carrier and the caught substrate carrier itself, and in the closing process, the light beam of a respective light beam device passes upward along the next substrate carrier to be released and taken up and the substrate (e.g., a wafer) of this substrate carrier, and these elements are able to give a particular signature in an output signal of the (respective) light beam sensor to monitor the correct course of the opening and closing process and whether the substrates are located correctly in place and are not broken.

The opener apparatus 100 according to the preferred embodiments and variants referred to so far includes at least one pair of light beam sensors or light barrier sensors including an upper sensor and a lower sensor which are directly or indirectly mounted to a respective of the two actuator devices 114a and 114b. The actuator device 114b is provided with such a pair of sensors, namely an upper sensor 280b and a lower sensor 282b, which are mounted to the mounting body 116b using a holder 284b which extends in a vertical direction, so that the two sensors are vertically displaced with respect to each other. The lower sensor 282b is located at about the same vertical height as the actuating member 250b and the upper sensor is located substantially displaced upwardly with respect to the lower sensor. These sensors are able to be reflective sensors including a light transmitting circuit and a light receiving circuit integrated in one element. For example, FIGS. 17A and 17B indicate the presence of a light output and a light input slightly vertically displaced with respect to each other for both sensors 280b and 282b. In this case, for example, no associated elements on the side of the other actuator device 114a are required, however, a similar pair of sensors of the reflective sensor type may be provided on the side of the actuator device 114a as well. This is indicated by the presence of the sensor holder 284a and 284b adjacent to the motor casings of the respective actuator device 114a and 114b on both sides of the carriage 112, as shown in FIGS. 12 and 13.

Alternatively, one of the holders is able to mount an upper light transmitter and the other of the holders is able to mount an upper light receiver, and one of the holders is able to mount a lower light transmitter and the other holder is able to mount a lower light receiver, which define an upper light beam or light barrier sensor of the one way type and a lower light beam or light barrier sensor of the one way type. This realization of these light beam sensors or light barrier sensors provides a reliable detection and monitoring of the substrate carriers 12 and the substrates 30.

By providing at least one upper sensor and at least one lower sensor, the varying height of the stack of substrate carriers that moves upwardly and moves downwardly on the carriage 112 is able to be accounted for by switching from the upper sensor to the lower sensor in the course of the downward movement of the opening process and by switching from the lower sensor to the upper sensor in the course of the upward movement of the closing process. The vertical positions of the two sensors are appropriately selected relative to the support surface portions 111 of the carriage 112 and with respect to the vertical positions of the substrate carriers and the substrates held by the substrate carriers in the opened or unstacked positions, when the substrate carriers are held by the holding arms 200 and 202. If even higher stacks of substrate carriers are to be handled by the opener apparatus and at least partially opened and closed, more than two such sensors on a respective side of the carriage are able to be provided, appropriately vertically displaced with respect to each other.

The light beam sensors enable monitoring the opening and the closing process favorably, including the correct positioning and condition of the substrates (e.g., semiconductor wafers).

Further, to monitor the operations of the opener apparatus 100, the carriage 112 may be provided with at least one sensor, which is adapted to sense the presence and correct positioning of a substrate carrier stack on the supporting surface portions 111. For example, an inductive sensor 290 may be provided in a suitable receptacle of the carriage and be adapted to respond to a magnetic element or metallic element integrated in or mounted to the base of a respective substrate carrier stack, or may be adapted to respond to the base if made from a metallic material, such as stainless steel or aluminum, for example. The carriage 112 may further include one or a plurality of positioning or centering elements, e.g., centering protrusions 292, which engage with appropriate positioning or centering elements, e.g., centering openings or centering recesses, of a base of a respective substrate carrier stack. In this respect, the carriage 112 according to FIGS. 14A and 14B and the other figures is only an example and it is based on a design of the base and variants thereof as well as on a design of the support section or gripper of a handling device or robot arm arrangement that loads and/or unloads a substrate carrier stack onto or from the carriage 112.

For example, the base may include a plane lower surface, for example, like the base 14 shown in FIGS. 6, 7A, and 7B. In this case, there is a rather large vertical gap between the lower surface of the base 14 supported on the supporting surface portions 111 of the carriage 112 and the upper surface 113 of the central plate-shaped portion of the carriage. However, alternatively, the base may include structures at its lower side which protrude downwardly with respect to those surface portions of the base which will be supported on the supporting surface portions 111 of the carriage. These structures, which would be accommodated in this gap resulting from the vertical displacement between the upper surface 113 and the supporting surface portion 111, are able to connect purging gas supply and discharge lines with purging gas distributing structures of the base. A purging treatment of substrates stored in the closed substrate carrier stack may be provided when the substrate carrier stack is stored in a stocker arrangement, e.g., a stocker arrangement of one of the clean room facilities described above. The carriage 112 is also able to have a different design in order to support other kinds of bases, if desired. Further, this gap enables an appropriate engagement between the base and a support section or gripper of a handling device or robot arm arrangement as discussed above.

The two actuator devices 114a, 114b and the sensors discussed above are connected with associated control and an electrical energy supply by appropriate electrical wiring. Preferably, all electrical wiring is led to the carriage arrangement in one wiring bundle on one side of the opener apparatus 100. The wiring bundle is able to be protected within a so-called energy chain or e-chain 294, which includes one end mounted to the chassis of the opener apparatus and the other end directly or indirectly mounted to the mounting body of an actuator device, in the present case, the mounting body 116b belonging to actuator device 114b, using appropriate components, as shown in FIGS. 23A and 23C, for example. As shown in FIG. 14B, the carriage 112 may be provided on its lower side with cover plate elements, which cover spaces or channels through which electrical wirings is able to be led to connect the actuator device and the sensors located on the other side of the upper surface 113.

The opener apparatus 100 preferably may be provided with at least one sensor to sense a current vertical position of the carriage 112. For example, the driving shaft 140 of the two belt drives associated with the carriage 112 or the output shaft of the servo motor 136 are able to be provided with a rotary encoder, since the movements of the carriage 112 up and down is reflected by revolutions and revolution angles of the driving shaft and the output shaft. However, instead of such indirect measurements of the actual vertical position of the carriage and its vertical movement up and down, direct measurements are also feasible. To this end, an optical sensor is able to be used to measure the vertical distance between a respective sensor and a reference element or reference surface portion of the carriage arrangement. In particular, at least one optical distance sensor, e.g., a so-called diffuse sensor including the emitter and receiver located in the same housing, is able to be mounted to the chassis or one of the other stationary components of the opener apparatus, including as a reflecting target a portion of the carriage arrangement, e.g., a portion of one of the actuator devices or components mounted or belonging thereto. For example, such an optical distance sensor is able to be mounted to one of the partition panels 140a and 140b in an upper region thereof and is able to have associated as a reflecting target the actuating member 250b of actuator device 114b or the actuating member 250a of actuator device 144a. Electrical wiring connecting this sensor with an appropriate electrical energy supply and controller and other needed electrical wiring is able to be led through the opener apparatus 100 and along components thereof and fixed to such components at suitable locations using cable connectors and cable retainers. One such cable connector or cable retainer 298 is shown in FIG. 23B, for example.

Such an optical distance sensor allows exact sensing of the current vertical position of the carriage 112 and of its upward and downward movement in the course of the opening process and the closing process effected by the opener apparatus 100. A rotary encoder is a good alternative to allow an indirect but nevertheless sufficiently exact sensing of the current vertical position of the carriage 112 and of its upward and downward movement in the course of the opening process and the closing process, and is able to provide dynamic sensing of the current vertical position and the movements. Therewith, the carriage 112 is able to be brought sufficiently to an exact upper loading and unloading position in which a respective substrate carrier is able to be loaded on the carriage and is able to be unloaded from the carriage, and the carriage is able to be appropriately moved downward in the opening operation, and the downward movement is able to be appropriately stopped, when the carriage has reached a lower operational position, e.g., a position corresponding to, or near to, a lower limit position, and the carriage is able to be appropriately moved upward back to the upper loading and unloading position and also further upwards to an upper receiving position, if provided. Further, if the holding arms are actuated individually using a respective individual actuator mounted to the chassis instead of the movable actuator devices 114a and 114b, these individual actuator devices are able to be controlled appropriately to actuate the holding arms coordinated with the downward movement of the carriage and coordinated with the upward movement of the carriage on the basis of the vertical position and movement data provided by the vertical distance sensor or rotary encoder indicating the current vertical position of the carriage 112.

So far, it has been assumed that the opener apparatus 100 includes only one upper loading and unloading position for a respective substrate carrier stack, which corresponds to an upper operational position of the carriage 112 in the opener apparatus. This upper operational position of the carriage enables a substrate carrier stack to be loaded on the carriage through the loading and unloading port on the second side of the opener apparatus and to be unloaded from the carriage 112 through this loading and unloading port. This upper operational position of the carriage 112 is able to be appropriately denoted as a loading and unloading position of the carriage.

However, further advantages are able to be achieved, if a substrate carrier stack is able to be loaded through the loading and unloading port to be held within the opening apparatus 100 independently of the carriage 112, at an auxiliary holding position above a substrate carrier stack currently loaded on the carriage, when the carriage assumes the upper operational position which enables an unloading of a respective substrate carrier stack from the carriage and which enables, in principle, a loading of a respective substrate carrier stack on the carriage.

This ability to load a substrate carrier stack into the opener apparatus 100 independently of the carriage 112 enables a new substrate carrier stack to be loaded into the opener apparatus 100 in a first operational step before the previous substrate carrier stack, on which the opening and closing processes have already been effected, is unloaded from the carriage 112 in a second operational step.

Accordingly, after loading the new substrate carrier stack into this auxiliary holding position within the opener apparatus 100, the previous substrate carrier stack is then able to be unloaded from the carriage 112 in its upper unloading position and returned to a loading place in a stocker arrangement or the like. The carriage 112, which is now free to carry the new substrate carrier stack, is able to then be moved upwardly towards the upper receiving position already mentioned into supporting engagement with the new substrate carrier stack, in particular, its base. The new substrate carrier stack is then able to be released by associated a holder that defines the auxiliary holding position, and then the carriage with the new substrate carrier stack is able to be moved downwardly to effect the opening operation and is then able to be moved upwardly again to effect the closing operation and to subsequently unload this substrate carrier stack from the carriage 112.

Before this substrate carrier stack is unloaded from the carriage, already the next substrate carrier stack is able to have been loaded into the opening apparatus 100, to be held using the holder. A corresponding handling or robot arm arrangement, which transfers the substrate carrier stacks between the loading and unloading port of the opening apparatus and a stocker arrangement or the like, is able to load a new substrate carrier stack into the opener apparatus 100 and unload the previous substrate carrier stack from the opener apparatus within one workflow. There is no need to enter the next substrate carrier stack into the loading and unloading port of the opening apparatus only after the unloading of the previous substrate carrier stack from the loading and unloading port. The next substrate carrier stack is able to already be submitted to the opening process while the previous substrate carrier stack is returned to the stocker arrangement or the like. Therefore, the throughput of substrate carrier stacks through the opener apparatus 100 is able to be substantially increased.

The opener apparatus 100 and its variants shown in the preceding figures enables an additional or auxiliary upper loading position for a respective substrate carrier stack which shall be submitted to the opening and closing operations. To this end, the opener apparatus 100 includes four electromagnetic actuators 300, preferably solenoid actuators 300, which are mounted in a pivotable manner to the chassis of the opener apparatus in an upper region thereof. Two such electromagnetic actuators 300 are provided on the third side and two such electromagnetic actuators 300 are provided on the fourth side of the opener apparatus, at the outside of the respective partition panel 164a and 164b, as shown in FIGS. 10 and 11.

The electromagnetic actuator 300 located on the third side near the first side of the opener apparatus is shown in the partial close-up side view of FIG. 27, together with an adjacent reflective optical sensor 296, e.g., a reflective light beam sensor, in particular, a so-called diffuse sensor or diffuse reflective sensor 296, which is mounted to the partition panel 164b.

An output rod 320 of the actuator 300 is linked in a pivotable manner to a respective hook-shaped holding element 322, eccentrically with respect to a pivoting support 324 of the holding element 322, which will be denoted as holding hook 322 in the following, although the holding element is able to be alternatively shaped differently and movable in a different manner.

According to the present preferred embodiment, the respective holding hook 322 is able to be pivoted between a holding position, in which a holding portion 326 of the respective holding hook 322 extends through a vertical slit 328 in the respective partition panel 164b into the inner space of the opener apparatus 100, to support the next substrate carrier stack, and a release position, in which the holding hook 322 does not extend through the respective vertical slit 328 into the inner space or extends less through the respective vertical slit 328 into the inner space. FIG. 27, and FIG. 28, which is a view of the inner side of the respective partition panels 164b, show the holding hooks 322 on this side of the opener apparatus 100 to assume the holding position. The respective electromagnetic actuator 300 preferably is not energized in this position. Biasing springs, which are able to be integrated into the actuators 300, bias the respective holding hook 322 via the output rod 320 towards and into the holding position. Opposing holding hooks 322 with their holding portions 326 protruding in the inner space are also shown in FIG. 23H.

Energizing the actuator 300 causes the output rod 320 to move towards the holding hook, substantially in, or slightly inclined with respect to, the downward direction, so that the holding hook 322 pivots by approximately 90°. Therefore, the holding portion 326 pivots in a substantially upward direction out of the inner space, until the holding hook assumes its release position. Alternatively, different kinetics of a hook-shaped holding element or other kind of holding elements, e.g., which involve holding portions that pivot substantially in a downward direction out of the inner space until the respective holding element assumes its release position, are able to be used.

A substrate carrier stack, which had been supported by these two holding hooks on this side of the opener apparatus and the corresponding two further holding hooks on the opposing side of the opener apparatus, will now, after the release by the holding hooks, be supported by the carriage 112 which had been moved upwardly into the supporting engagement. Subsequently, the next opening and closing process is able to be effected.

As described above, there are two such holding hooks 322 that extend into the inner space with a respective holding portion 326 in the holding position on the third side, as shown in FIG. 11 for example, and there are two such holding hooks 322 that extend into the inner space with a respective holding portion 326 in the holding position on the fourth side of the opener apparatus, as shown in FIG. 10, for example, so that a respective new substrate carrier stack is able to be securely held in the upper or auxiliary loading position within the opener apparatus. However, alternatively, different holding structures are able to be provided to achieve the benefit of the additional upper or auxiliary holding position to submit a respective substrate carrier stack to the opening and closing processes.

The view on the inner side of the partition panels 164b on the third side of the opener apparatus shown in FIG. 28 further illustrates that a sensing light beam 330 is transmitted through an opening 332 in the partition panel which is emitted by the light beam sensor 296 on the other side of the partition panel. This light beam sensor 296 is provided to detect the presence of a new substrate carrier stack held by the holding hooks 322, which is able to be submitted to the opening and closing process.

A further such light beam 334 is shown below the light beam 330 and is emitted through a further opening 336 in the partition panel. This light beam is emitted by a further such light beam sensor 297 shown in FIG. 11, which is mounted to the same partition panel 194b and detects the presence of a substrate carrier stack being supported on the carriage 112 in the upper operational position serving as an unloading position. In practice, this will be a substrate carrier stack on which the opening and closing processes has already been completed and which shall be returned to the stocker arrangement or the like. The light beams 330 and 334 are also illustrated in FIG. 10.

The sensors, which send their signals indicating a presence or a non-presence of a respective substrate carrier stack at the respective position within the opener apparatus 100 to a controller of the opener apparatus (such as the controller 340 schematically shown in FIG. 37), enable a proper operation of the opener apparatus with high throughput of substrate carrier stacks.

Preferably, in order to avoid damage of components in the case of a malfunctioning of the belt drives and the associated controller that controls the upward and downward movement of the carriage 112, the opener apparatus may include one or a plurality of rubber bumpers in an upper region and/or in a lower region of the opener apparatus 100. Such rubber bumpers may be included in an emergency cutout of the belt drives, so that an abutment of at least one suitable portion of the carriage arrangement against at least one such rubber bumper causes an interruption of the power supply to the servo motor 136.

Preferably, the opener may be provided on the first side above, or in an upper region of, the loading and unloading port for the substrates with an ionizer device 302, which eliminates or significantly reduces static electricity in the region of this unloading and loading port. To this end, ions are generated and emitted to approach an ion equilibrium and, preferably, to obtain and maintain an ion equilibrium. The ionizer device 302 is supplied with electrical energy and clean dry air, in particular, pressurized clean air. An associated magnetic valve 304 of a pressurized clean dry air supply is shown in FIG. 22B. The ionizer device 302 may include at least one feedback sensor, which is able to be located at an appropriate position within the loading and unloading port. The opener apparatus may further include an ionizer device on the second side of the opener apparatus, associated with the loading and unloading port for the substrate carriers.

Concerning the placement of the opener apparatus 100 in a semiconductor fabrication plant or similar, e.g., in a clean room facility as described above, the opener apparatus may be placed on a support structure including at least one channel that accommodates electrical wiring and supply lines, including possibly at least one pressurized clean air supply line, towards and into the opener apparatus. To this end, the opener apparatus includes a through opening 306 in its base plate 104, which will be positioned on the support structure with suitable registration of the through opening 306 and a through opening of the support structure. The through opening 306 in the base plate or other through openings of the base plate may also discharge purging air from the opener apparatus via the at least one channel or dedicated purging channels of the support structure.

In order to achieve a proper purging of air from the opener apparatus 100 with a purging air flow downwardly towards the base plate and into such a channel or the like of the support structure, suitable fans or blowers may be provided. Preferably, at least one such fan or blower respectively is mounted to the base plate 104 on the third side and on the fourth side of the opener, outside of the respective partition panels 164a and 164b, and preferably also on the second side of the opener apparatus, outside of the partition panel 180, so that abraded particles caused by, for example, abrasion due to the mechanical interaction of components of the opener apparatus, such as of the belt drives, and, in particular, resulting from the interaction between the actuating members with the engagement elements 246 and 246' of the holding arms 200 and 202, are kept away from the inner space of the opener apparatus, where the substrates are accessible in the opened or partially opened state of the respective substrate carrier stack. In view of keeping such abrasion particles away from the substrates, the engagement elements 246 of the holding arms 200 and 202 of the opener apparatus 100 are able to be located relatively far away downwardly from the vertical position of the respective substrate held within the seat of a respective substrate carrier supported in the opened condition by the set of four holding arms. This is achieved by the explained design of the holding arms together with their sleeve members and the linking elements holding a respective engagement element as well as by appropriately designing the substrate carriers including substrate holding arms extending upwardly from a substrate carrier frame being supported on the holding arms of the opener apparatus.

In the present preferred embodiment, the opener apparatus includes three such fans or blowers, including one on each of the three sides of the opener apparatus, externally to the respective partition panel. These fans or blowers 308a, 308b, and 308c are able to be axial fans or axial blowers, for example. In this case, the fans or blowers are mounted to the base plate 104, aligned with a respective through hole below the respective fan or blower, to discharge purging air via the respective through opening into and via the support structure on which the opener apparatus 100 is placed. Alternatively, these fans or blowers may be radial fans or blowers, which discharge purging air sideways through an opening in the respective partition panel into the space of the opener apparatus below the sheet metal plate 142, which is shielded from the environment also by sheet metal faceplate 160 and the partition panels. In this case, the purging air may be discharged via the through opening 306 of the base plate 104 into and via the support structure.

Accordingly, the opener apparatus 100 may be provided with suitable downward purging gas flows which safeguard that abrasion particles which may be generated by the mechanical interaction of mechanical components are kept away from the substrates, in particular semiconductor wafers, which are held by a respective substrate carrier in the opened condition or may be transported from or towards the seat of a respective substrate carrier in the opened condition.

In the following, schematic figures are referred to which serve to illustrate the operation of preferred embodiments of an opener apparatus according to preferred embodiments of the present invention, including the preferred embodiments of the opener apparatus described above, as well as variants thereof. For simplicity, the same reference signs are used for identical or analogous components. The respective opener apparatus is represented only by some of its structural components, including components representing its respective movement mechanism 101.

Figure 29A:
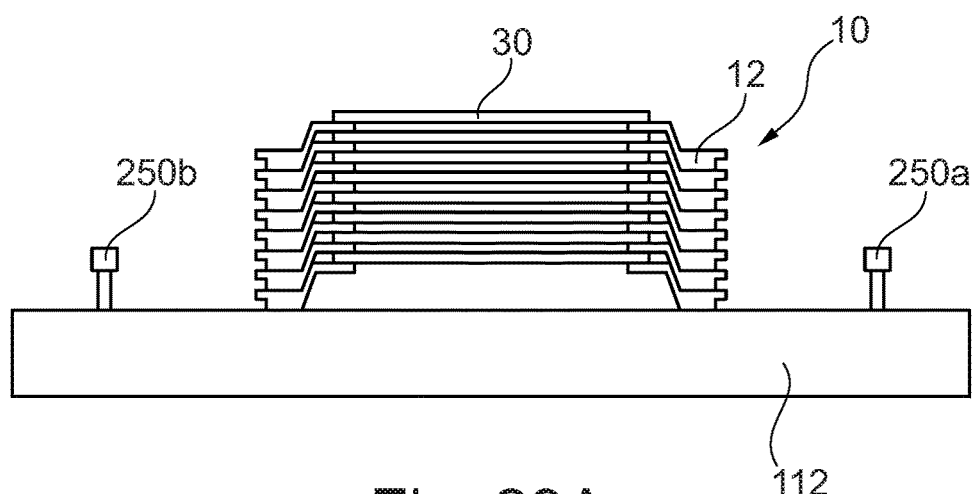
FIG. 29A and FIG. 29B schematically illustrate an opener apparatus according to a preferred embodiment of the present invention, and show a substrate carrier stack placed on a carriage of the opener apparatus in the stacked state (FIG. 29A) and the substrate carrier stack in the unstacked state (FIG. 29B).

FIG. 29A shows a stack of substrate carriers being located on a schematic carriage 112 of the opener apparatus. The substrate carrier stack 10 is shown without a base and without a cover. However, the substrate carrier stack 10 may include a base and a cover in addition to the substrate carriers 12 stacked on each other. The substrate carriers 12 are shown with substrates 30 held by the respective substrate carriers 12. The carriage 112 is shown in an upper operational position, in particular, an upper loading and unloading position or upper unloading position, or in an upper start position of the opener apparatus.

Figure 29B:
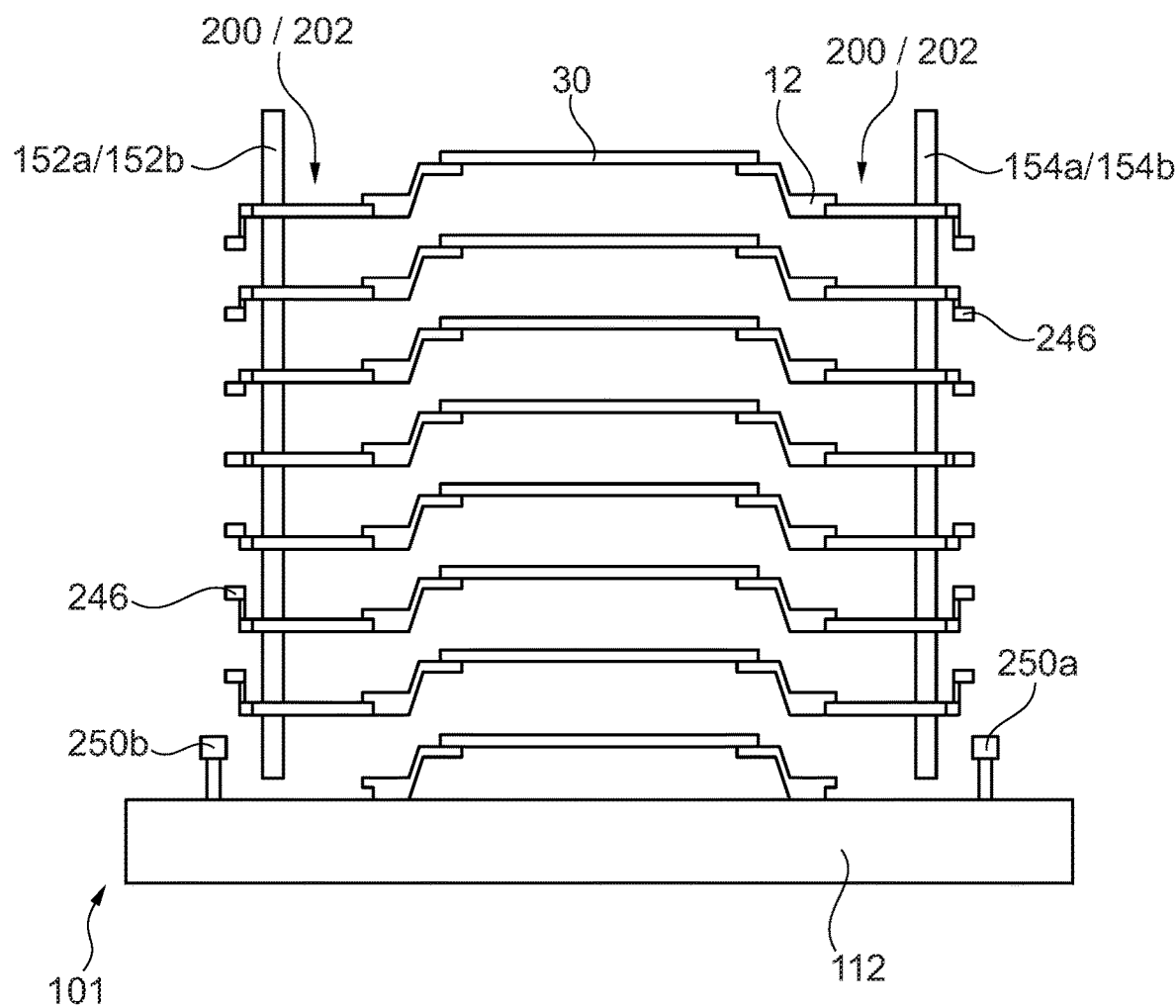

FIG. 29B shows the substrate carriers 12 in the unstacked state, with the carriage 112 being positioned in a lower operational position within the opener apparatus.

In both of FIGS. 29A and 29B, the carriage 112 is shown with a schematic actuating member 250a and 250b on either side of the substrate carrier stack 10, which represents also the respective actuator device like the actuator device 114a and the actuator device 114b, which is supported by or connected with the carriage 112 for common downward and upward movement. According to FIG. 29B, the substrate carriers 12 are held by schematically shown holding arms, namely long holding arms 200 or short holding arms 202, or short and long holding arms 200 and 202 arranged alternatingly along the vertical direction. Accordingly, FIG. 29B shows, for example, the opener apparatus according to the detailed figures discussed above, however, it is also possible that only one kind of holding arms is used to define a respective vertically extending set of holding arms.

The holding arms are shown with a respective engagement element 246, which is held by a respective linking member in a defined vertical position with respect to the vertical position of the respective holding arm 200 or 202, to achieve the described compensation of the height variation of the substrate carrier stack 10 in the course of the opening operation and in course of the closing operation.

According to FIG. 29B, the lowermost substrate carrier 12 is placed in its opened position on the carriage 112. However, instead, the lowermost substrate carrier is able to be held in the unstacked opened condition by a respective additional set of holding arms that define a vertical holding position. Further, the lowermost substrate carrier 12 is able to be replaced by the base of the substrate carrier stack 10, and the uppermost substrate carrier 12 is able to be replaced by the cover of the substrate carrier stack 10.

The opener apparatus is able to handle stacks of substrate carriers which include more carriers than sets of holding arms provided in the opener apparatus at a certain vertical position, so that only a selected sub-group of the substrate carriers of the stack are opened and held by the respective associated set of holding arms in the opener apparatus in the vertically staggered manner described.

Figure 30A:
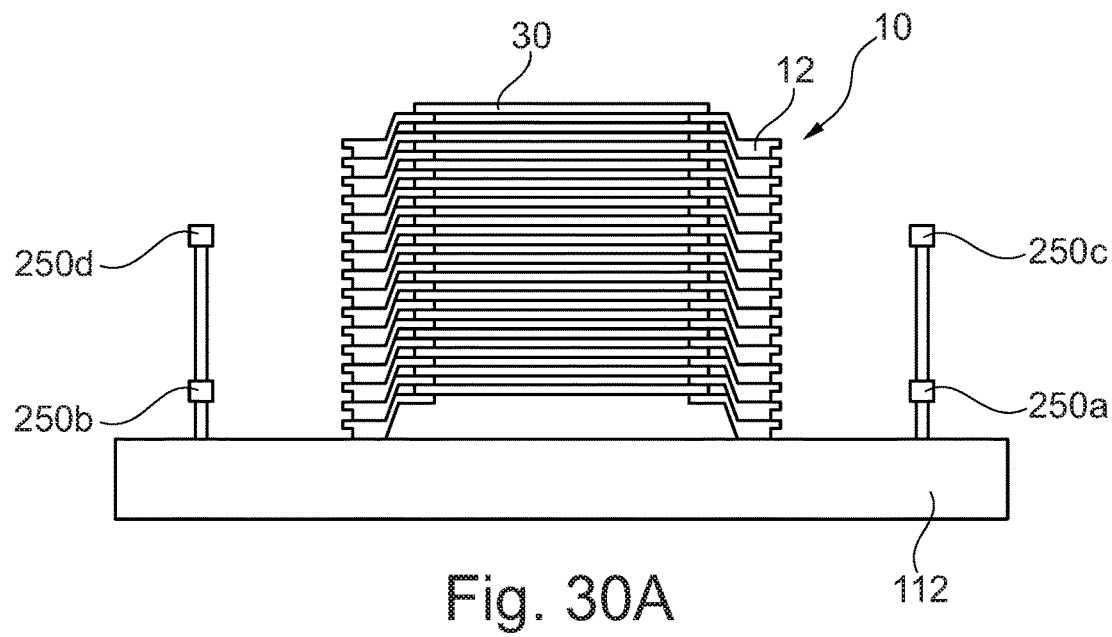
FIG. 30A, 30B, 30C schematically illustrate an alternate opener apparatus according to a preferred embodiment of the present invention, and show a substrate carrier stack placed on a carriage of the opener apparatus in the stacked state (FIG. 30A), the substrate carrier stack in a first partially unstacked state (FIG. 30B), and in a second partially unstacked state (FIG. 30C).
Figure 30B:
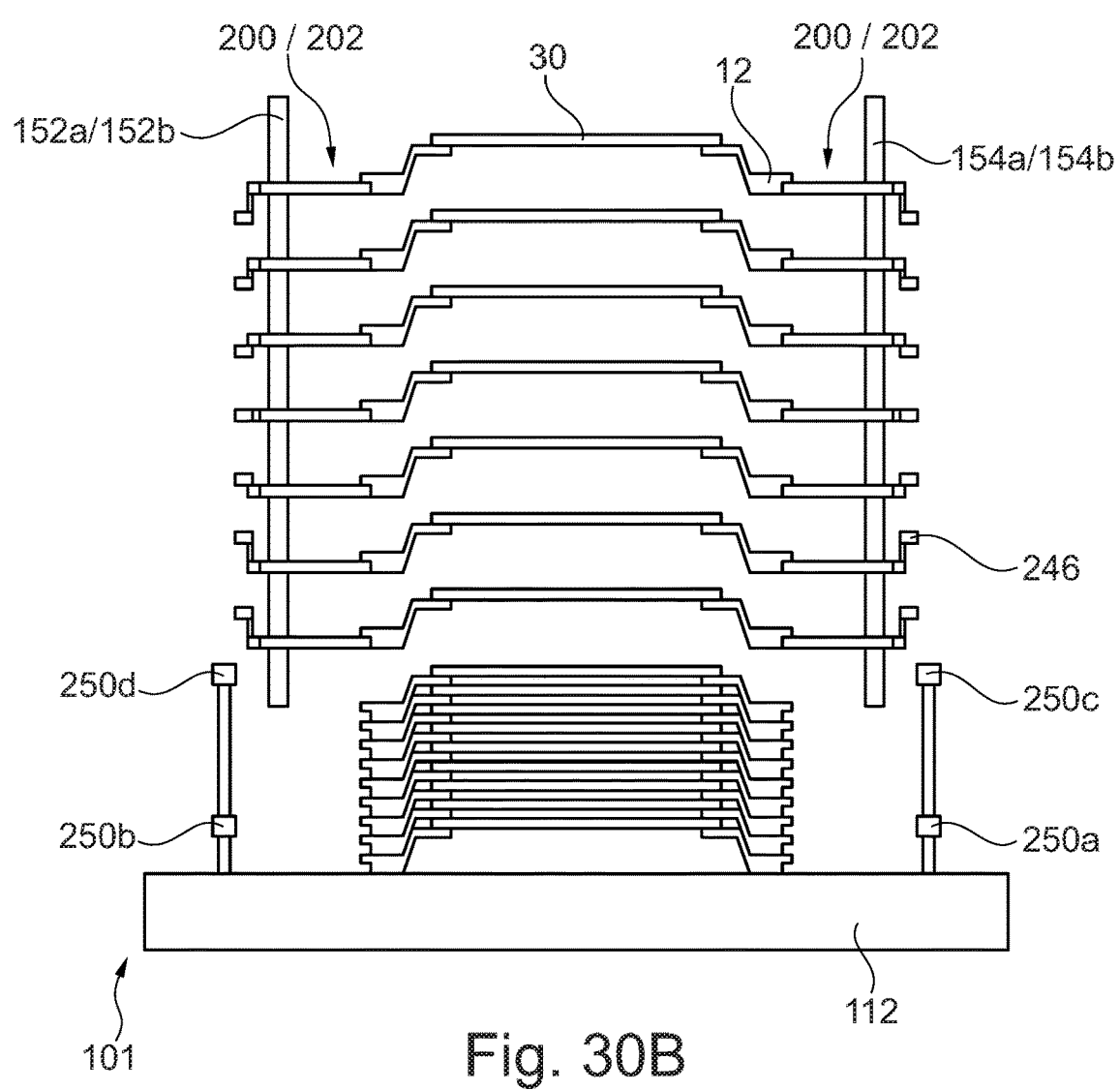
Figure 30C:
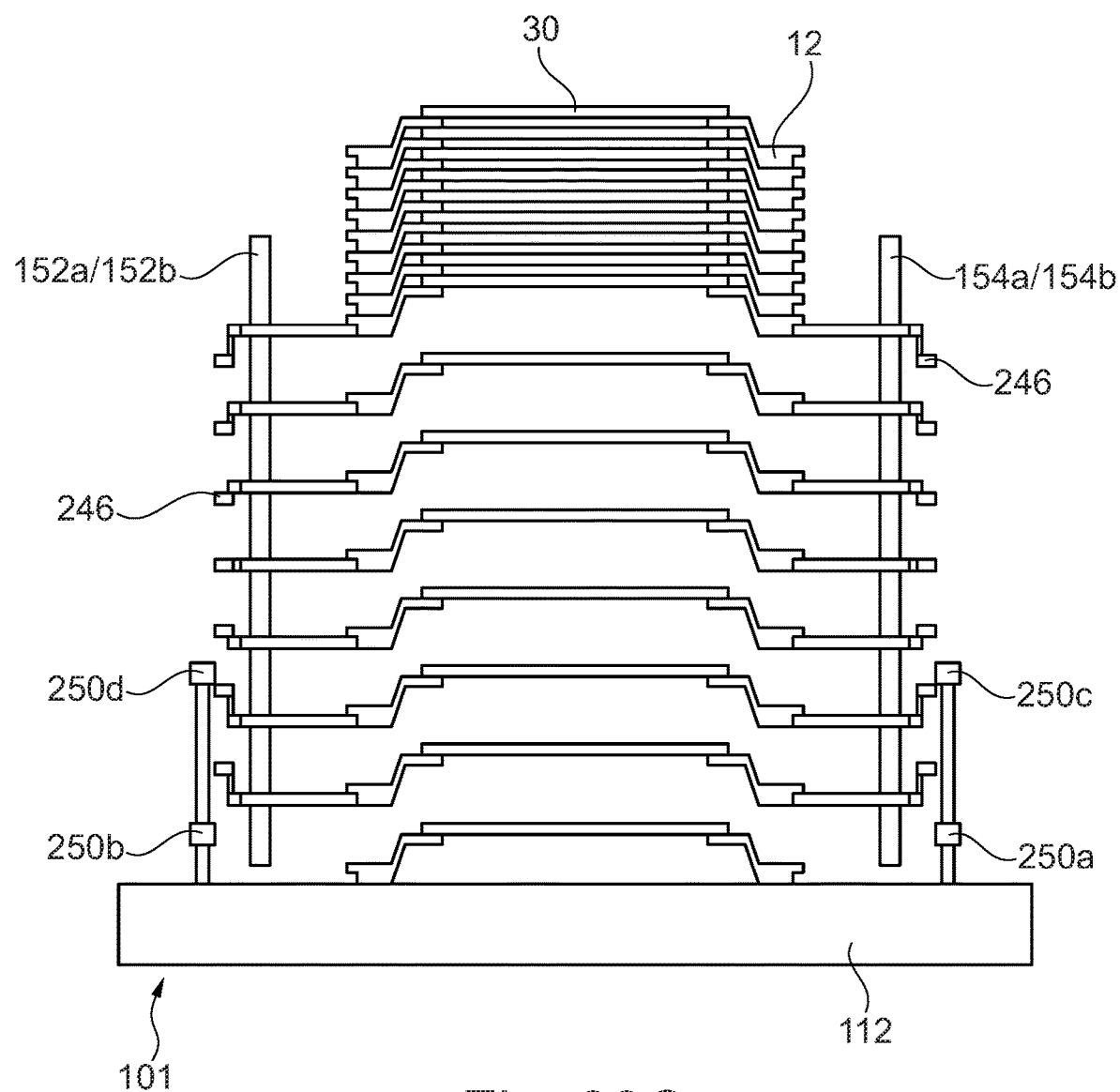

FIGS. 30A through 30C illustrate such an opener apparatus and corresponding partially opened conditions of the respective substrate carrier stack 10. Again, in FIGS. 30A through 30C, no base and no cover are shown, but the substrate carrier stack may include a base being supported on the carriage 112 and a cover stacked on the uppermost substrate carrier 12.

In order to selectively operate on an upper set of the substrate carriers and on a lower set of the substrate carriers of the substrate carrier stack, preferably, not only the actuating members 250a and 250b with their associated actuator devices are provided to be commonly movable with the carriage 112, but an additional upper actuating member 250c on the side of the actuating member 250a and an additional upper actuating member 250d on the side of the actuating member 250b, again representing also a respective actuator device are provided. The upper actuating members 250d and 250c are independently movable from the lower actuating members 250a and 250b. In order to operate on the upper set of substrate carriers 12 of the substrate carrier stack 10, the upper actuator devices with the respective upper actuating member 250c and 250d are operated to engage with the engagement elements 246 of the holding arms 200/202, to achieve the partially unstacked state of the substrate carrier stack according to FIG. 30B, in which an upper sub-group of substrate carriers 12 of the substrate carrier stack is opened. By operating alternatively, the lower actuator devices with their actuating members 250a and 250b, the partially unstacked condition according to FIG. 30C is able to be achieved, in which a lower sub-group of substrate carriers 12 of the substrate carrier stack is partially unstacked and opened. Again, the lowermost substrate carrier 12 is able to be replaced by a base of the substrate carrier stack 10, and the uppermost substrate carrier 12 is able to be replaced by a cover of the substrate carrier stack 10.

Figure 31:
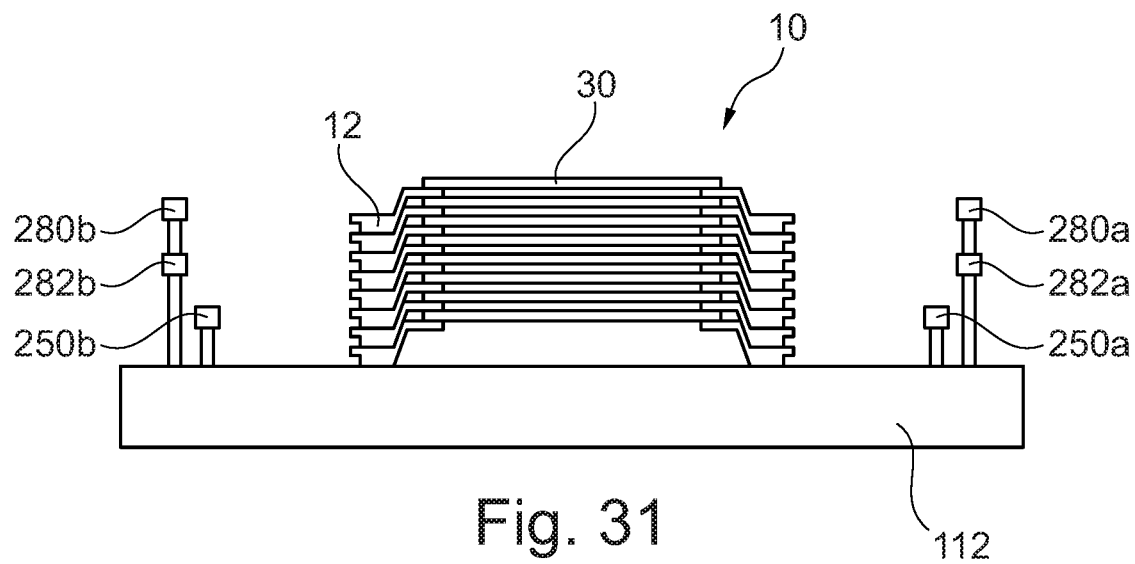
FIG. 31 schematically illustrates the carriage of a variant of the opener apparatus according to FIGS. 29A and 29B, and shows a substrate carrier stack in the stacked condition placed on the carriage.

As explained with reference to the detailed figures of the opener apparatus 100, the opener apparatus may be provided with light beam sensors including an upper light beam sensor 280b and a lower light beam sensor 282b on the side of the actuating member 250b, and correspondingly an upper light beam sensor 280a and a lower light beam sensor 282a on the side of the actuating member 250a, which are connected with the carriage 112 for common upward and downward movement. As discussed above, the sensors may be reflective sensors. Alternatively, one of elements 280a and 280b is able to be a light beam emitting portion and the other of these elements is able to be a light beam receiving portion of an upper light beam sensor, and correspondingly one element of elements 282a and 282b is able to be a light emitting portion and the other of these elements is able to be a light receiving portion of a lower light beam sensor, as discussed above. FIG. 31 shows such light beam sensors schematically.

With the light beam sensors, the stacking and unstacking and the condition of the substrate 30 is able to be monitored. In order to accommodate the varying height of the stack of substrate carriers, it is able to be switched from the respective upper sensor to the respective lower sensor in the course of the downward movement, and from the respective lower sensor to the respective upper sensor in the course of the upward movement.

The same is able to be achieved analogously in the case that a partial unstacking of a substrate carrier stack 10 including more substrate carriers than as illustrated in FIG.

30A through 30C is to be achieved. To this end, an additional set of at least one upper light beam sensor or two light beam sensor portions and at least one lower light beam sensor or two light beam sensor portions are able to be provided, for example, an upper light beam sensor 280c, or light beam sensor portion 280c and lower light beam sensor 282c, or light beam sensor portion 282c, on the side of actuating member 250c and an upper light beam sensor 280d, or light beam sensor portion 280d and a lower light beam sensor 282d, or light beam sensor portion 282d, on the side of actuating member 250d. It is referred to FIG. 32, showing schematically an upper and lower actuating member as well as at least one upper set of light beam sensors 280c, 282c, 280d, 282d and at least one lower set of light beam sensors 280a, 282a, 280b, 282b. When the actuating members 250c and 250d are operated to partially unstack the upper sub-group of the substrate carriers, the upper pair of sensors or sensor portions 280c and 282d on the side of actuating member 250c and the upper pair of sensors or sensor portions 280d and 282d on the side of actuating member 250d are used. In order to operate on the lower sub-group of carriers of the substrate carrier stack, which is done by the lower actuating members 250a and 250b, the lower pair of sensors or sensor portions 280a and 282a on the side of actuating member 250a and the lower pair of sensors or sensor portions 280b and 282b on the side of actuation member 250b are used.

Figure 33:
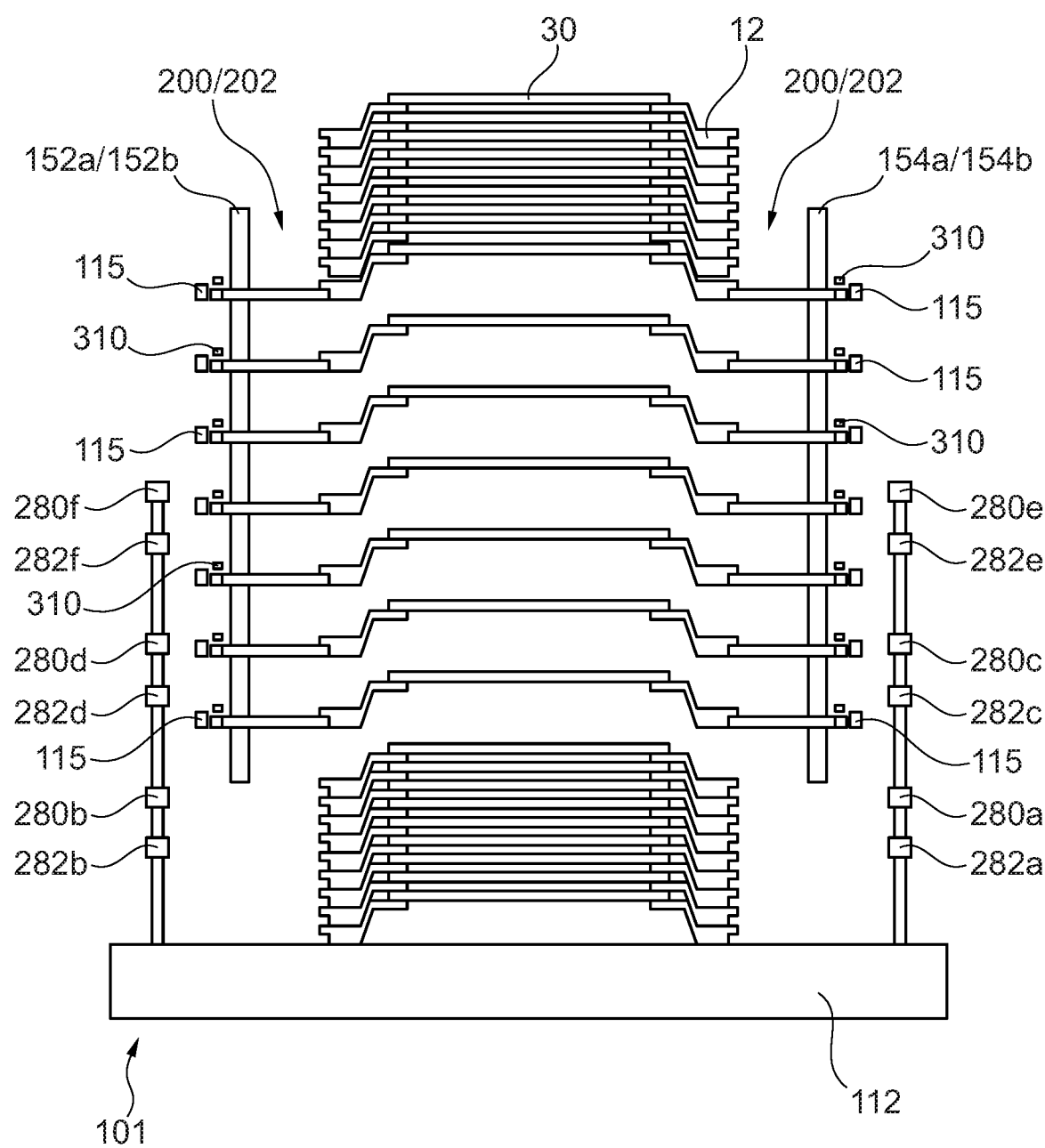
FIG. 33 schematically illustrates an alternate opener apparatus according to a preferred embodiment of the present invention, and shows a substrate carrier stack in a partially unstacked state, which is one of three possible partially unstacked states.

FIG. 33 illustrates an opener apparatus which is adapted to operate selectively on one of three sub-groups of substrate carriers of a substrate carriers stack, namely an upper sub-group, a middle sub-group, or a lower sub-group. FIG. 30 shows the middle sub-group of substrate carriers in the unstacked state. Instead of providing a further actuator device with a respective actuating member on either side of the substrate carrier stack, so that there would be three actuating members vertically displaced with respect to each other, the holding arms 200/202 are actuated using individual actuator devices 115 which are fixedly mounted to the chassis of the opener apparatus or to structural elements fixedly connected therewith. Each holding arm of the opener apparatus may be provided with its own actuator device. Alternatively, each pair of holding arms on a respective side of the opener apparatus may be provided with a common actuator device 115. Accordingly, the carriage 112 is preferably only provided with light beam sensors to be commonly movable with the carriage 112, to monitor the stacking and unstacking of the substrate carriers 12 and the condition of the respective substrate 30. An additional pair of an upper light beam sensor 280e or light beam sensor portion 280e and a lower light beam sensor 282e or light beam sensor portion 282e and an additional pair of an upper light beam sensor 280f or light beam sensor portion 280f and a lower light beam sensor 282f or light beam sensor portion 282f is included on both sides of the opener apparatus to move commonly with the carriage 112.

In order to monitor the stacking and unstacking of the substrate carriers 12 and the condition of the substrates of the lower sub-group of substrate carriers, the light beam sensors 280a, 282a and 280b, 282b are able to be used. In order to monitor the stacking and unstacking of the substrate carriers 12 and the condition of the substrates 30 of the middle sub-group of substrate carriers, the light beam sensors 280c, 282c and 280d, 282d are able to be used. In order to monitor the unstacking and stacking of the substrate carriers 12 and the condition of the substrates 30 of the upper sub-group of substrate carriers, the light beam sensors 280e, 282e and 280f, 282f are able to be used.

In addition to the individual actuator devices 115, which are schematically represented in FIG. 33 by a respective actuating member, individual sensors 310 are able to be provided and mounted in the opener apparatus in the vicinity of holding arms 200/202 to sense the current position of the respective holding arm. These sensors 310 are able to be optical sensors or inductive sensors, for example.

Alternatively or additionally, one or a plurality of light beam sensors are able to be provided for each vertical set of holding arms, to monitor whether all of the holding arms assume the same correct position, being one of the catching and holding position and the release position, before the opener apparatus is operated. Such a monitoring is able to be achieved using the respective sensors, before a substrate carrier stack is loaded on the carriage 112, for example, as discussed above with respect to FIG. 26.

As discussed above, the substrate carrier stack 10, on which the opener apparatus operates, will preferably include a base 14, on which the substrate carriers 12 are stacked in the unstacked condition, and a cover 16, which is stacked on the uppermost substrate carrier 12 of the substrate carrier stack 10 in the stacked condition. Such a substrate carrier stack is shown in FIG. 34 in the unstacked condition as achieved by a suitable opener apparatus. Here, the carriage 112 with the base 14 is shown at a rather large vertical distance from the lowermost substrate carrier held by respective holding arm. However, such a large vertical distance is not necessary. The carriage is able to be positioned in the unstacked condition of the substrate carrier stack at a smaller distance from the lowermost substrate carrier, e.g., such that the lower optical sensors or sensor portions 282a and 282b are positioned just below the lower edge of the lowermost substrate carrier.

In FIGS. 29B, 30B, 30C, 33, and 34, the presence of the mounting pillars 152a, 152b, 154a, and 154b for the holding arms 200/202 is indicated only schematically, without any support of the mounting pillars on a base plate like base plate 104 of the opener apparatus 100 shown in the detailed figures. For such a support, the mounting pillars extend farther downwardly to be supported below the carriage 112. Further, sleeve members that mount the holding arms are not indicated. Accordingly, the engagement elements 246 are schematically shown in the figures, except FIG. 33, to be connected directly with respect to the associated holding arm using a suitable linking element.

Figure 37:
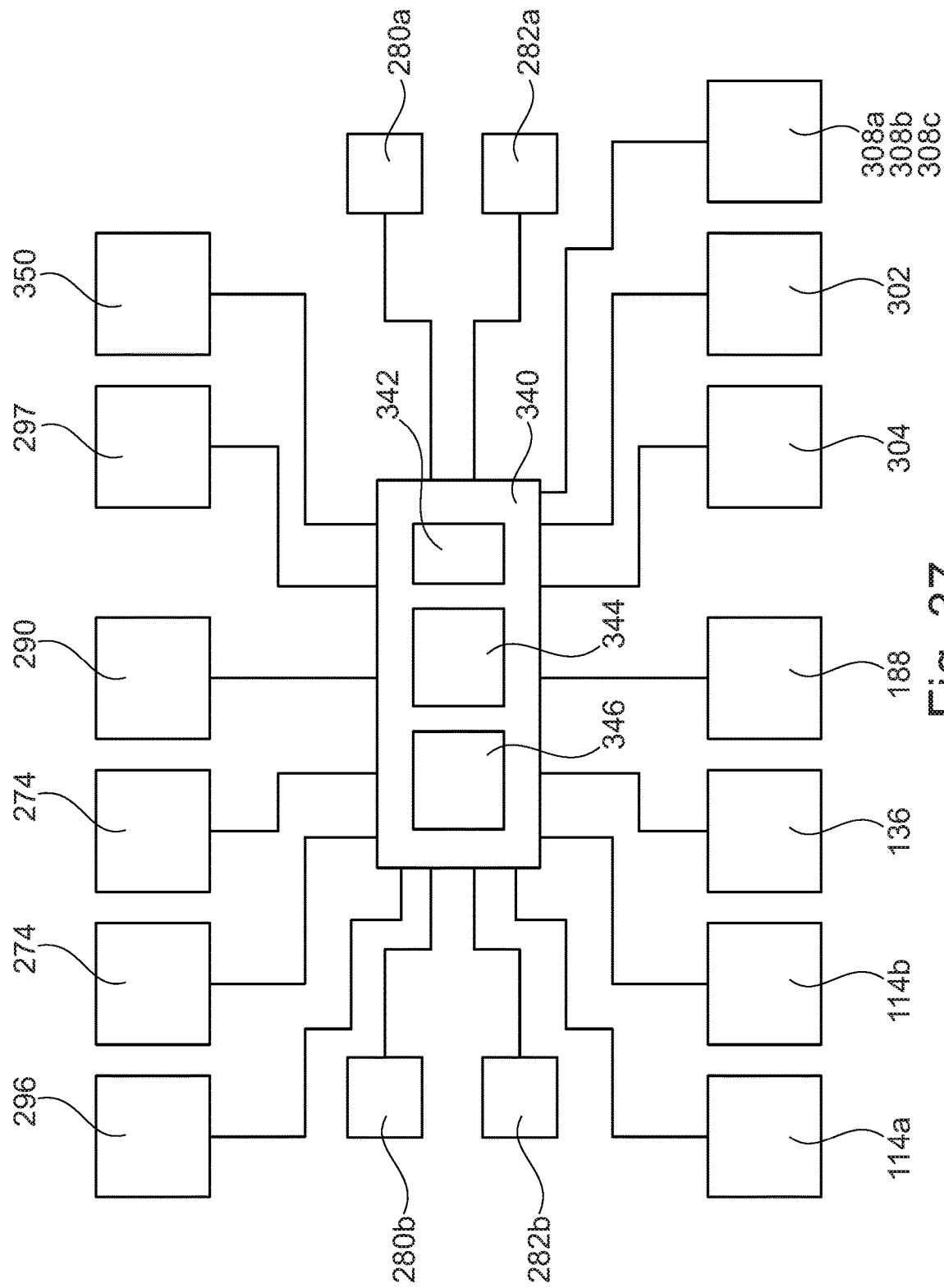
FIG. 37 is a schematic block diagram of different processors, sensors, drivers, and actuators of an opener apparatus such as the opener apparatus and its variants shown in the preceding figures.

Preferably, the opener apparatus will include a suitable controller 340, preferably including at least one processor 342, read only memory or flash memory 344, and random access memory 346. As schematically shown in FIG. 37, the various controllable components of the opener apparatus, namely at least the two actuator devices 114a and 114b, the two servo motors 136 and 188, the valve 304, the ionizer 302 and the fans or blowers 308a, 308b, and 308c, and so forth are connected via suitable electrical wiring with the controller 340, in order to be controlled by the controller 340. Preferably, this control is achieved by the controller 340 on the basis of signals or data received from the various sensors, including a vertical distance sensor or rotary encoder 350 indicating the current vertical position of the carriage 112, the light beam sensors 280a, 280b, 282a, 282b, 296 and 297, sensors associated with the holding arms 200, 202, the inductive sensors 274 of the two actuator devices 114a and 114b, the inductive sensor 290 of the carriage 112, and all other sensors discussed in the preceding description and any further sensors which are able to be provided. The controller 340 is able to be associated with, belong to, or able to be controlled by, a superordinate controller of a clean room facility or of a semiconductor manufacturing plant, as appropriate.

In the case of an actuation of the holding arms using individual actuator devices mounted to the chassis of the opener apparatus, such as schematically illustrated in FIG. 33, the controller 340 is able to control these actuator devices 115 to effect the sequential actuation of the holding arms coordinated with the movement of the carriage 112, appropriately taking into account the decreasing height of the stack of substrate carriers in the course of the opening operation and the increasing height of the stack of substrate carriers in the course of the closing operation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An opener for accommodating and opening a substrate carrier stack including a plurality of substrate carriers stacked in a vertical direction such that, for each pair of vertically adjacent substrate carriers of the plurality of substrate carriers, a lower substrate carrier supports an upper substrate carrier, each of the plurality of substrate carriers being provided with a substrate seat to accommodate and carry a substrate, the opener comprising:
    a housing; and
    a movement mechanism including a carriage that supports the substrate carrier stack and is movable relative to the housing in the vertical direction, engagement formations supported by the housing, and an actuator that interacts with the engagement formations; wherein
    the movement mechanism moves the substrate carriers with respect to each other in the vertical direction in an opening operation, such that the substrate carriers are moved from a stacked state, in which the substrate carriers are stacked on each other and define the substrate carrier stack supported within the opener, to an unstacked state, in which the substrate carriers are unstacked in opened positions with vertical distances between the vertically adjacent substrate carriers that enable the substrate seats of the substrate carriers to be accessible from a horizontal direction to unload a substrate from the substrate seats and/or load a substrate onto the substrate seats;
    when the substrate carriers are in the unstacked state, the movement mechanism moves the substrate carriers with respect to each other in the vertical direction in a closing operation, such that the substrate carriers are moved from the unstacked state to the stacked state in which the substrate carriers define the substrate carrier stack;
    in the opening operation, the movement mechanism moves the lower substrate carrier downward in order to vertically distance the lower substrate carrier from the upper substrate carrier of the each pair of vertically adjacent substrate carriers; and
    in the closing operation, the movement mechanism moves the lower substrate carrier upward in order to move the lower substrate carrier towards the upper substrate carrier of the each pair of vertically adjacent substrate carriers.

2. The opener according to claim 1, wherein
    the movement mechanism moves the substrate carriers of a selected substrate carrier sub-group of the substrate carrier stack with respect to each other in the vertical direction such that the substrate carriers of the selected substrate carrier sub-group are moved from the stacked state to the unstacked state, in which the substrate carriers of the selected substrate carrier sub-group are unstacked in opened positions with vertical distances between vertically adjacent substrate carriers that enable the substrate seats of the selected substrate carrier sub-group to be accessible from the horizontal direction to unload a substrate from the substrate seats and/or load a substrate onto the substrate seats; and
    when the substrate carriers of the selected substrate carrier sub-group are in the unstacked state, the movement mechanism moves the substrate carriers of the selected substrate carrier sub-group with respect to each other in the vertical direction in a closing operation, such that the substrate carriers of the selected substrate carrier sub-group are moved from the unstacked state to the stacked state, in which the substrate carriers are stacked on each other to define the substrate carrier stack together with one or more substrate carriers that do not belong to the selected substrate carrier sub-group.

3. The opener according to claim 1, wherein
    the carriage is moveable between an upper operational position and a lower operational position;
    the carriage moves downwardly towards the lower operational position to effect the opening operation and moves upwardly towards the upper operational position to effect the closing operation; and
    the upper operational position is a position of the carriage in which the substrate carrier stack is able to be loaded onto and/or unloaded from the carriage.

4. The opener according to claim 3, further comprising a sensor arrangement; wherein
    the sensor arrangement includes a sensor that senses whether the opener moves to one or more of a plurality of states including:
        a state in which the carriage is located in the upper operational position;
        a state in which no substrate carrier stack is loaded on the carriage and the carriage is located in the upper operational position;
        a state in which the substrate carrier stack is loaded on the carriage and the carriage is located in the upper operational position;
        a state in which the carriage is located in the lower operational position;
        a state in which the substrate carrier stack is loaded on the carriage and is in the stacked state; and
        a state in which the substrate carriers of the substrate carrier stack are unstacked and held within the opener in the vertically opened positions.

5. The opener according to claim 3, wherein the movement mechanism includes a vertical driver including a belt drive which is coupled with the carriage and is selectively operable to move the carriage downwardly to effect the opening operation and move the carriage upwardly to effect the closing operation.

6. The opener according to claim 3, wherein
    the housing includes a first loading and unloading port on a first side of the housing, the first loading and unloading port enables access to the substrate seats of the substrate carriers in the unstacked state from a first horizontal direction to unload a substrate from the substrate seats and/or load a substrate onto the substrate seats; and the housing includes a second loading and unloading port on the first side of the housing or on a second side of the housing opposite to the first side of the housing, the second loading and unloading port enables access to the carriage in the upper operational position from the first horizontal direction or a second horizontal direction opposite to the first horizontal direction to unload a substrate carrier stack from the carriage and/or load a substrate carrier stack onto the carriage.

7. The opener according to claim 6, wherein
the first side of the housing and the second side of the housing correspond to a first side of the carriage and a second side of the carriage, respectively; and
the engagement formations include a first set of vertically staggered engagement formations on a third side of the carriage and a second set of vertically staggered engagement formations on a fourth side of the carriage.

8. The opener according to claim 6, further comprising a holding hook; wherein
the second loading and unloading port is provided with the holding hook which is movable to a holding position in which the holding hook holds a substrate carrier stack within the housing at a vertical distance above the carriage; and
the holding hook is movable to, in a loading operation, a release position, in which the holding hook releases the substrate carrier stack to load the substrate carrier stack onto the carriage.

9. The opener according to claim 8, further comprising a sensor that senses whether the substrate carrier stack is held by the holding hook.

10. The opener according to claim 1, wherein
the engagement formations are supported by the housing at fixed vertical positions and engage with counter engagement formations of the substrate carrier; and
the engagement formations are movable to a catching and holding state in which the engagement formations engage with the counter engagement formations of the substrate carrier, and to a releasing and passing state in which the engagement formations are not engaged with the counter engagement formations of the substrate carrier.

11. The opener according to claim 10, wherein
in the opening operation, the movement mechanism selectively operates the engagement formations to move to the catching and holding state in a manner coordinated with the downward movement of the carriage such that a topmost substrate carrier of the substrate carrier stack still loaded on the carriage is consecutively caught and held by the engagement formations which engage with the counter engagement formations of the topmost substrate carrier so that the topmost substrate carrier is held within the opener in a vertically opened position.

12. The opener according to claim 10, wherein
in the closing operation, the movement mechanism selectively operates the engagement formations to move to the releasing and passing state in a manner coordinated with the upward movement of the carriage such that a lowermost substrate carrier held within the opener by the engagement formations is consecutively released by the engagement formations which disengages from the counter engagement formations of the lowermost substrate carrier so that the lowermost substrate carrier is placed on the carriage.

13. The opener according to claim 10, wherein
the engagement formations in the catching and holding state are positioned in a catching and holding position in which the engagement formations vertically overlap with the counter engagement formations of the substrate carrier; and
the engagement formations in the releasing and passing state are positioned in a releasing and passing position in which the engagement formations do not vertically overlap with the counter engagement formations of the substrate carrier.

14. The opener according to claim 13, wherein
the engagement formations are pivoted between the catching and holding position and the releasing and passing position; and
the engagement formations each include a sleeve section that pivots about a vertical pivoting axis and an engagement section that projects radially from the sleeve section and engages with the counter engagement formation.

15. The opener according to claim 10, further comprising a sensor arrangement; wherein
the sensor arrangement includes a sensor that senses whether all of the engagement formations are in the catching and holding state and/or whether all of the engagement formations are in the releasing and passing state.

16. The opener according to claim 10, wherein
the actuator applies a force to the engagement formations, the force including at least one of:
an actuating force that moves the engagement formation from a releasing and passing position that corresponds to the releasing and passing state to a catching and holding position that corresponds to the catching and holding state;
an actuating force that moves the engagement formation from the catching and holding position to the releasing and passing position;
a holding force that holds the engagement formation in the releasing and passing position; and
a holding force that holds the engagement formation in the catching and holding position.

17. The opener according to claim 16, wherein the actuator includes a plurality of individually and selectively operable actuators that apply the force to the engagement formations.

18. The opener according to claim 16, wherein
the actuator includes an actuating member portion that longitudinally moves between a first position and a second position in the horizontal direction;
the actuating member portion applies the force to the engagement formation when the actuating member portion effects an actuating movement including at least one of a movement in the vertical direction and a movement towards one of the first position and the second position; and
the actuating member portion moves in the vertical direction when the actuator moves in the vertical direction.

19. The opener according to claim 1, wherein the actuator is connected to the carriage so as to move with the carriage in the vertical direction.

20. A clean room facility for at least one of storing, handling, furnishing, and processing a substrate, the clean room facility comprising:
the opener according to claim 1;
a first robot that loads the substrate carrier stack into the opener and unloads the substrate carrier stack from the opener; and a second robot that accesses the substrate seat of the substrate carrier included in the substrate carrier stack.

\* \* \* \* \*